(12) United States Patent
Yu et al.

(10) Patent No.: US 12,727,463 B2
(45) Date of Patent: Sep. 1, 2026

(54) STAIRLESS THREE-DIMENSIONAL MEMORY DEVICE WITH LAYER CONTACT VIA STRUCTURES LOCATED ABOVE SUPPORT PILLAR STRUCTURES AND METHODS OF FORMING THE SAME

(71) Applicant: WESTERN DIGITAL TECHNOLOGIES, INC., San Jose, CA (US)

(72) Inventors: Jixin Yu, San Jose, CA (US); Koichi Matsuno, Fremont, CA (US); Ruogu Matthew Zhu, San Jose, CA (US); Mark D. Kraman, San Jose, CA (US); Johann Alsmeier, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 451 days.

(21) Appl. No.: 18/457,883

(22) Filed: Aug. 29, 2023

(65) Prior Publication Data

US 2025/0079294 A1 Mar. 6, 2025

(51) Int. Cl.
*H10W 20/42* (2026.01)
*H10B 41/10* (2023.01)
(Continued)

(52) U.S. Cl.
CPC ............ *H10W 20/42* (2026.01); *H10B 41/10* (2023.02); *H10B 41/27* (2023.02); *H10B 43/10* (2023.02); *H10B 43/27* (2023.02); *H10W 20/081* (2026.01)

(58) Field of Classification Search
CPC .......... H01L 23/5226; H01L 21/76802; H10B 41/10; H10B 41/27; H10B 43/10;
(Continued)

(56) References Cited

U.S. PATENT DOCUMENTS 9,601,502 B2 3/2017 Sano et al.
9,960,181 B1 5/2018 Cui et al.
(Continued)

OTHER PUBLICATIONS

ISR-WO—Notification of Transmittal of the International Search Report and Written Opinion of the International Searching Authority for International Patent Application No. PCT/US2024/030896, mailed Sep. 9, 2024, 10 pages.
(Continued)

*Primary Examiner* — J. E. Schoenholtz
(74) *Attorney, Agent, or Firm* — THE MARBURY LAW GROUP PLLC

(57) ABSTRACT

A three-dimensional memory device includes an alternating stack of insulating layers and electrically conductive layers, a memory opening vertically extending through the alternating stack, a memory opening fill structure located in memory opening and including a vertical stack of memory elements located at levels of the electrically conductive layers and a vertical semiconductor channel, a layer contact via structure contacting a first electrically conductive layer within a first subset of the electrically conductive layers and vertically extending through a second subset of the electrically conductive layers that overlies the first subset, and a support pillar structure located under a bottom surface of the layer contact via structure.

19 Claims, 62 Drawing Sheets

(51) Int. Cl.

| | |
|---|---|
| ***H10B 41/27*** | (2023.01) |
| ***H10B 43/10*** | (2023.01) |
| ***H10B 43/27*** | (2023.01) |
| ***H10W 20/00*** | (2026.01) |

(58) Field of Classification Search

CPC ........ H10B 43/27; H10B 43/40; H10B 43/50; H10B 41/35; H10B 41/50; H10B 43/35

See application file for complete search history.

(56) References Cited

U.S. PATENT DOCUMENTS

| | | | | |
|---|---|---|---|---|
| 11,450,679 | B2 | 9/2022 | Tanaka et al. | |
| 11,488,975 | B2 | 11/2022 | Totoki et al. | |
| 11,495,612 | B2 | 11/2022 | Tanaka et al. | |
| 2018/0277596 | A1 | 9/2018 | Mori | |
| 2019/0096808 | A1 * | 3/2019 | Tsutsumi | H10B 43/35 |
| 2019/0341251 | A1 | 11/2019 | Lee | |
| 2022/0005818 | A1 | 1/2022 | Tanaka et al. | |
| 2022/0005824 | A1 | 1/2022 | Tanaka et al. | |
| 2022/0130852 | A1 | 4/2022 | Totoki et al. | |
| 2022/0139837 | A1 | 5/2022 | Sun et al. | |
| 2022/0189872 | A1 | 6/2022 | Sano et al. | |
| 2022/0302146 | A1 | 9/2022 | Shimomura et al. | |
| 2022/0302153 | A1 | 9/2022 | Tanaka et al. | |
| 2022/0328413 | A1 | 10/2022 | Kubo et al. | |
| 2022/0406379 | A1 | 12/2022 | Takeguchi et al. | |
| 2022/0406793 | A1 | 12/2022 | Takeguchi et al. | |
| 2023/0038557 | A1 | 2/2023 | Ogawa et al. | |
| 2023/0041950 | A1 | 2/2023 | Chibvongodze et al. | |
| 2023/0044232 | A1 | 2/2023 | Kai et al. | |
| 2023/0045001 | A1 | 2/2023 | Ogawa et al. | |
| 2023/0125995 | A1 | 4/2023 | Kim et al. | |

OTHER PUBLICATIONS

Endoh et al., "Novel Ultra High-Density Memory with a Stacked-Surrounding Gate Transistor (S-SGT) Structured Cell," IEDM Proc. (2001) 33-36.

U.S. Appl. No. 17/663,951, filed May 18, 2022, SanDisk Technologies LLC.

U.S. Appl. No. 17/804,184, filed May 26, 2022, SanDisk Technologies LLC.

U.S. Appl. No. 18/062,807, filed Dec. 7, 2022, SanDisk Technologies LLC.

U.S. Appl. No. 18/221,689, filed Jul. 13, 2023, SanDisk Technologies LLC.

U.S. Appl. No. 18/221,711, filed Jul. 13, 2023, SanDisk Technologies LLC.

U.S. Appl. No. 18/233,759, filed Aug. 14, 2023, SanDisk Technologies LLC.

U.S. Appl. No. 18/352,726, filed Jul. 14, 2023, SanDisk Technologies LLC.

U.S. Appl. No. 18/352,752, filed Jul. 14, 2023, SanDisk Technologies LLC.

U.S. Appl. No. 18/353,577, filed Jul. 17, 2023, SanDisk Technologies LLC.

U.S. Appl. No. 18/354,246, filed Jul. 18, 2023, SanDisk Technologies LLC.

U.S. Appl. No. 18/354,269, filed Jul. 18, 2023, SanDisk Technologies LLC.

U.S. Appl. No. 18/354,283, filed Jul. 18, 2023, SanDisk Technologies LLC.

U.S. Appl. No. 18/354,325, filed Jul. 18, 2023, SanDisk Technologies LLC.

U.S. Appl. No. 18/356,825, filed Jul. 21, 2023, SanDisk Technologies LLC.

U.S. Appl. No. 18/357,676, filed Jul. 24, 2023, SanDisk Technologies LLC.

U.S. Appl. No. 18/358,702, filed Jul. 25, 2023, SanDisk Technologies LLC.

U.S. Appl. No. 18/358,727, filed Jul. 25, 2023, SanDisk Technologies LLC.

U.S. Appl. No. 18/360,461, filed Jul. 27, 2023, SanDisk Technologies LLC.

IPRP-WO—Notification Concerning Transmittal of International Preliminary Report on Patentability and Written Opinion of the International Searching Authority for International Patent Application No. PCT/US2024/030896, mailed Mar. 12, 2026, 7 pages.

* cited by examiner

STAIRLESS THREE-DIMENSIONAL MEMORY DEVICE WITH LAYER CONTACT VIA STRUCTURES LOCATED ABOVE SUPPORT PILLAR STRUCTURES AND METHODS OF FORMING THE SAME

FIELD

The present disclosure relates generally to the field of semiconductor devices, and particularly to a stairless three-dimensional memory device including layer contact via structures located above support pillar structures and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers, a memory opening vertically extending through the alternating stack, a memory opening fill structure located in memory opening and including a vertical stack of memory elements located at levels of the electrically conductive layers and a vertical semiconductor channel, a layer contact via structure contacting a first electrically conductive layer within a first subset of the electrically conductive layers and vertically extending through a second subset of the electrically conductive layers that overlies the first subset, and a support pillar structure located under a bottom surface of the layer contact via structure.

According to another aspect of the present disclosure, a method of forming a memory device comprises forming an alternating stack of insulating layers and sacrificial material layers over a substrate; forming support pillar structures through the alternating stack, wherein the support pillar structures comprise a first-type support pillar structure and second-type support pillar structures that laterally surround the first-type support pillar structure; forming a memory opening through the alternating stack; forming a memory opening fill structure in the memory opening, wherein the memory opening fill structure comprises a vertical stack of memory elements located at levels of the sacrificial material layers and a vertical semiconductor channel; forming a contact via cavity by vertically recessing the first-type support pillar structure and a neighboring portion of the alternating stack, wherein a remaining portion of the first-type support pillar structure is located below the contact via cavity; replacing the sacrificial material layers with electrically conductive layers; and forming a layer contact via in the contact via cavity on a first electrically conductive layer of the electrically conductive layers.

DETAILED DESCRIPTION

Figure 1:
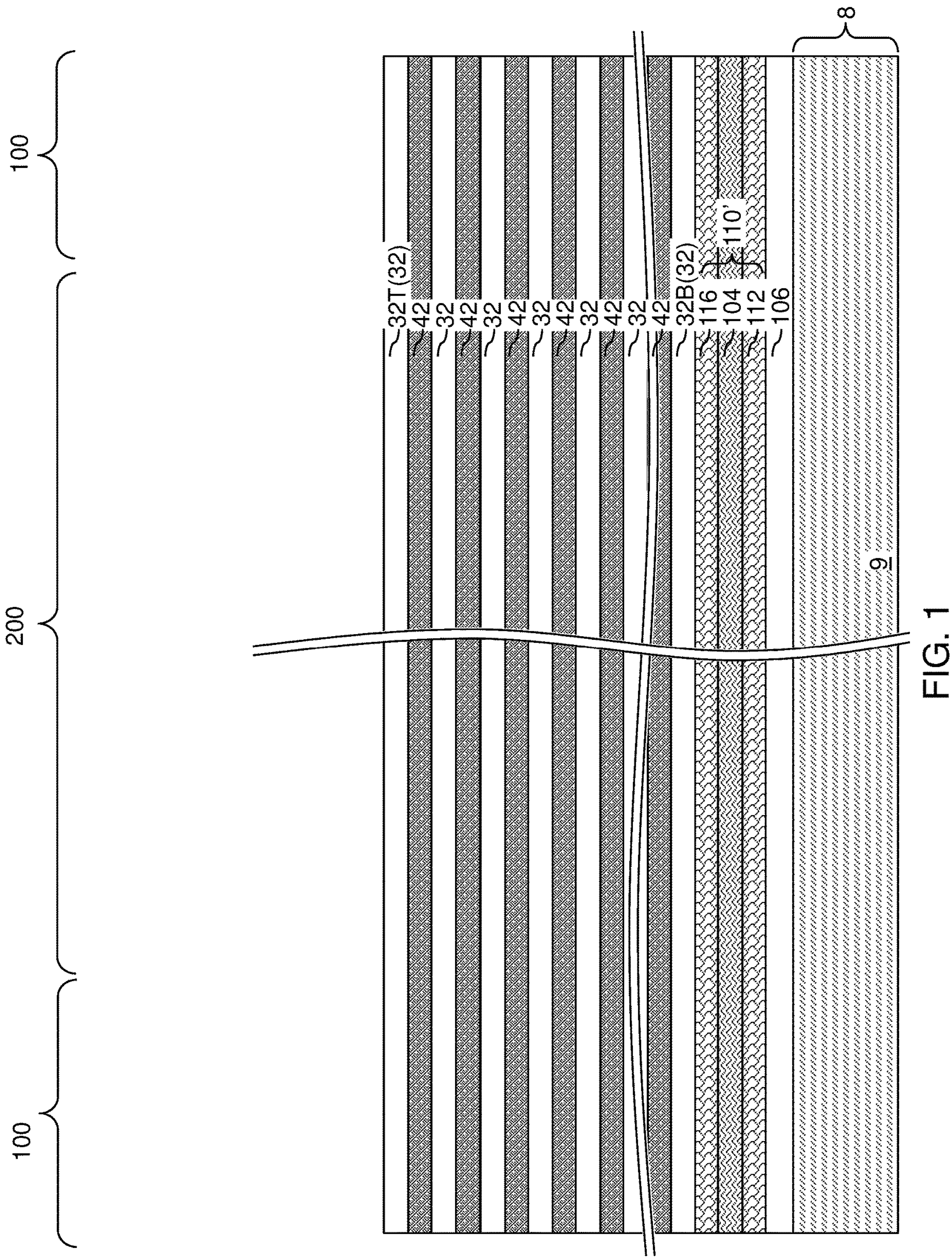
FIG. 1 is a vertical cross-sectional view of a first exemplary structure after formation of an alternating stack of insulating layers and sacrificial material layers according to a first embodiment of the present disclosure.

As discussed above, the embodiments of the present disclosure are directed to a three-dimensional memory device including layer contact via structures located above support pillar structure and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{-5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many a number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to a first embodiment of the present disclosure includes a substrate 8. The substrate 8 may be a carrier substrate that is subsequently removed. The substrate 8 may comprise a semiconductor material (e.g., a silicon wafer), an insulating material, a conductive material, or a combination thereof. The substrate 8 comprises a material that can provide structural support to material portions that are subsequently formed thereupon. The substrate 8 comprises a substrate material layer 9 at least at an upper portion thereof. In one embodiment, the substrate material layer 9 may be a semiconductor material layer, such as a silicon layer or a doped well in a silicon wafer. In another embodiment, the substrate material layer 9 may be an insulating layer, such as silicon oxide. An optional driver circuit (not shown) may be formed on the substrate 8. The driver circuit may be used to drive memory device to be subsequently formed over the substrate 8, as will be described below.

An optional insulating material layer can be formed on a top surface of the substrate 8. The insulating material layer can be subsequently employed as a stopping material layer for a process that removes the substrate 8, and is herein referred to as a planar insulating layer 106. If a polishing process, such as a chemical mechanical polishing process is employed to subsequently remove the substrate 8, the planar insulating layer 106 may be subsequently employed as a polishing planar insulating layer. If an etch process such as a wet etch process is employed to subsequently remove the substrate 8, the planar insulating layer 106 may be subsequently employed as an etch stop material layer. In one embodiment, the planar insulating layer 106 comprises a dielectric material such as undoped silicate glass, a doped silicate glass, or silicon nitride. The thickness of the planar insulating layer 106 may be in a range from 50 nm to 600 nm, such as from 100 nm to 300 nm, although lesser and greater thicknesses may also be employed.

Optional in-process source-level material layers 110' can be formed over the substrate 8 (and over the planar insulating layer 106, if present). The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, an optional lower sacrificial liner (not shown), a source-level sacrificial layer 104, an optional upper sacrificial liner (not shown), and an upper source-level semiconductor layer 116. In an alternative embodiment, the in-process source-level material layers 110' may be omitted. In the alternative embodiment, the substrate 8 may be removed after forming a memory device, and a top source contact may be formed on exposed portions of the vertical semiconductor channels of the memory device.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner (or selective to the lower source-level semiconductor layer 112) and the upper sacrificial liner (or selective to the upper source-level semiconductor layer 116). In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used. The lower sacrificial liner (if present) and the upper sacrificial liner (if present) include materials that may function as an etch stop material during removal of the source-level sacrificial layer 104. For example, the lower sacrificial liner and the upper sacrificial liner may include silicon oxide, silicon nitride, and/or a dielectric metal oxide. In one embodiment, each of the lower sacrificial liner and the upper sacrificial liner may include a silicon oxide layer having a thickness in a range from 2 nm to 30 nm, although lesser and greater thicknesses may also be used.

An alternating stack of first material layers and second material layers can be formed over substrate 8 (and over the in-process source-level material layers 110' if present). The first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the substrate 8 (and over the in-process source-level material layers 110', if present). The insulating layers 32 comprise an insulating material such as undoped silicate glass or a doped silicate glass, and the sacrificial material layers 42 comprise a sacrificial material, such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers. The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the substrate 8 is herein referred to as a bottommost insulating layer 32B.

Each of the insulating layers 32 other than the topmost insulating layer 32T may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32T may have a thickness that is different from that of the other insulating layers 32.

The first exemplary structure comprises a pair of memory array regions 100 in which a three-dimensional array of memory elements is to be subsequently formed, and a contact region 200 in which layer contact via structures contacting word lines are to be subsequently formed.

Figure 2A:
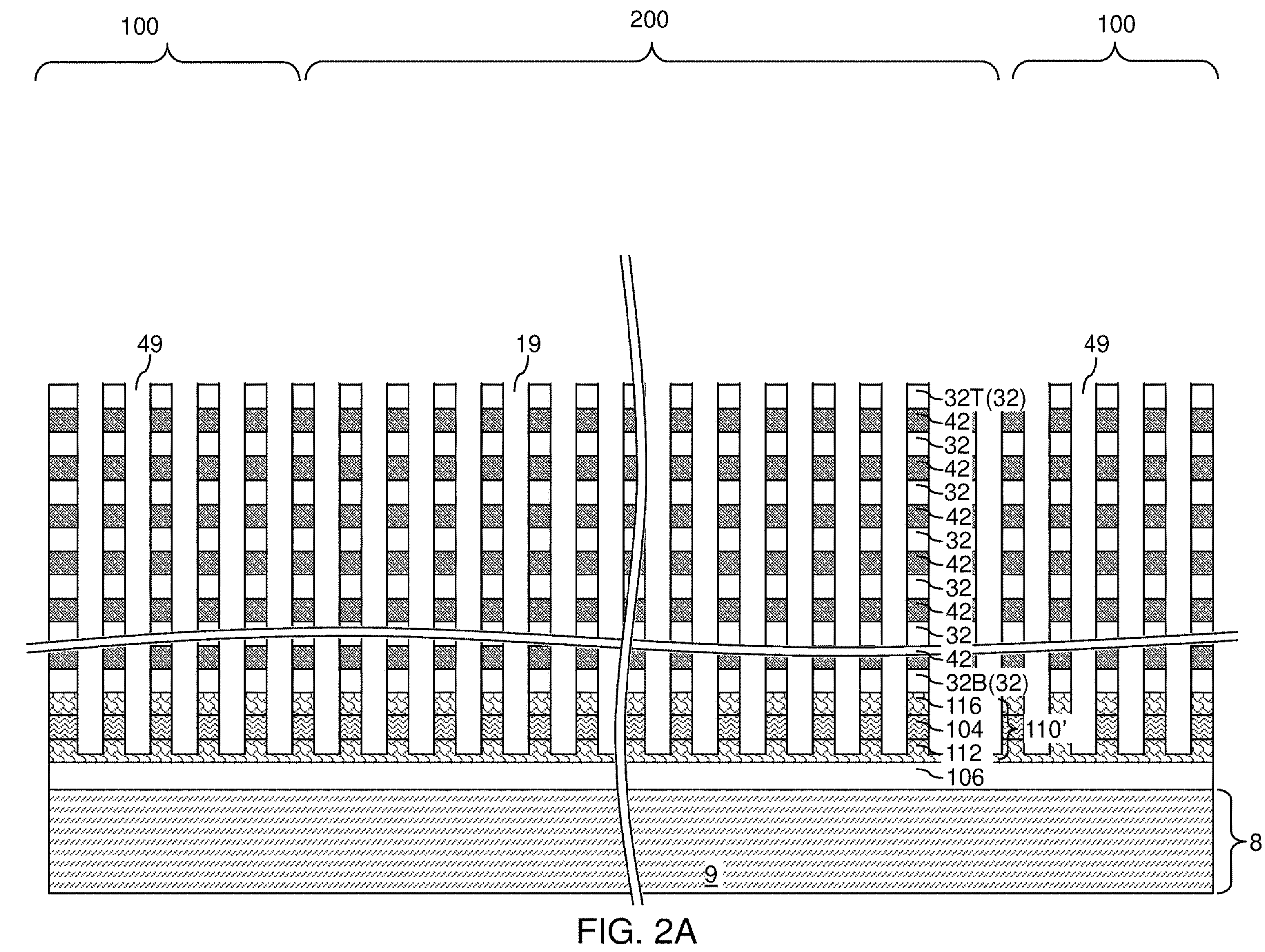
FIG. 2A is a vertical cross-sectional view of the first exemplary structure after formation of memory openings and support openings according to the first embodiment of the present disclosure.
Figure 2B:
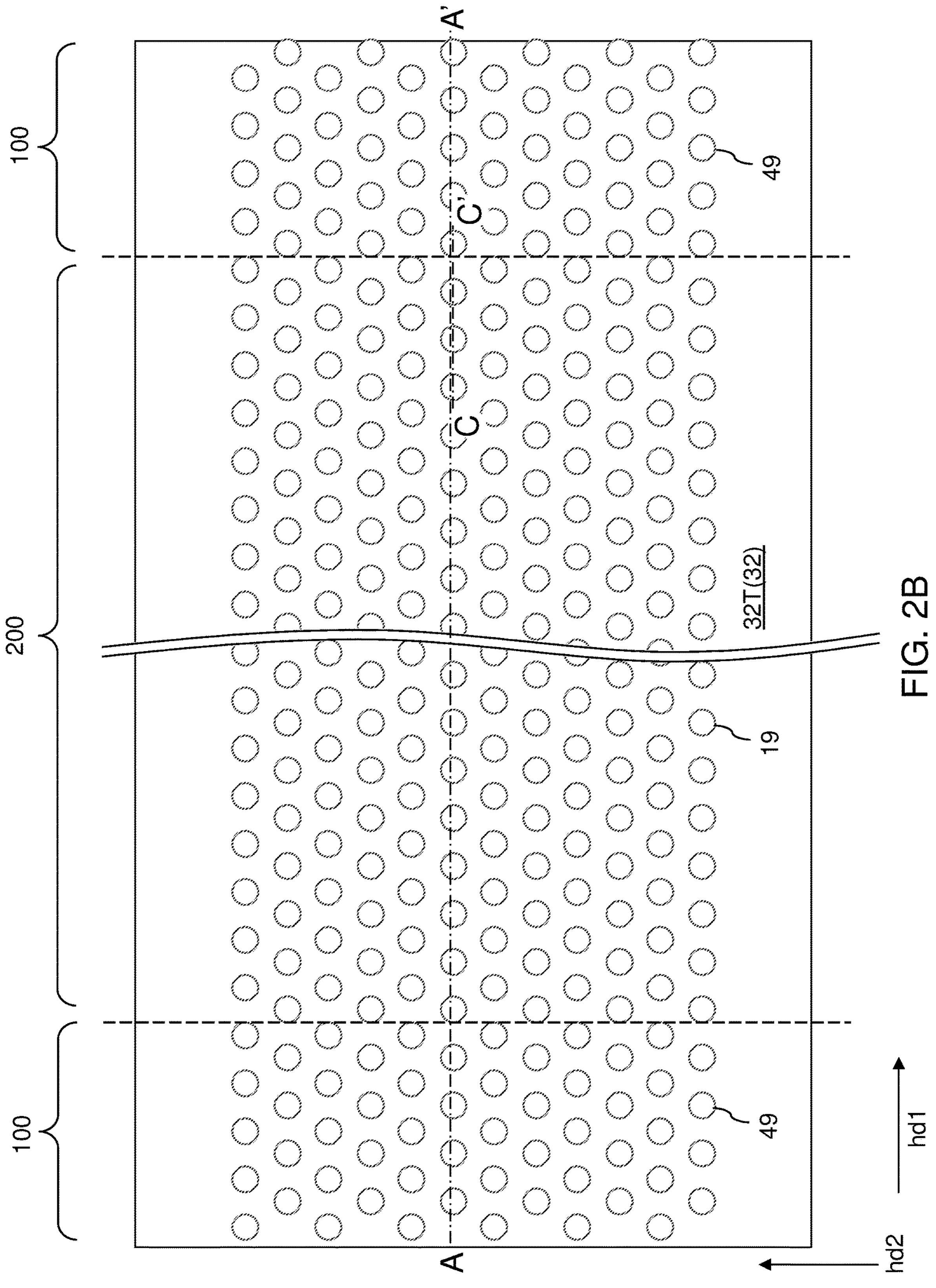
FIG. 2B is a top-down view of the first exemplary structure of FIG. 2A. The vertical plane A-A' is the vertical cross-sectional plane of FIG. 2A.
Figure 2C:
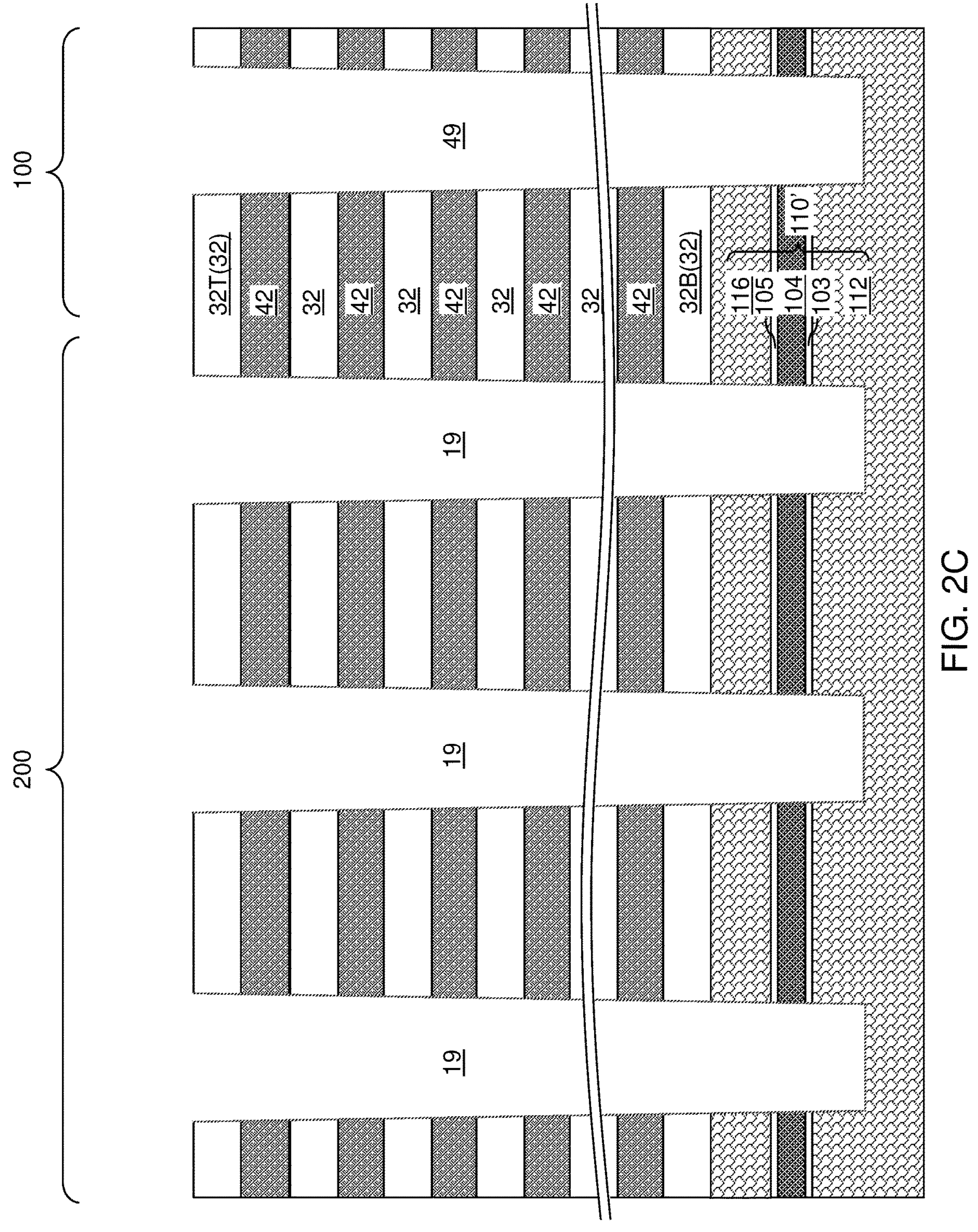
FIG. 2C is a magnified vertical cross-sectional view of the first exemplary structure along the vertical plane C-C' of FIG. 2B.

Referring to FIGS. 2A-2C, a lithographic material stack (not shown) including at least a photoresist layer can be formed over the topmost insulating layer 32T, and can be lithographically patterned to form discrete openings therein. The discrete openings in the photoresist layer can be formed in the memory array regions 100 and in the contact region 200. In one embodiment, the memory array regions 100 are laterally spaced apart from each other along the first horizontal direction (e.g., word line direction) hd1, and the contact region 200 can be located between the memory array regions 100. In an alternative embodiment, contact regions 200 may be located on opposite lateral ends of one memory array region 100 along the first horizontal direction hd1. The discrete openings in the photoresist layer can be formed within rectangular areas (e.g., memory block areas) that are laterally spaced apart from each other along a second horizontal direction (e.g., bit line direction) hd2 that is perpendicular to the first horizontal direction hd1. Elongated strip-shaped areas that are free of any opening can be provided between each neighboring pair of rectangular areas (e.g., between memory block areas) in which the openings are patterned in the photoresist layer.

The pattern in the lithographic material stack can be transferred through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a dielectric pillar structure) that mechanically supports other elements is subsequently formed. The memory openings 49 are formed in the memory array regions 100, and the support openings 19 are formed in the contact region 200.

The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

Each of the memory openings 49 can vertically extend through the alternating stack (32, 42) and into the in-process source-level material layers 110' (if present) or into the substrate 8. In one embodiment, bottom surfaces of the memory openings 49 may be formed within the lower source-level semiconductor layer 112 or at an interface between the lower source-level semiconductor layer and the planar insulating layer 106. In this case, the memory openings 49 and the support openings 19 may vertically extend through the upper source-level semiconductor layer 116, the upper sacrificial liner 105, the source-level sacrificial layer 104, the lower sacrificial liner 103, and an upper portion of the lower source-level semiconductor layer 112.

FIGS. 3A-3E are sequential vertical cross-sectional views of a region of the first exemplary structure during formation of dielectric pillar structures 20 and memory opening fill structures 58 according to an embodiment of the present disclosure.

Figure 3A:
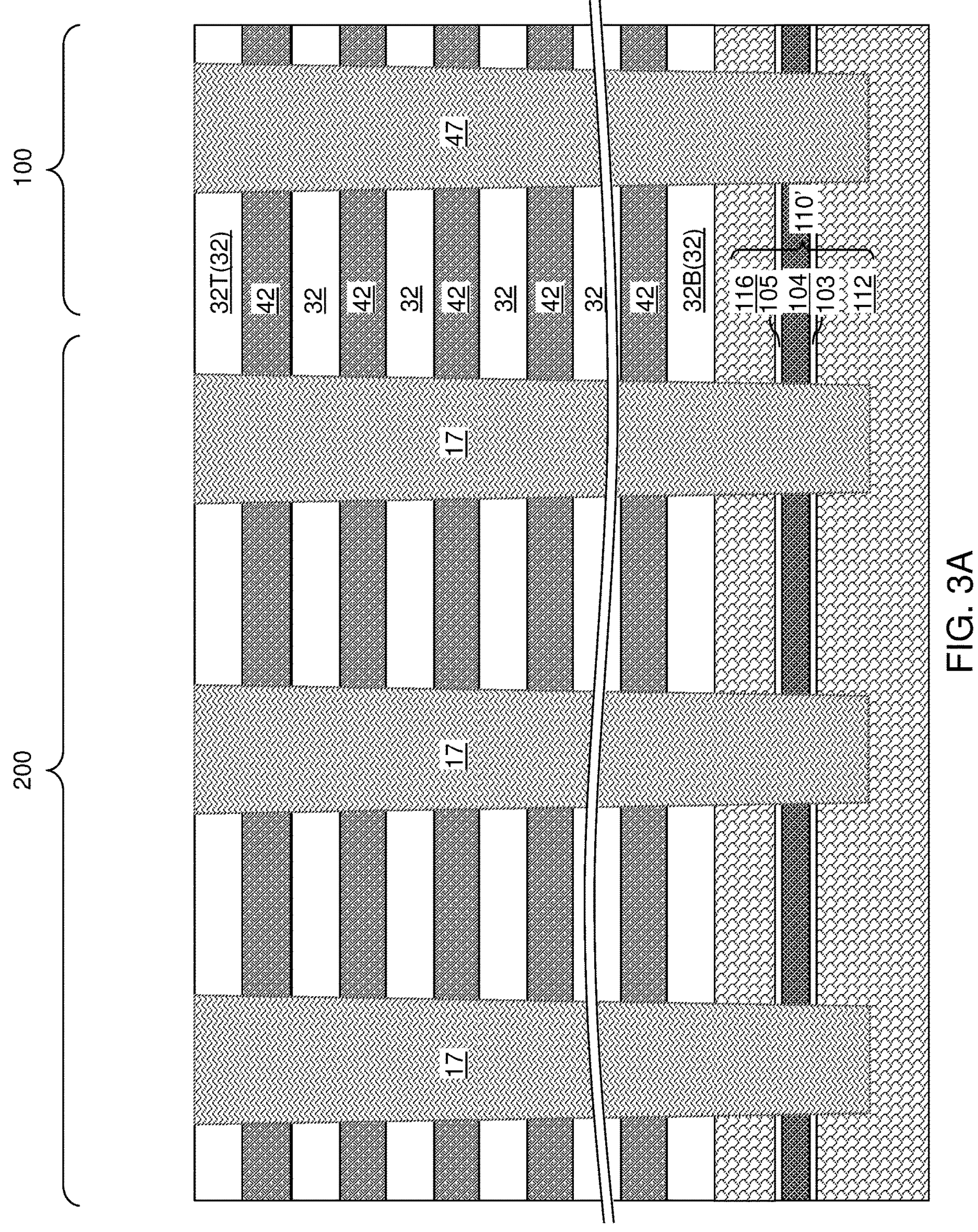
FIGS. 3A-3E are sequential vertical cross-sectional views of a region of the first exemplary structure during formation of dielectric pillar structures and memory opening fill structures according to the first embodiment of the present disclosure.

Referring to FIG. 3A, a sacrificial fill material can be deposited in the memory openings 49 and the support openings 19. The sacrificial fill material may be any material that may be removed selective to the materials of the insulating layers 32, the sacrificial material layers 42, and the materials of the in-process source-level material layers 110'. For example, the sacrificial fill material may comprise a carbon-based material such as amorphous carbon or diamond-like carbon, a semiconductor material such as a silicon-germanium alloy, polysilicon or amorphous silicon, or a dielectric material such as borosilicate glass or organosilicate glass. Optionally, a thin etch stop liner (not shown) may be employed to facilitate subsequent selective removal of the sacrificial fill material. Excess portions of the sacrificial fill material may be removed from above the horizontal plane including the top surface of the topmost insulating layer 32T. Each remaining portion of the sacrificial fill material filling a memory opening 49 constitutes a sacrificial memory opening fill structure 47. Each remaining portion of the sacrificial fill material filling a support opening 19 constitutes a sacrificial support opening fill structure 17.

Figure 3B:
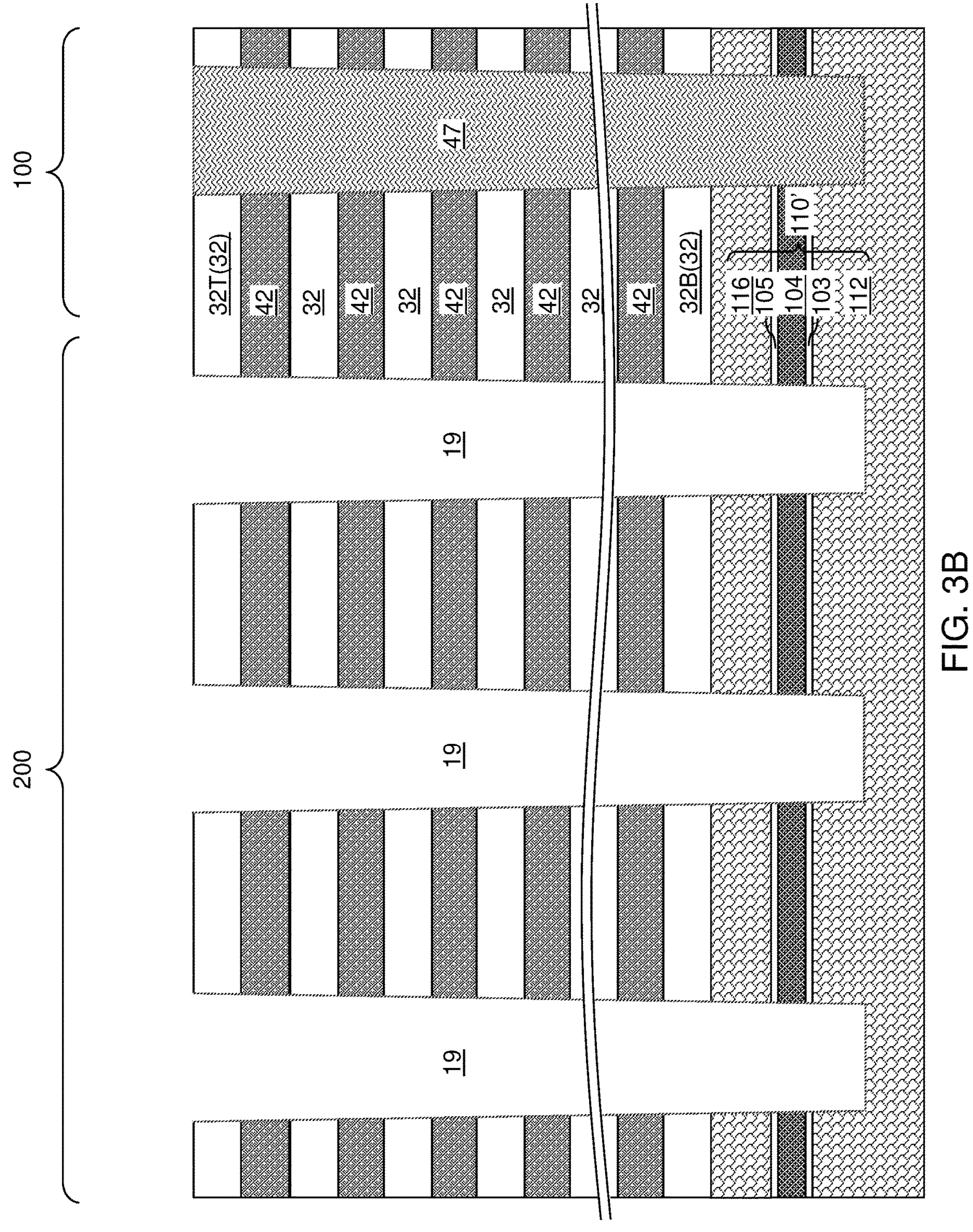

Referring to FIG. 3B, a photoresist layer (not shown) can be applied over the first exemplary structure, and can be lithographically patterned to cover the sacrificial memory opening fill structures 47 while not covering the sacrificial support opening fill structures 17. The sacrificial support opening fill structures 17 can be removed by removing the sacrificial fill material within the areas that are not covered by the photoresist layer. The sacrificial fill material may be removed, for example, by ashing or by performing an etch process such as a wet etch process. Cavities are formed in the support openings 19. The photoresist layer can be removed, for example, by ashing.

Figure 3C:
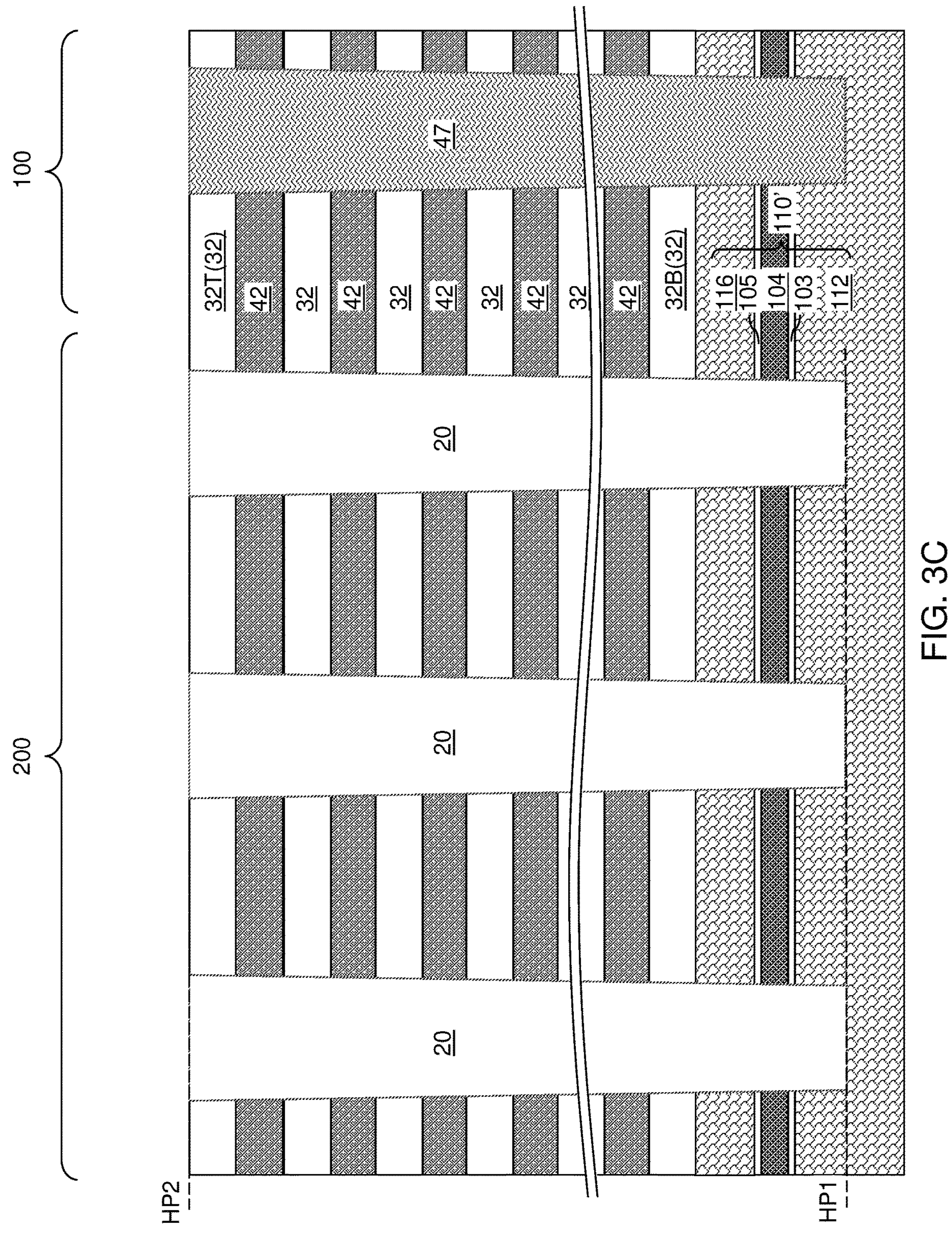

Referring to FIG. 3C, a dielectric fill material such as undoped silicate glass (i.e., silicon oxide) or a doped silicate glass can be deposited in the support openings 19 employing a conformal deposition process such as a chemical vapor deposition process. Portions of the dielectric fill material that overlie the topmost insulating layer 32T may be removed, for example, by chemical mechanical polishing or by an etch back process, such as a wet etch process employing dilute hydrofluoric acid. Remaining portions of the dielectric fill material that fill the support openings 19 comprise dielectric pillar structures 20, which are support pillar structures that provide structural support to the first exemplary structure during a subsequent processing step in which the sacrificial material layers 42 are removed.

In one embodiment, each of the dielectric pillar structures 20 consists essentially of a dielectric fill material, such as silicon oxide. In one embodiment, bottom surfaces of the dielectric pillar structures 20 may be formed within a first horizontal plane HP1 located between a top surface and a bottom surface of the lower source-level semiconductor layer 112. In one embodiment, top surfaces of the dielectric pillar structures 20 may be formed within a second horizontal plane HP2 that contains the top surface of the topmost insulating layer 32T.

Figure 3D:
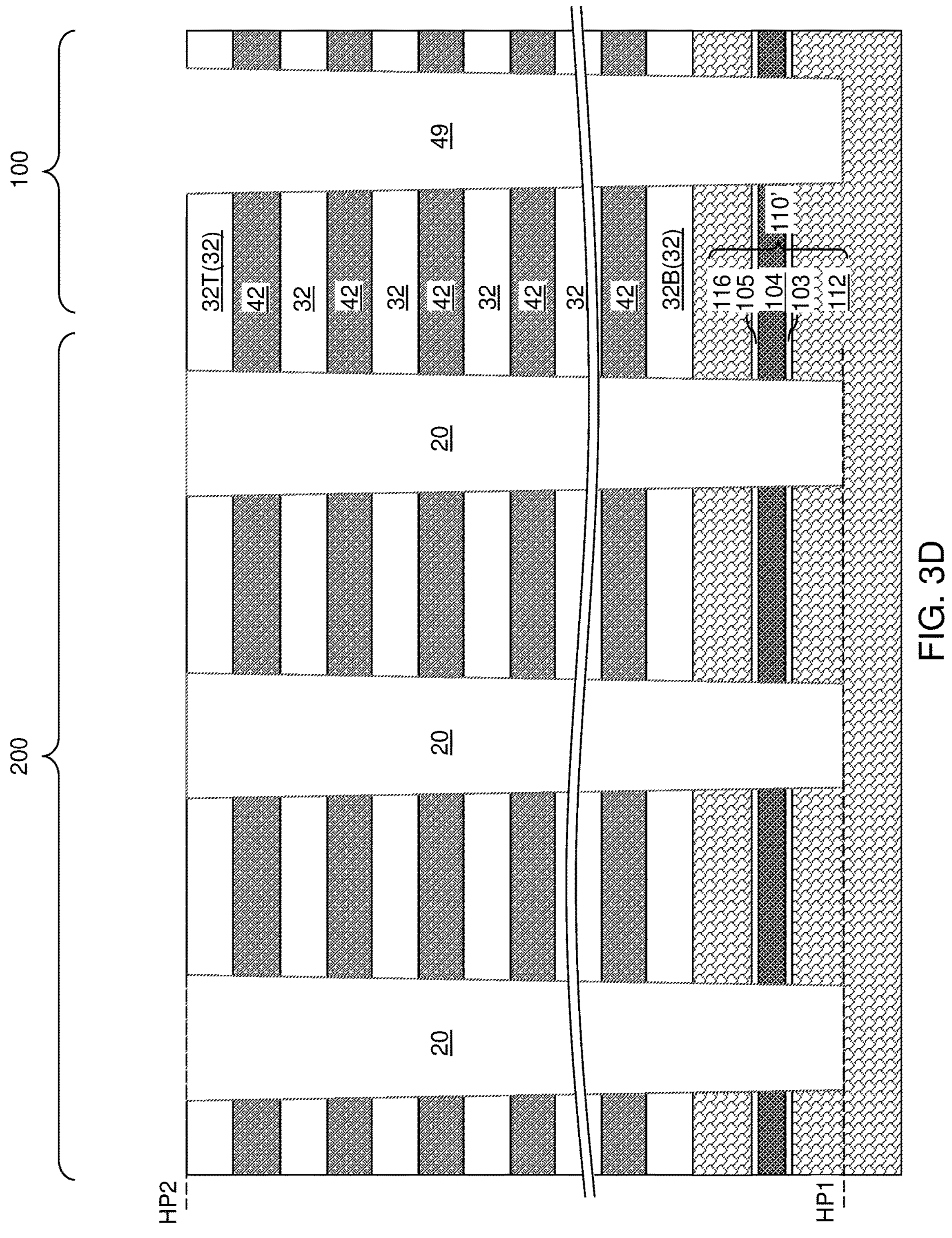

Referring to FIG. 3D, the sacrificial fill material of the sacrificial memory opening fill structures 47 can be removed selective to the materials of the insulating layers 32, the sacrificial material layers 42, the dielectric pillar structures 20, and the in-process source-level material layers 110'. The sacrificial memory opening fill structures 47 may be removed by ashing or by performing an etch process such as a wet etch process. Cavities are formed in volumes of the memory openings 49 from the which the sacrificial memory opening fill structures 47 are removed.

Figure 3E:
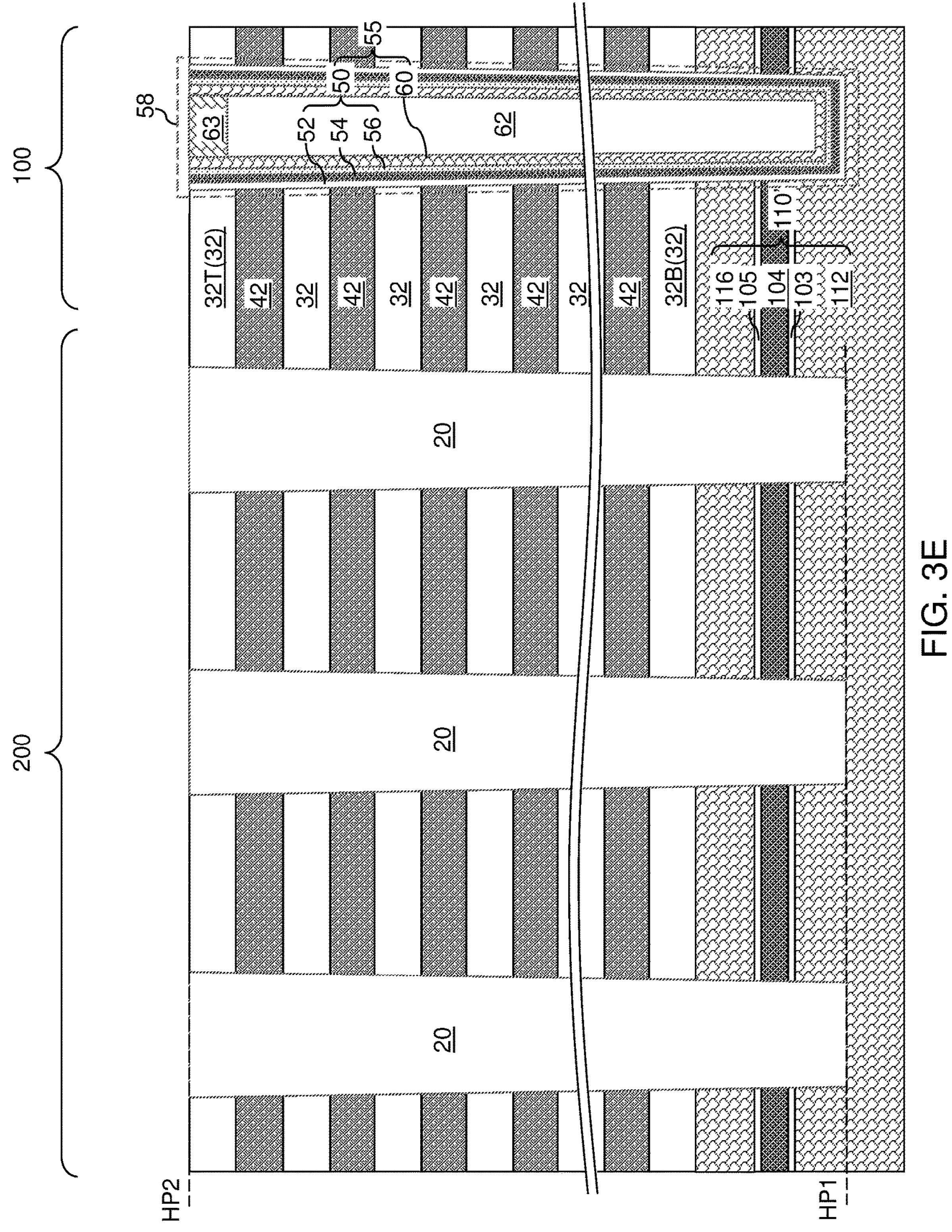

Referring to FIG. 3E, memory opening fill structures 58 are formed in the memory openings 49. For example, a layer stack including a continuous blocking dielectric layer, a continuous memory material layer and a continuous semiconductor channel material layer can be formed in the memory openings 49 and over the topmost insulating layer 32T.

The continuous blocking dielectric layer can include a single dielectric material layer or a stack of a plurality of dielectric material layers. In one embodiment, the continuous blocking dielectric layer can include a dielectric metal oxide layer consisting essentially of a dielectric metal oxide. In one embodiment, the continuous blocking dielectric layer includes aluminum oxide. In one embodiment, the continuous blocking dielectric layer can include multiple dielectric metal oxide layers having different material compositions. Alternatively or additionally, the continuous blocking dielectric layer can include a dielectric semiconductor compound such as silicon oxide, silicon oxynitride, silicon nitride, or a combination thereof. In one embodiment, the continuous blocking dielectric layer can include silicon oxide. The thickness of the continuous blocking dielectric layer can be in a range from 3 nm to 20 nm, although lesser and greater thicknesses can also be employed. Alternatively, the continuous blocking dielectric layer can be omitted, and a backside blocking dielectric layer can be formed after formation of backside recesses on surfaces of memory films to be subsequently formed.

The continuous memory material layer may comprise any memory material that can store a data bit. The data bit may be stored in the form of electrical charges trapped therein, in the form of a resistive state of a material due to changes in the material phase, resistivity or ferroelectric property. In one embodiment, continuous memory material layer may comprise a charge storage layer including a dielectric charge trapping material, which can be, for example, silicon nitride. Alternatively, the continuous memory material layer can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer includes a silicon nitride layer. In one embodiment, the sacrificial material layers 42 and the insulating layers 32 can have vertically coincident sidewalls, and the continuous memory material layer can be formed as a single continuous layer.

The continuous tunneling dielectric layer may comprise a charge-tunneling dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The continuous tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the continuous tunneling dielectric layer can include a stack of a first silicon oxide layer, a silicon oxynitride layer, and a second silicon oxide layer, which is commonly known as an ONO stack. In one embodiment, the continuous tunneling dielectric layer can include a silicon oxide layer or a silicon oxynitride layer. The thickness of the continuous tunneling dielectric layer can be in a range from 2 nm to 20 nm, although lesser and greater thicknesses can also be employed.

The continuous semiconductor channel material layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the continuous semiconductor channel material layer includes amorphous silicon or polysilicon. The continuous semiconductor channel material layer can have a doping of a first conductivity type. The continuous semiconductor channel material layer can be formed by a conformal deposition method such as low pressure chemical vapor deposition (LPCVD). The thickness of continuous semiconductor channel material layer can be in a range from 2 nm to 10 nm, although lesser and greater thicknesses can also be employed.

A dielectric fill material such as silicon oxide can be deposited in remaining cavities in the memory openings 49, and can be vertically recessed such that top surfaces of remaining portions of the dielectric fill material are formed at, or about, the horizontal plane including a bottom surface of the topmost insulating layer 32T. Each remaining portion of the dielectric fill material constitutes a dielectric core 62.

A doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Portions of the deposited semiconductor material having a doping of the second conductivity type, the continuous semiconductor channel material layer, the continuous tunneling dielectric layer, the continuous memory material layer, and the continuous blocking dielectric layer that overlie the second horizontal plane HP2 can be removed by a planarization process. The planarization process may employ, for example, a chemical mechanical polishing (CMP) process and/or a recess etch process.

Each remaining portion of the doped semiconductor material having a doping of the second conductivity type constitutes a drain region 63. Each remaining portion of the continuous semiconductor channel material layer (which has a doping of the first conductivity type) constitutes a vertical semiconductor channel 60. Each remaining portion of the continuous tunneling dielectric layer constitutes a tunneling dielectric layer 56. Each remaining portion of the continuous memory material layer constitutes a memory material layer 54. Each remaining portion of the continuous blocking dielectric layer constitutes a blocking dielectric layer 52. Each contiguous set of a blocking dielectric layer 52, a memory material layer 54, and a tunneling dielectric layer 56 collectively constitutes a memory film 50, which can store electrical charges or ferroelectric polarization with a macroscopic retention time. As used herein, a macroscopic retention time refers to a retention time suitable for operation of a memory device as a permanent memory device such as a retention time in excess of 24 hours. In some embodiments, a blocking dielectric layer 52 may not be present in the memory film 50 at this step, and a backside blocking dielectric layer may be subsequently formed after formation of backside recesses.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements as embodied as portions of the memory material layer 54, and an optional blocking dielectric layer 52. An entire set of material portions that fills a memory opening 49 is herein referred to as a memory opening fill structure 58.

Generally, a memory opening fill structure 58 can be formed in each memory opening 49. The memory opening fill structure 58 comprises a vertical stack of memory elements (such as portions of a memory material layer 54) located at levels of the sacrificial material layers 42. The memory opening fill structure 58 comprises an optional blocking dielectric layer 52, a memory material layer 54, an optional tunneling dielectric layer 56, and a vertical semiconductor channel 60. A tunneling dielectric layer 56 may laterally surround the vertical semiconductor channel 60. The memory material layer 54 can laterally surround the tunneling dielectric layer 56. In case a blocking dielectric layer 52 is present in each memory opening fill structure 58, the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (comprising the memory material layer 54) located at the levels of the sacrificial material layers 42.

While an embodiment is described in which a single tier of insulating layers 32 and sacrificial material layers 42 is formed over the substrate 8, in other embodiments two or more tiers of insulating layers 32 and sacrificial material layers 42 may be formed over the substrate 8. Furthermore, while an embodiment is described in which the memory opening fill structures 58 are formed after formation of the dielectric pillar structures 20, the order of the set of processing steps described with reference to FIGS. 3B and 3C and the set of processing steps described with reference to FIGS. 3D and 3E may be reversed. In this case, the memory opening fill structures 58 may be formed prior to formation of the dielectric pillar structures 20. Generally, the dielectric pillar structures 20 may be formed prior to or after formation of the memory opening fill structure 58. In an alternative embodiment described below with respect to FIGS. 14A-14C, the support pillar structures have the same composition as the memory opening fill structures 58.

Figure 4A:
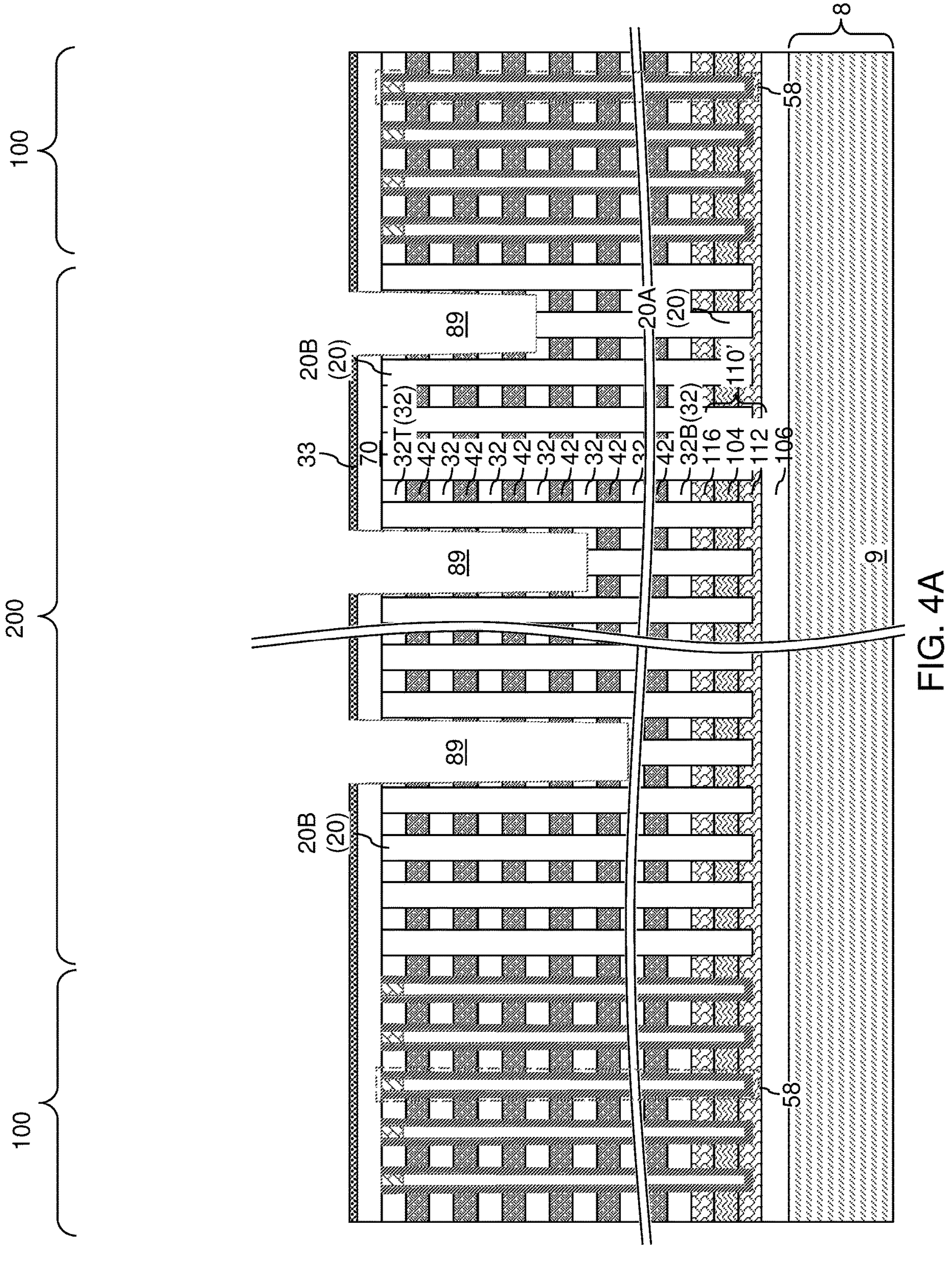
FIG. 4A is a vertical cross-sectional view of the first exemplary structure after formation of a contact via cavities according to the first embodiment of the present disclosure.
Figure 4B:
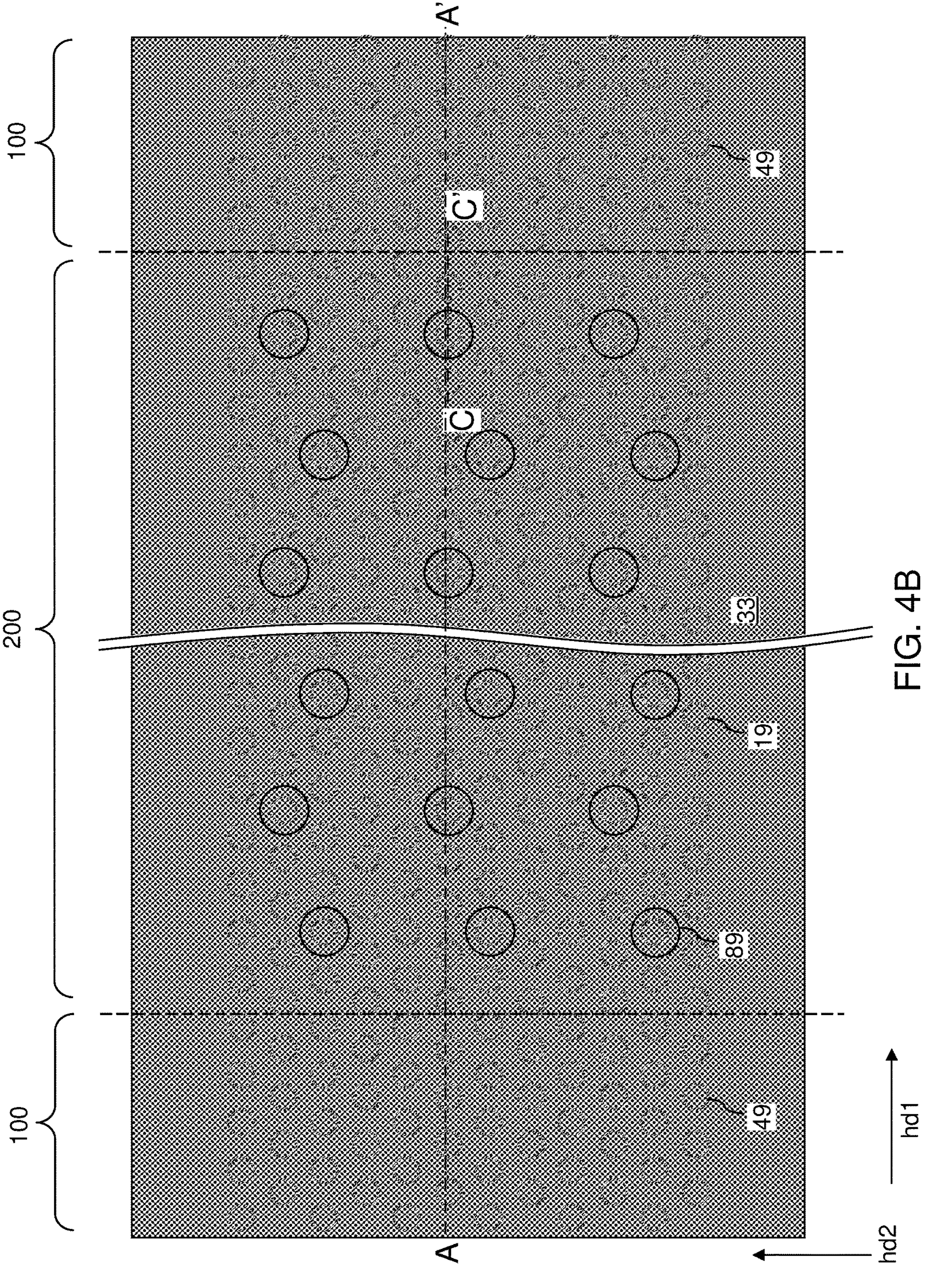
FIG. 4B is a top-down view of the first exemplary structure of FIG. 4A. The vertical plane A-A' is a plane of the vertical cross-sectional view of FIG. 4A.
Figure 4C:
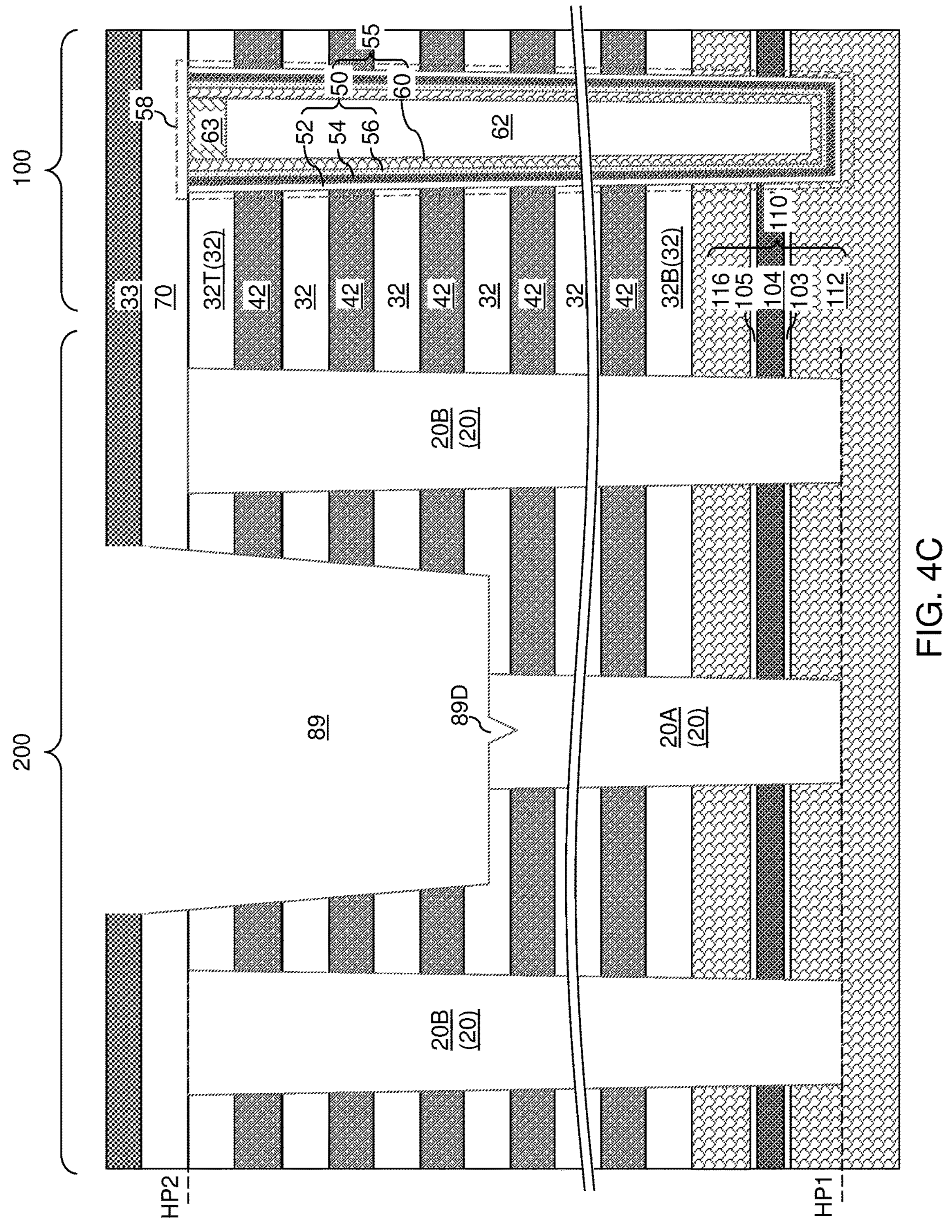
FIG. 4C is a magnified vertical cross-sectional view of the first exemplary structure along the vertical plane C-C' of FIG. 4B.

Referring to FIGS. 4A-4C, an insulating cap layer 70 can be formed over the alternating stack (32, 42), the memory opening fill structures 58, and the dielectric pillar structures 20. The insulating cap layer 70 comprises an insulating material, such as silicon oxide, and may have a thickness in a range from 20 nm to 300 nm, although lesser and greater thicknesses may also be employed.

Subsequently, contact via cavities 89 having different depths can be formed in the contact region 200 through the insulating cap layer 70 and a respective subset of layers within the alternating stack (32, 42). Each of the contact via cavities 89 may be located over a respective dielectric pillar structure 20 that is laterally surrounded by a set of neighboring dielectric pillar structures 20. In one embodiment, each of the contact via cavities 89 may be centered over a respective dielectric pillar structure 20 that is laterally surrounded by a set of neighboring dielectric pillar structures 20. Each contact via cavity 89 can have a respective area in a plan view, such as a top-down view, which includes an entirety of the respective dielectric pillar structure 20, and does not have any areal overlay with the set of neighboring dielectric pillar structures 20. Thus, a first subset of the dielectric pillar structures 20 having an areal overlap with a respective one of the contact via cavities 89 are vertically recessed during formation of the contact via cavities 89, while a second subset of the dielectric pillar structures 20 that do not have any areal overlap within the contact via cavities 89 are not vertically recessed during formation of the contact via cavities 89.

The first subset of the dielectric pillar structures 20 is herein referred to as first-type dielectric pillar structures 20A, and the second subset of the dielectric pillar structures 20 is herein referred to as second-type dielectric pillar structures 20B. The contact via cavities 89 vertically extend through a respective subset of the layers within the alternating stack (32, 42), and overlies a respective first-type dielectric pillar structure 20A. Each of the contact via cavities 89 has a respective bottom surface that includes a top surface of a respective first-type dielectric pillar structure 20A and an annular top segment of a respective insulating layer 32.

Generally, the contact via cavities 89 can be formed using any suitable methods. One embodiment method of forming the contact via cavities 89 is described below. In this embodiment, a patterned hard mask layer 33 may be formed over the alternating stack (32, 42). The patterned hard mask layer 33 may comprise any etch mask material that can withstand ashing processes that are subsequently employed to remove patterned photoresist material layers. The patterned hard mask layer 33 may comprise a dielectric metal oxide material, a metallic material, or a semiconductor material, such as amorphous silicon. The patterned hard mask layer 33 may be formed by depositing a blanket (unpatterned) hard mask material layer, by forming a high-fidelity photoresist material layer (not illustrated), such as a deep ultraviolet (DUV) photoresist material layer, over the blanket hard mask material layer, by lithographically patterning the photoresist material layer to form openings in areas in which contact via cavities 89 are to be subsequently formed, and by transferring the pattern in the patterned photoresist layer through the blanket hard mask material layer by performing an anisotropic etch process. An array of openings is formed through the patterned hard mask layer 33. The high-fidelity photoresist material can be subsequently removed.

A series photoresist layers, in combination with a series of anisotropic etch processes can be subsequently employed to sequentially cover a respective subset of the openings in the patterned hard mask layer 33 and to extend the pattern of the openings in the patterned hard mask layer 33 through a respective number of stacks of an insulating layer 32 and a sacrificial material layer 42. For example, about one half of all of the openings through the patterned hard mask layer 33 can be covered by a first photoresist layer, and one insulating layer 32 and one sacrificial material layer 42 can be etched by performing an anisotropic etch process underneath the openings through the unmasked portions of the sacrificial material layer. Any unmasked portion of the first-type dielectric pillar structures 20A may be collaterally etched by selecting the etch chemistry of the various etch steps of an anisotropic etch process such that the overall etch rate for the material of the dielectric pillar structures 20 matches the overall etch rate for a combination of an insulating layers 32 and a sacrificial material layer 42. The first photoresist layer can be subsequently removed.

About one half of all of the openings through the patterned hard mask layer 33 can be covered by a second photoresist layer. About one half of the unmasked openings are among the openings previously covered by the first photoresist layer, and the remainder of the unmasked openings are among the openings previously unmasked by the first photoresist layer. Two pairs of an insulating layer 32 and a sacrificial material layer 42 (i.e., two insulating layers 32 and two sacrificial material layers 42) can be etched by performing an anisotropic etch process underneath the openings through the unmasked portions of the second sacrificial material layer 42. Any unmasked portion of the dielectric pillar structures 20 may be collaterally etched by selecting the etch chemistry of the various etch steps of an anisotropic etch process such that the overall etch rate for the material of the dielectric pillar structures 20 matches the overall etch rate for a combination of two insulating layers 32 and two sacrificial material layers 42. The second photoresist layer can be subsequently removed.

The above scheme can be repeated up to the N-th photoresist layer and an N-th anisotropic etch process etching $2^{(N-1)}$ pairs of an insulating layer 32 and a sacrificial material layer 42. A terminal anisotropic etch process may be performed in the absence of any photoresist layer, for example, to etch through unmasked portions of a respective set of two insulating layers 32 and a sacrificial material layer 42 that underlies any opening through the patterned hard mask layer 33.

Contact via cavities 89 that may have up to 2 different depths can be formed in the contact region 200. In an illustrative example, if N is 8, the total number of sacrificial material layers 42 may be $2^8$, i.e., 256. The patterned hard mask layer 33 can be subsequently removed, for example, by performing an etch process that removes the material of the patterned hard mask layer 33 selective to the materials of the alternating stack (32, 42).

In summary, each contact via cavity 89 can be formed by vertically recessing the first-type dielectric pillar structure 20A and a neighboring portion of the alternating stack (32, 42) such that a remaining portion of the first-type dielectric pillar structure 20A is present underneath the contact via cavity 89. A first-type dielectric pillar structure 20A comprises a top surface that is physically exposed to an overlying contact via cavity 89. An annular horizontal surface segment of an insulating layer 32 may be physically exposed at the bottom of each contact via cavity 89. The second-type dielectric pillar structures 20B are not recessed during formation of the contact via cavities 89. Thus, the second-type dielectric pillar structures 20B have the same height as the dielectric pillar structures 20 as formed at the processing step described with reference to FIG. 3C. In one embodiment, each first-type dielectric pillar structure 20A can be laterally surrounded by a set of second-type dielectric pillar structures 20B having a greater vertical extent than the first-type dielectric pillar structure 20A.

In one embodiment, bottom surfaces of the first-type dielectric pillar structure 20A and the second-type dielectric pillar structures 20B are located within the same first horizontal plane HP1 that underlies the alternating stack (32, 42). However, the top surfaces of the second-type dielectric pillar structures 20B are located within a second horizontal plane HP2 including a topmost surface of the alternating stack (32, 42), while the top surfaces of the first-type dielectric pillar structures 20A are located below the second horizontal plane HP2.

In one embodiment, if a vertical seam is located in the middle of the first-type dielectric pillar structures 20A, then the first-type dielectric pillar structures 20A may comprise top surfaces containing a respective optional divot 89D therein. The depth of the divot may be in a range from 1 nm to 100 nm, such as from 3 nm to 30 nm, although divots having lesser and greater depths may also be formed.

Figure 5A:
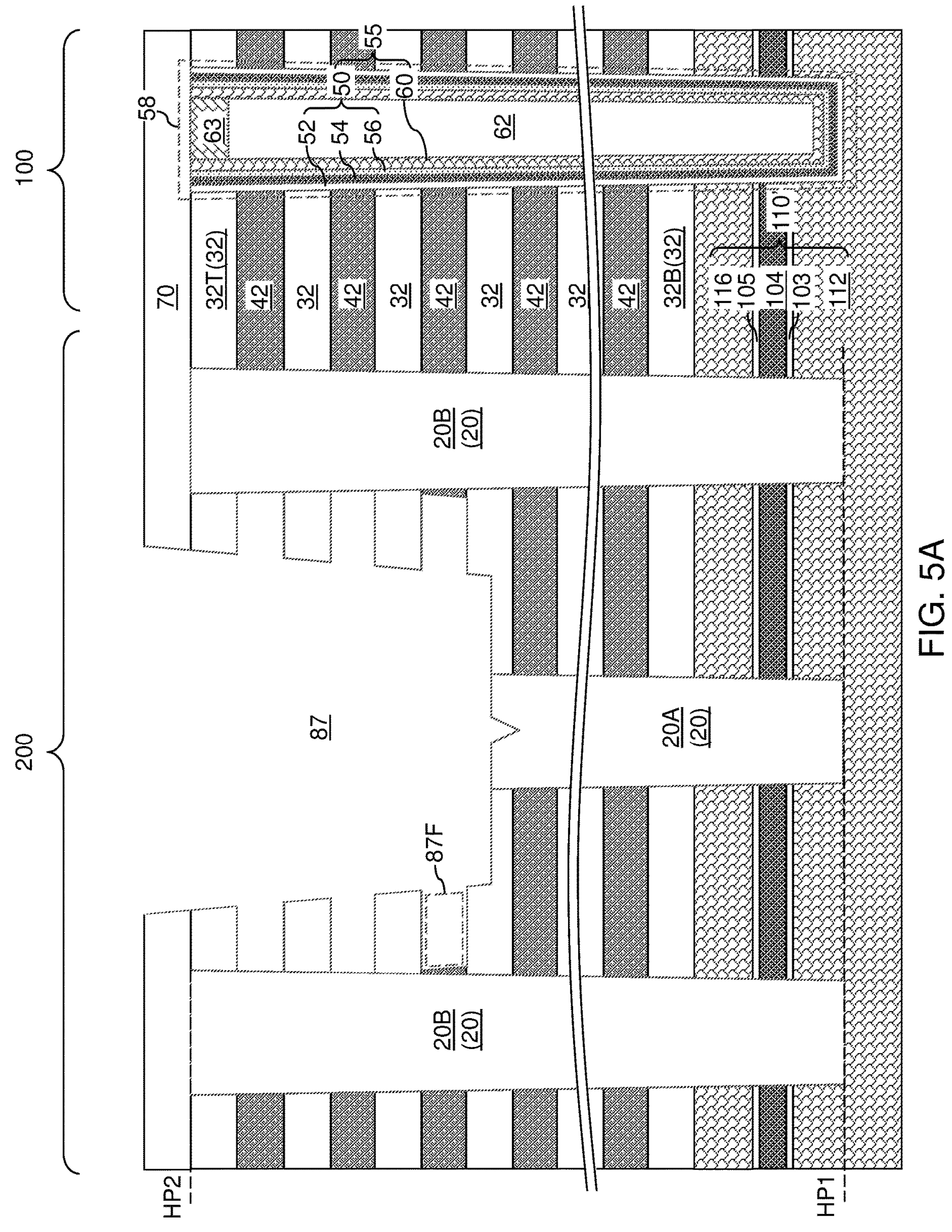
FIGS. 5A and 5B are sequential vertical cross-sectional views of a region of the first exemplary structure during formation of fin cavities and an insulating liner layer according to the first embodiment of the present disclosure.

Referring to FIG. 5A, a selective isotropic etch process can be performed, which etches the material of the sacrificial material layers 42 selective to the material of the insulating layers 32. In an illustrative example, if the sacrificial material layers 42 comprise silicon nitride and if the insulating layers 32 comprise silicon oxide, a wet etch process employing hot phosphoric acid may be performed. Physically exposed sidewalls of the sacrificial material layers 42 can be isotropically recessed around the contact via cavities 89. The contact via cavities 89 are converted into finned contact via cavities 87. Each finned contact via cavity 87 comprises at least one fin cavity 87F, which comprises voids from which the material of the sacrificial material layers 42 is removed.

The lateral recess distance of the selective isotropic etch process may be selected such that surface segments of sidewalls of a subset of the second-type dielectric pillar structures 20B are physically exposed to the fin cavities 87F. For example, the lateral recess distance of the selective isotropic etch process may be in a range from 10 nm to 200 nm, such as from 20 nm to 100 nm, although lesser and greater lateral recess distances may also be employed. In some embodiments, a first subset of fin cavities 87F in a finned contact via cavity 87 may be laterally bounded by surface segments of sidewalls of neighboring second-type dielectric pillar structures 20B while a second subset of the fin cavities 87F is laterally spaced from the neighboring second-type dielectric pillar structures 20B by remaining portions of the sacrificial material layers 42.

Figure 5B:
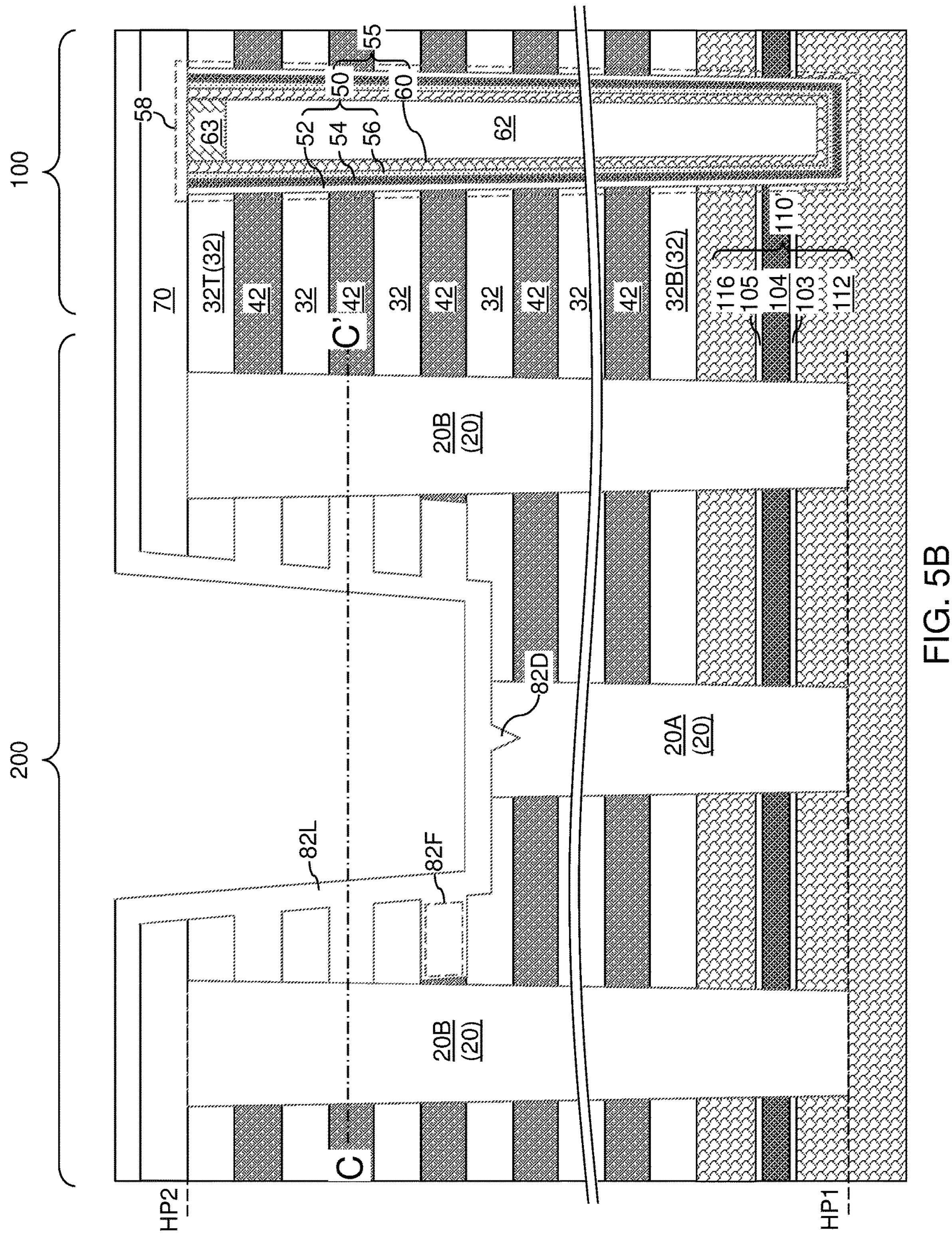
Figure 5C:
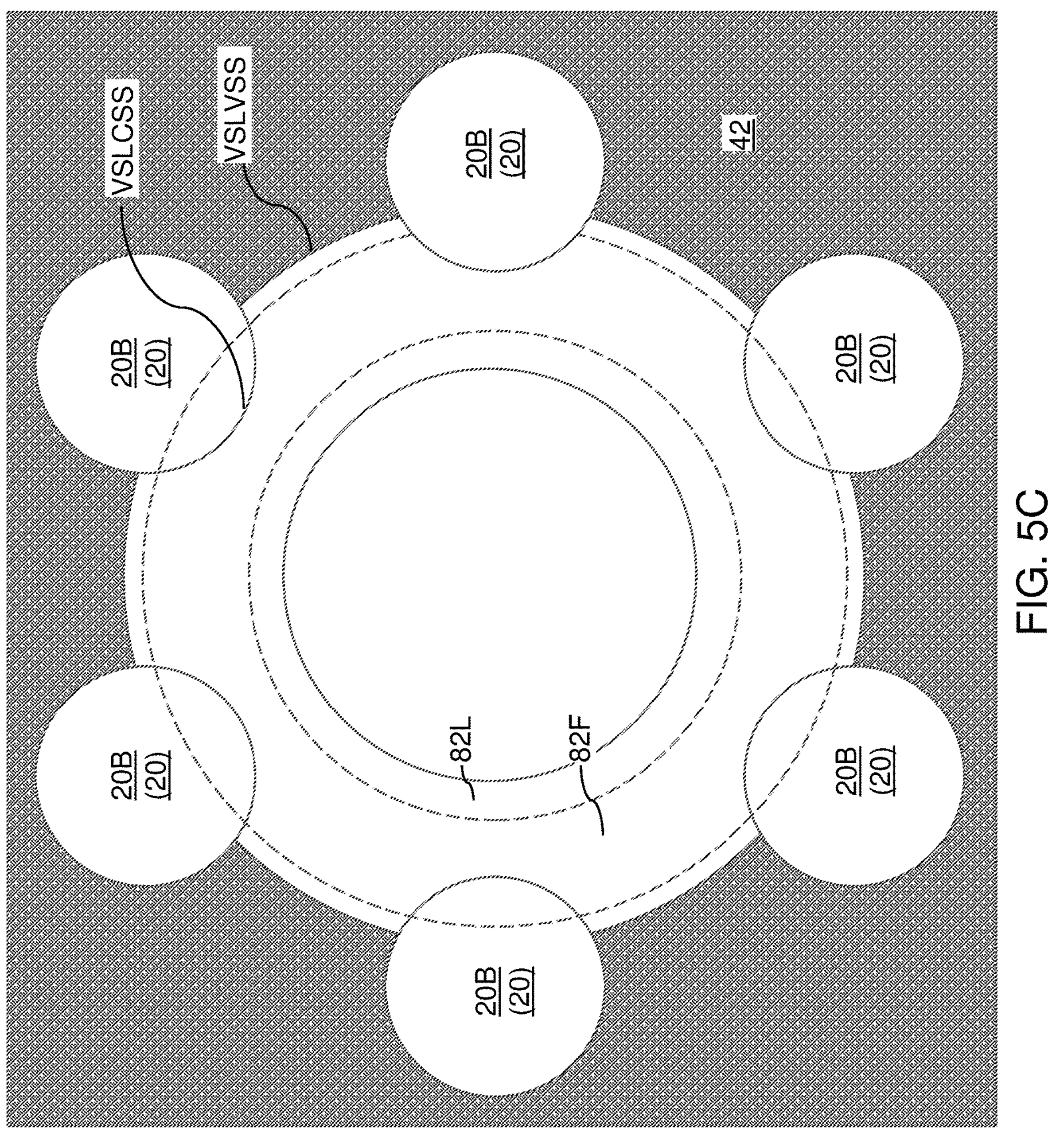
FIG. 5C is a horizontal cross-sectional view of a region of the first exemplary structure along the horizontal plane C-C' of FIG. 5B.

Referring to FIGS. 5B and 5C, an insulating fill material, such as silicon oxide, can be conformally deposited in the fin cavities 87F and divots in the top surfaces of the first-type dielectric pillar structures 20A and over sidewalls of the finned contact via cavities 87 and over the insulating cap layer 70 to form an insulating liner layer 82L. The thickness of the insulating liner layer 82L is greater than one half of the thickness of a sacrificial material layer 42, and may be in a range from 15 nm to 50 nm, although lesser and greater thicknesses may also be employed. The insulating liner layer 82L comprises insulating fins 82F that fill the volumes of the fin cavities 87F, and may further comprise insulating divot fill material portions 82D that fill the divots in the top surfaces of the first-type dielectric pillar structures 20A.

In one embodiment shown in FIG. 5C, a first insulating fin 82F within the vertical stack of insulating fins 82F comprises a plurality of vertically-straight and laterally-concave surface segments VSLCSS that contact second-type dielectric pillar structures 20B. In one embodiment, the first insulating fin 82F within the vertical stack of insulating fins 82F further comprises a plurality of vertically-straight and laterally-convex surface segments VSLVSS that contact a sacrificial material layer 42. In one embodiment, each vertically-straight and laterally-concave surface segment VSLCSS of the plurality of vertically-straight and laterally-concave surface segments VSLCSS is adjoined to a respective pair of the vertically-straight and laterally-convex surface segments VSLVSS of the plurality of vertically-straight and laterally-convex surface segments VSLVSS.

Figure 6A:
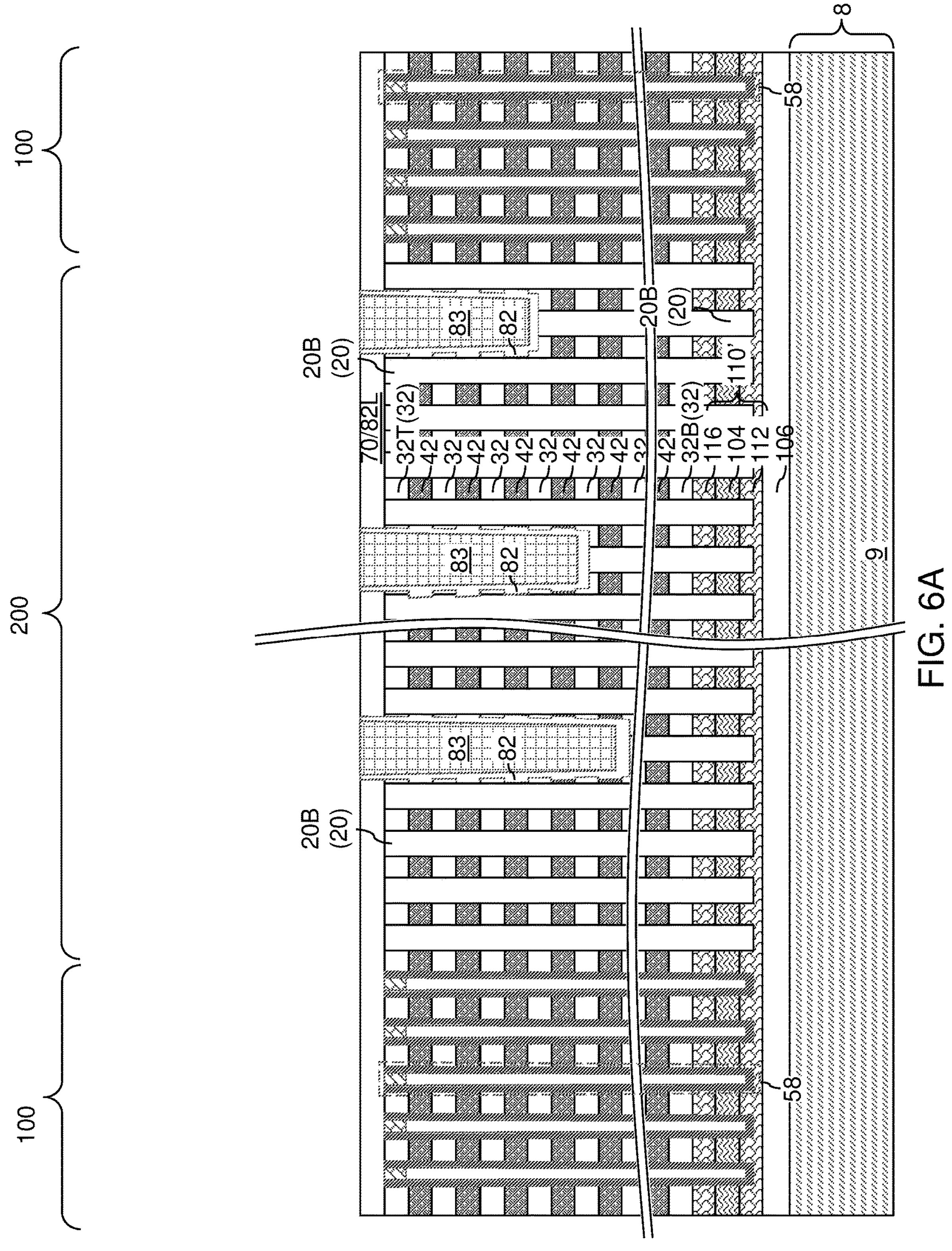
FIG. 6A is a vertical cross-sectional view of the first exemplary structure after formation of sacrificial via fill material portions according to the first embodiment of the present disclosure.
Figure 6B:
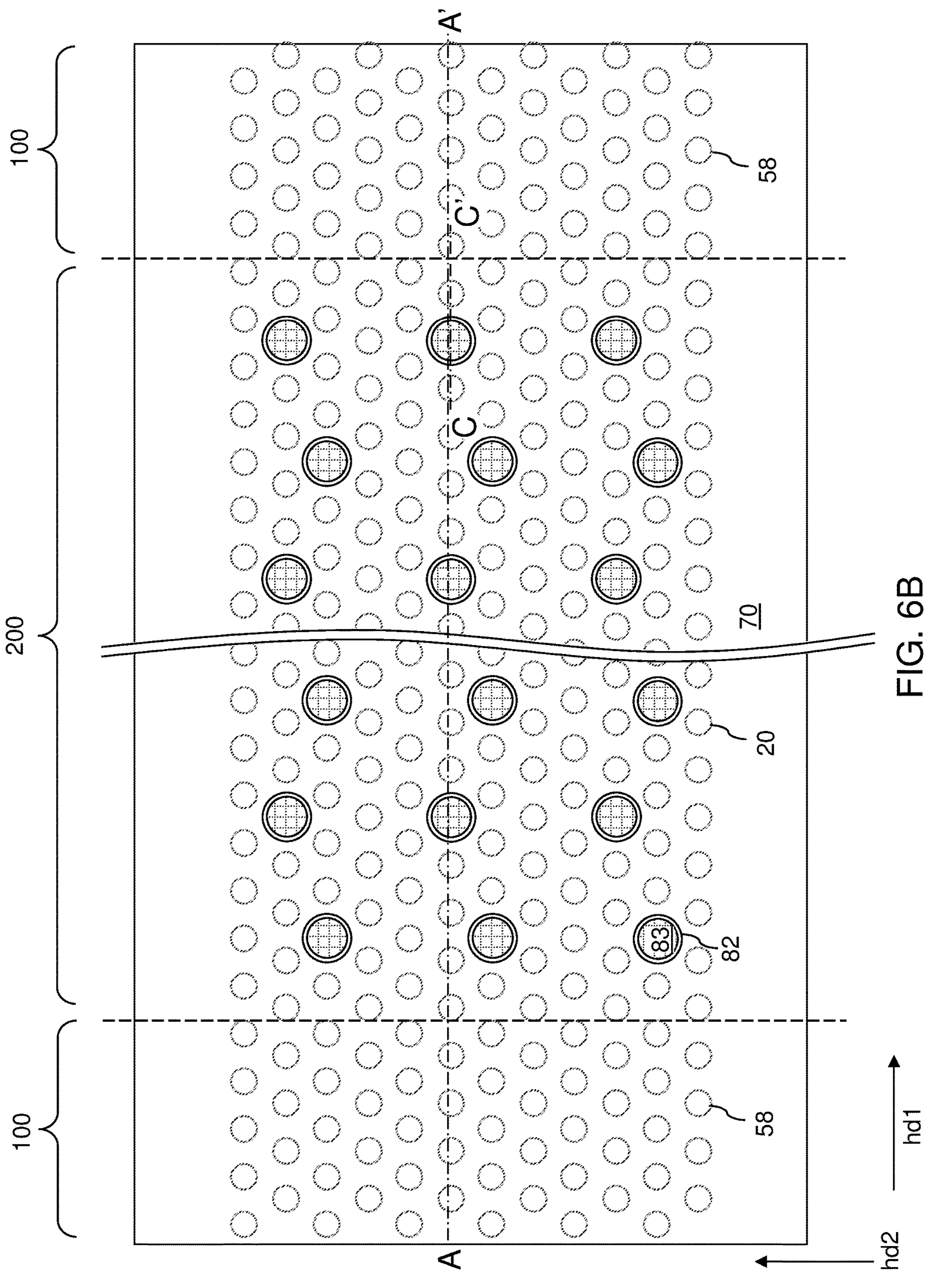
FIG. 6B is a top-down view of the first exemplary structure of FIG. 6A. The vertical plane A-A' is a plane of the vertical cross-sectional view of FIG. 6A.
Figure 6C:
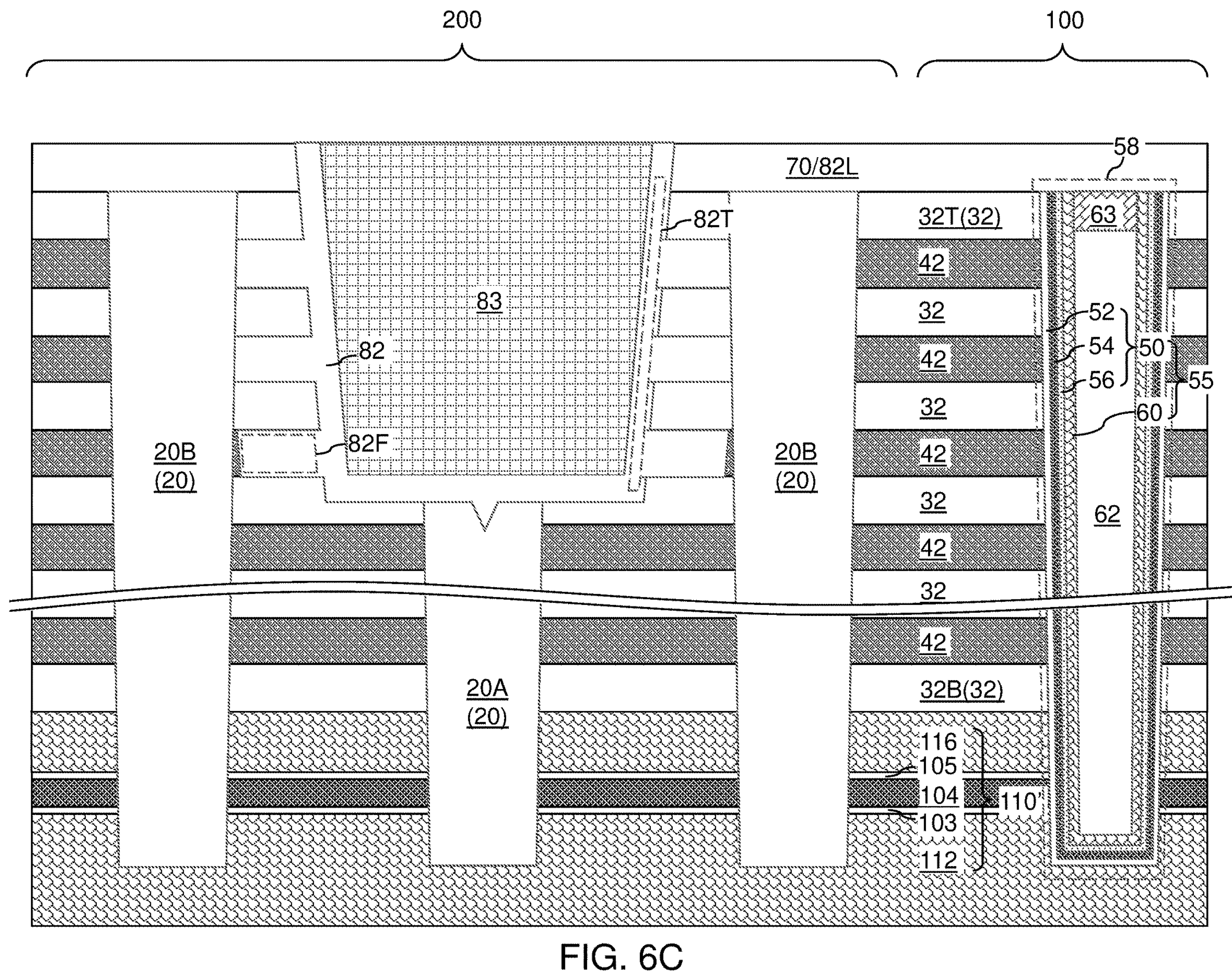
FIG. 6C is a magnified vertical cross-sectional view of the first exemplary structure along the vertical plane C-C' of FIG. 6B.

Referring to FIGS. 6A-6C, a sacrificial fill material can be deposited in the voids within the contact via cavities 89. The sacrificial fill material comprises a material that can be subsequently removed selective to materials of the insulating liner layer 82L and the insulating cap layer 70. For example, the sacrificial fill material may comprise a carbon-based material, such as amorphous carbon or diamond-like carbon, a semiconductor material, such as amorphous silicon, polysilicon, or a silicon-germanium alloy, or a dielectric material, such as borosilicate glass or organosilicate glass.

Excess potions of the sacrificial fill material may be removed from above the horizontal plane including the top surface of the insulating cap layer 70 employing a planarization process. The planarization process may comprise a recess etch process or a chemical mechanical polishing process. Each remaining portion of the sacrificial fill material constitutes a sacrificial via fill material portion 83. Excess potions of the insulating liner layer 82L may also be removed from above the horizontal plane including the top surface of the insulating cap layer 70 during the same or separate planarization step used to form the sacrificial via fill material portion 83. Remaining portions of the insulating liner layer 82L comprise finned insulating spacers 82. Each finned insulating spacer 82 comprises a vertically-extending tubular portion 82T that laterally surrounding a sacrificial via fill material portion 83 and a vertical stack of insulating fins 82F that laterally extend outward from the vertically-extending tubular portion 82T at each level of a subset of the sacrificial material layers 42, as shown in FIG. 6C. Alternatively, potions of the insulating liner layer 82L may remain above the horizontal plane including the top surface of the insulating cap layer 70 after the planarization step. In this case, the excess potions of the insulating liner layer 82L are removed from above the horizontal plane including the top surface of the insulating cap layer 70 to form the finned insulating spacers 82 during the step described below with respect to FIG. 10B.

Figure 7A:
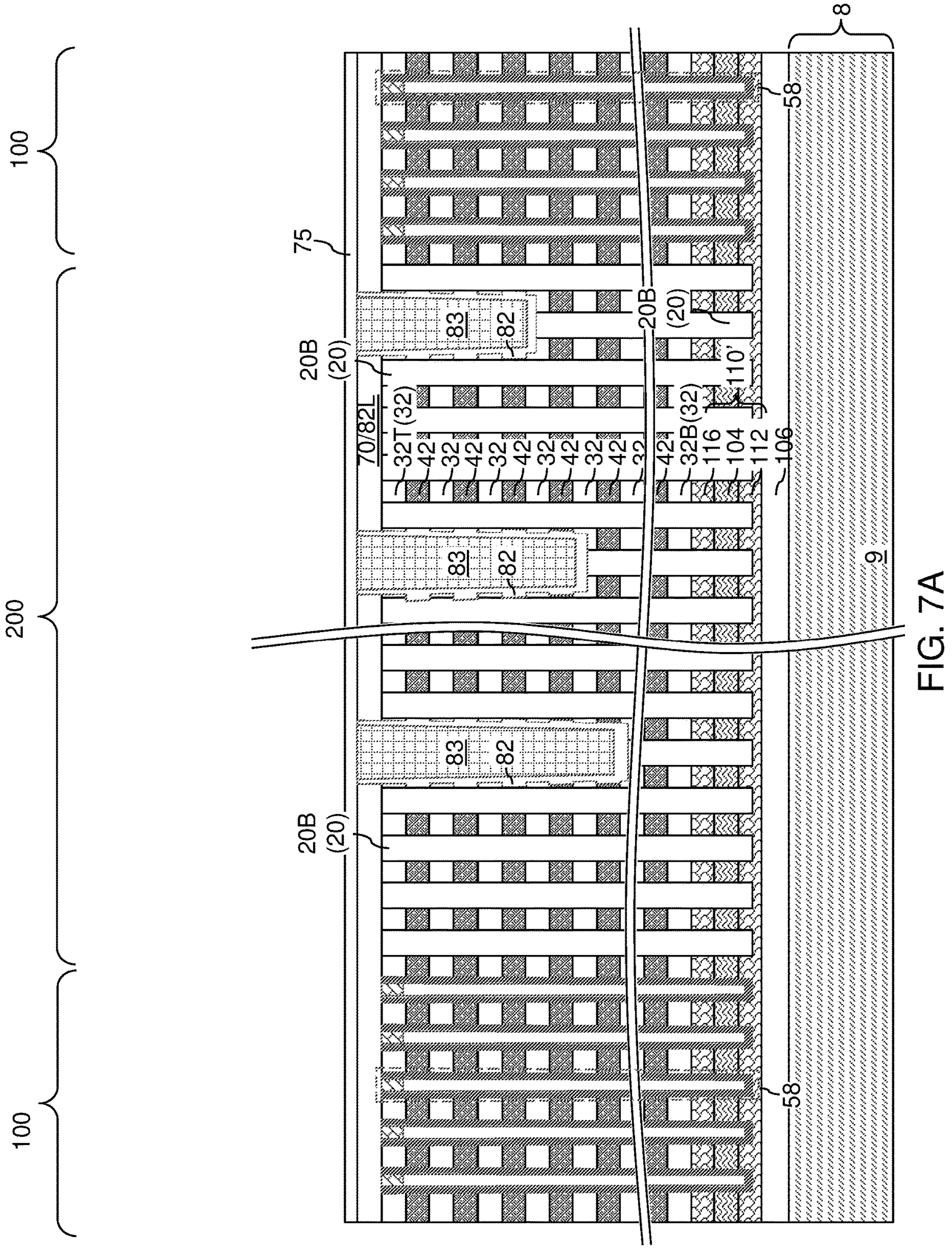
FIG. 7A is a vertical cross-sectional view of the first exemplary structure after formation of lateral isolation trenches according to the first embodiment of the present disclosure.
Figure 7B:
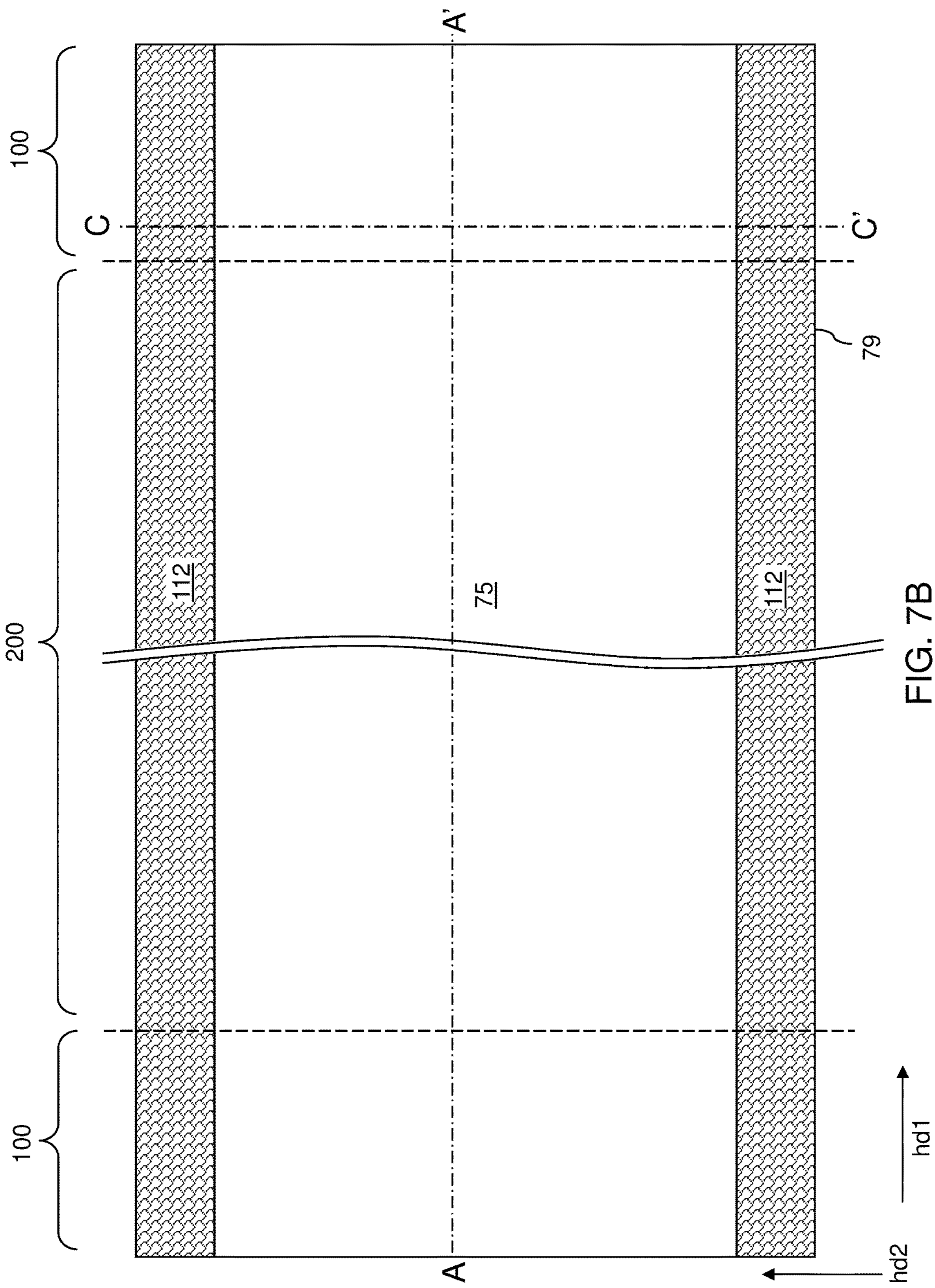
FIG. 7B is a top-down view of the first exemplary structure of FIG. 7A. The vertical plane A-A' is a plane of the vertical cross-sectional view of FIG. 7A.
Figure 7C:
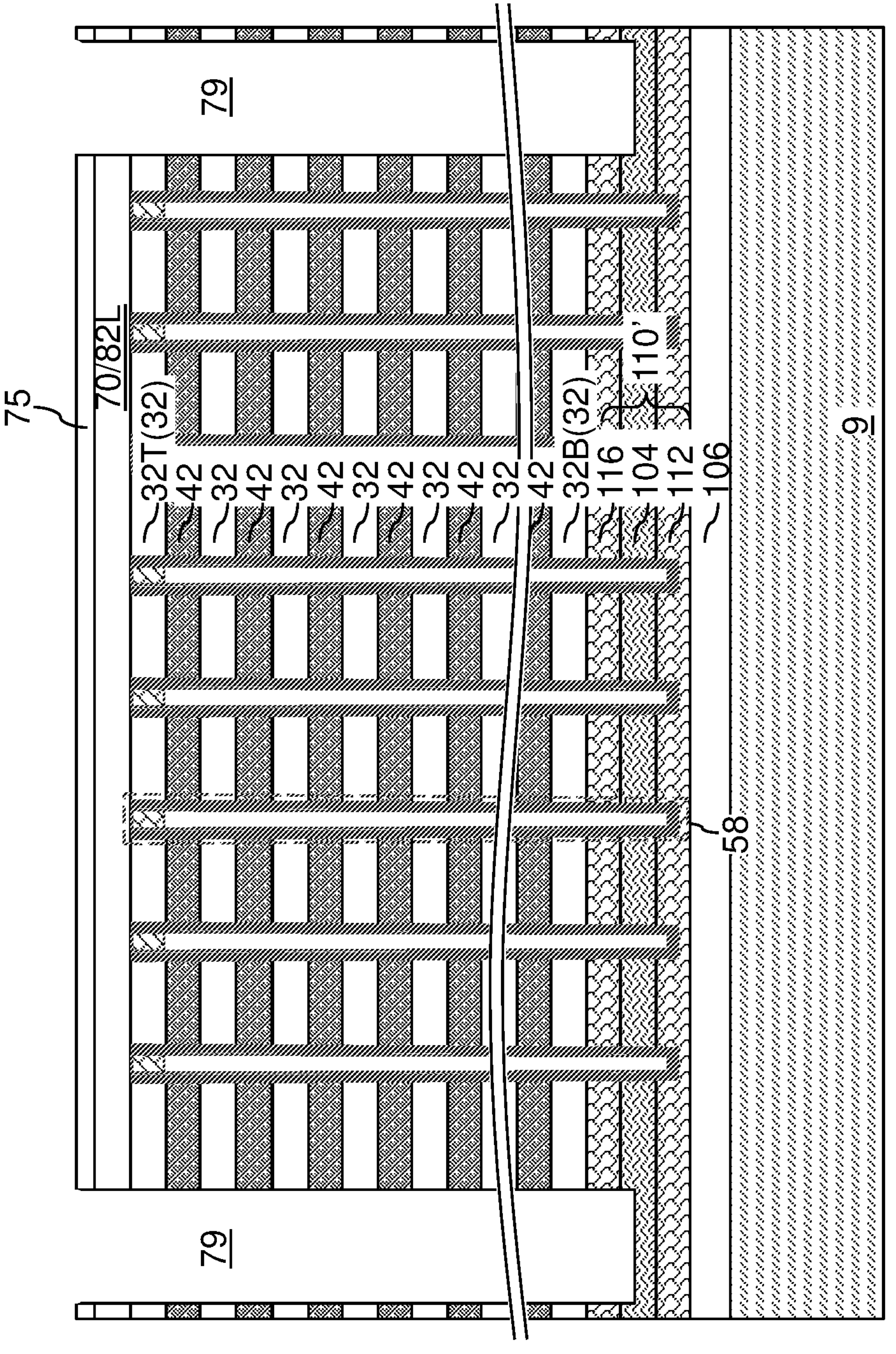
FIG. 7C is a magnified vertical cross-sectional view of the first exemplary structure along the vertical plane C-C' of FIG. 7B.

Referring to FIGS. 7A-7C, a sacrificial capping layer 75 may be deposited over the insulating cap layer 70 and the sacrificial via fill material portions 83. The sacrificial capping layer 75 comprises a material that may be subsequently removed. For example, the sacrificial capping layer 75 may comprise a dielectric material, such as silicon oxide, or a semiconductor material such as amorphous silicon. The thickness of the sacrificial capping layer 75 may be in a range from 5 nm to 100 nm, although lesser and greater thicknesses may also be employed.

A photoresist layer (not shown) can be applied over the sacrificial capping layer 75, and is lithographically patterned to form elongated openings in areas between clusters of memory opening fill structures 58, which can be slit shaped areas that are free of any memory opening fill structures 58, any dielectric pillar structures 20, and any sacrificial via fill material portions 83. The pattern in the photoresist layer can be transferred through the sacrificial capping layer 75, the insulating cap layer 70, and the alternating stack (32, 42) employing an anisotropic etch to form lateral isolation trenches 79. The lateral isolation trenches 79 vertically extend from the top surface of the sacrificial capping layer 75 to the top surface of the source-level sacrificial layer 104 (if present) or to the top surface of the substrate 8 if layers 110' are omitted. The lateral isolation trenches 79 laterally extend along the first horizontal direction hd1 between neighboring memory blocks of memory opening fill structures 58.

In one embodiment, the lateral isolation trenches 79 can laterally extend along the first horizontal direction (e.g., word line direction) hd1 and can be laterally spaced apart from each other along the second horizontal direction hd2 (which may be a bit line direction) that is perpendicular to the first horizontal direction hd1. The memory opening fill structures 58 can be arranged in rows that extend along the first horizontal direction hd1. Multiple rows of memory opening fill structures 58 can be located between each neighboring pair of lateral isolation trenches 79 in a respective memory block. Thus, the lateral isolation trenches 79 separate adjacent memory blocks along the second horizontal direction hd2. Generally, lateral isolation trenches 79 laterally extending along the first horizontal direction hd1 can be formed through the vertically alternating sequence of insulating layers 32 and sacrificial material layers 42. The lateral isolation trenches 79 are laterally spaced apart along the second horizontal direction hd2.

For each set of sacrificial via fill material portions 83 that are arranged along the first horizontal direction hd1, a first lateral isolation trench 79 and a second lateral isolation trench 79 that laterally extend along the first horizontal direction hd1 and are laterally spaced apart along the second horizontal direction hd2 through the alternating stack (32, 42) can be formed such that the set of sacrificial via fill material portions 83 is located between the first lateral isolation trench 79 and the second lateral isolation trench 79.

FIGS. 8A-8D are sequential vertical cross-sectional views of the first exemplary structure during formation of a source contact layer 114 and electrically conductive layers 46 according to an embodiment of the present disclosure.

Figure 8A:
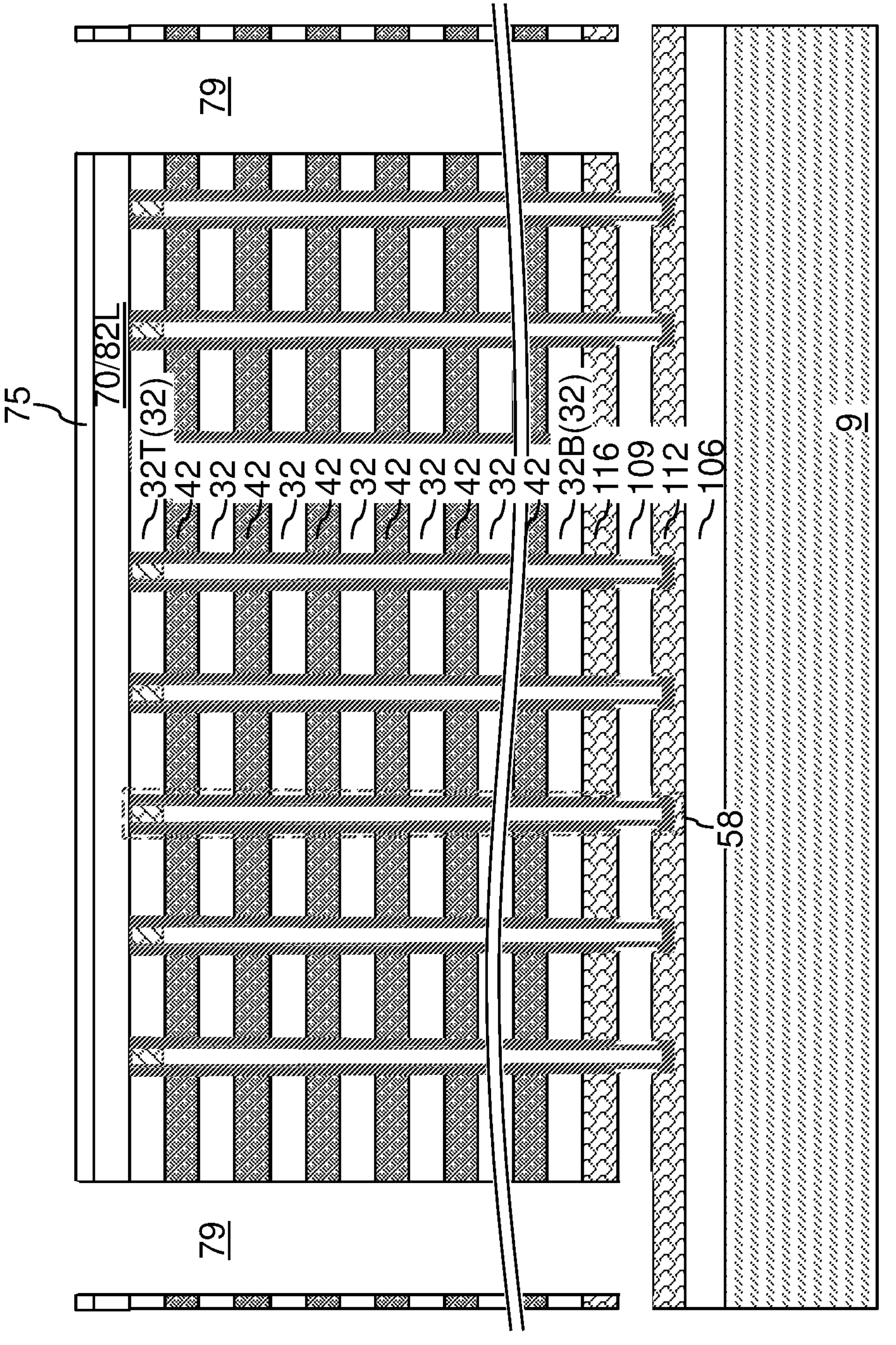
FIGS. 8A-8D are sequential vertical cross-sectional views of the first exemplary structure during formation of a source contact layer and electrically conductive layers according to the first embodiment of the present disclosure.

Referring to FIG. 8A, an etchant that etches the material of the source-level sacrificial layer 104 selective to the materials of the alternating stack (32, 42), the sacrificial capping layer 75, the insulating cap layer 70, the lower source-level semiconductor layer 112, the upper source-level semiconductor layer 116, the upper sacrificial liner 105 (if present), and the lower sacrificial liner 103 (if present) may be introduced into the lateral isolation trenches 79 by performing an isotropic etch process. For example, if the source-level sacrificial layer 104 includes undoped amorphous silicon or a silicon-germanium alloy, a wet etch process using hot trimethyl-2 hydroxyethyl ammonium hydroxide ("hot TMY") or tetramethyl ammonium hydroxide (TMAH) may be used to remove the source-level sacrificial layer 104 selective to the alternating stack (32, 42), the sacrificial capping layer 75, the insulating cap layer 70, the lower source-level semiconductor layer 112, and the upper source-level semiconductor layer 116. A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the lateral isolation trenches 79. Specifically, even if sidewalls of the upper source-level semiconductor layer 116 are physically exposed or even if a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

A sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper sacrificial liner 105 (if present) and the lower sacrificial liner 103 (if present) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners. A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 8B:
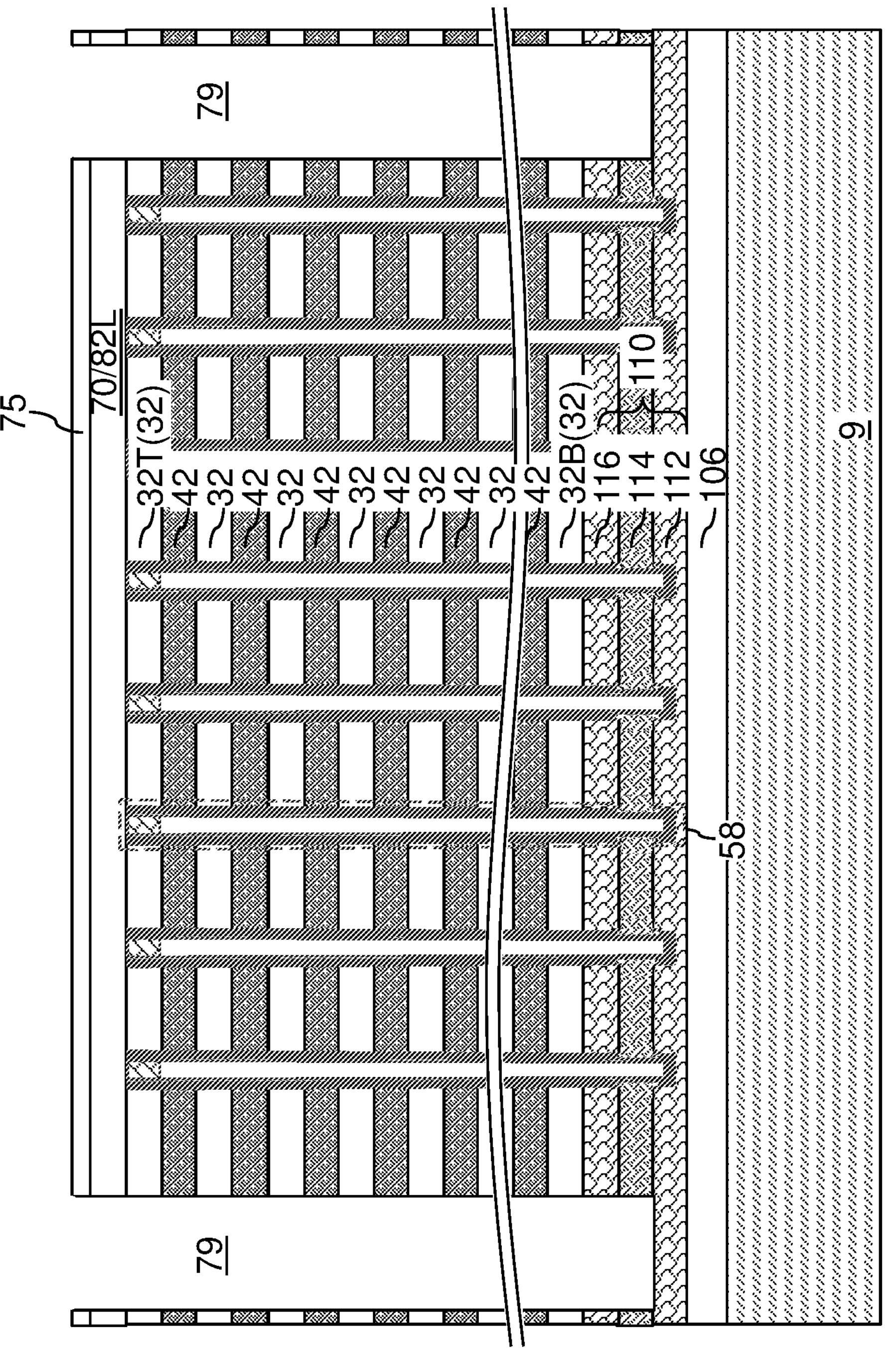

Referring to FIG. 8B, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114. The layer stack including the lower source-level semiconductor layer 112, the source contact layer 114, and the upper source-level semiconductor layer 116 constitutes a source-level material layers 110, which replaces the in-process source-level material layers 110'. The source contact layer 114 contacts an end portion of each of the vertical semiconductor channels 60.

Optionally, a dielectric surface conversion process, such as an oxidation process or a nitridation process, may be performed to convert physically exposed edge surface portions of the source-level material layers 110 exposed in each lateral isolation trench 79 to form trench bottom dielectric liners (not illustrated). The source-level material layers 110 include semiconductor material layers such as a stack of a lower source-level semiconductor layer 112, a source contact layer 114, and an upper source-level semiconductor layer 116, which may be converted to semiconductor oxide or nitride edge portions, such as silicon oxide, silicon nitride or silicon oxynitride edge portions exposed in the lateral isolation trenches 79. Alternatively, if the top source contact or another source layer to vertical semiconductor scheme is used, then the source-level material layers 110 and the steps shown in FIGS. 8A and 8B may be omitted.

Figure 8C:
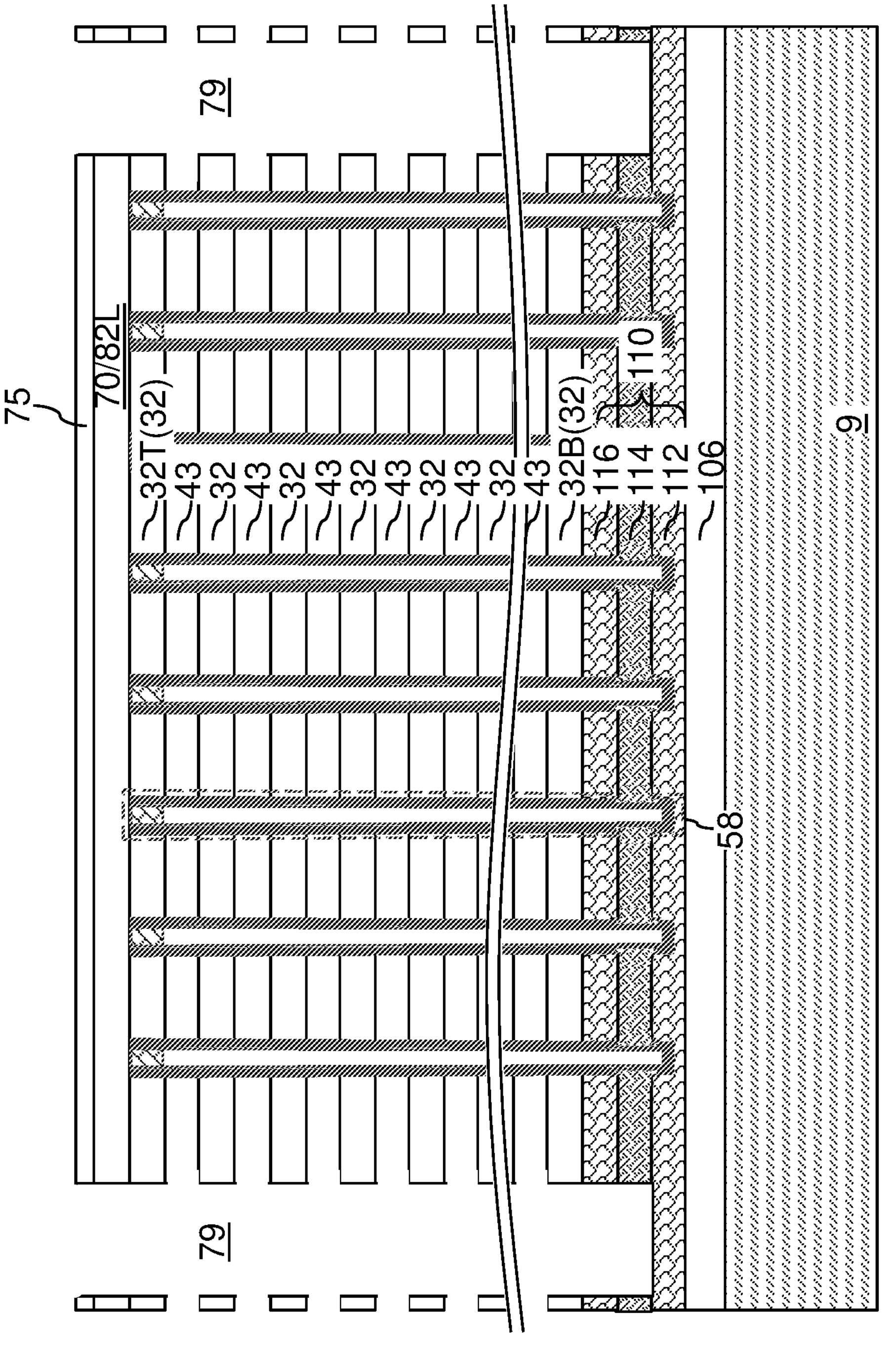

Referring to FIG. 8C, an isotropic etch process can be performed to remove the sacrificial material layers 42 selective to the insulating layers 32, the planar insulating layer 106, the memory opening fill structures 58, the sacrificial capping layer 75, the insulating cap layer 70, the source-level material layers 110, and the finned insulating spacers 82. Laterally-extending cavities 43 can be formed in volumes from which the sacrificial material layers 42 are removed. Sidewall surface segments of the memory opening fill structures 58 can be physically exposed to the laterally-extending cavities 43. In an illustrative example, if the sacrificial material layers 42 comprise silicon oxide, the isotropic etch process may comprise a wet etch process employing hot phosphoric acid, which is a process in which the first exemplary structure is immersed in phosphoric acid at, or near, the boiling point of the phosphoric acid. A suitable cleaning process may be performed as needed. According to an aspect of the present disclosure, the first-type dielectric pillar structures 20A provide structural support to the finned insulating spacers 82 and the sacrificial via fill material portions 83.

Figure 8D:
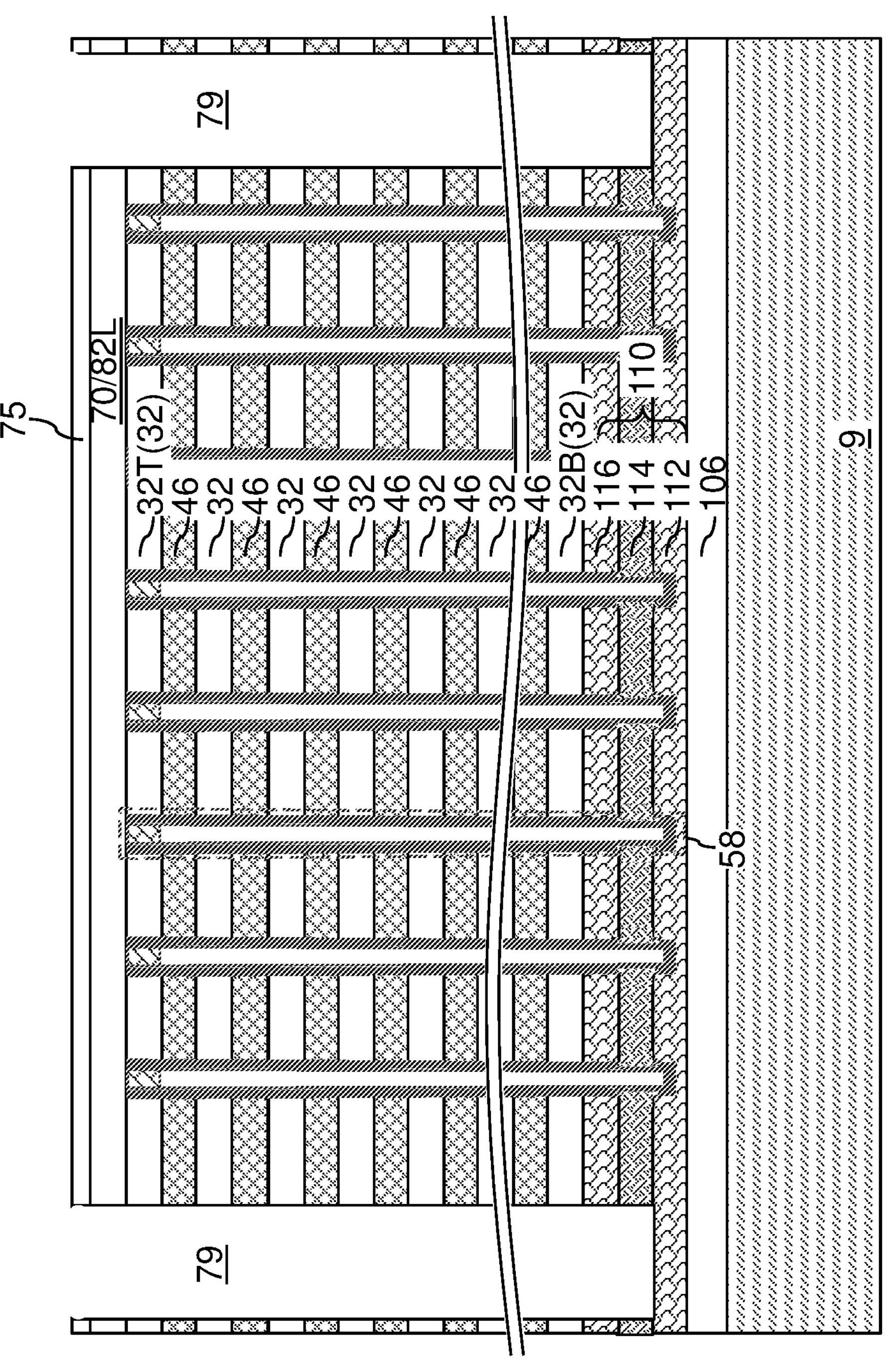
Figure 9A:
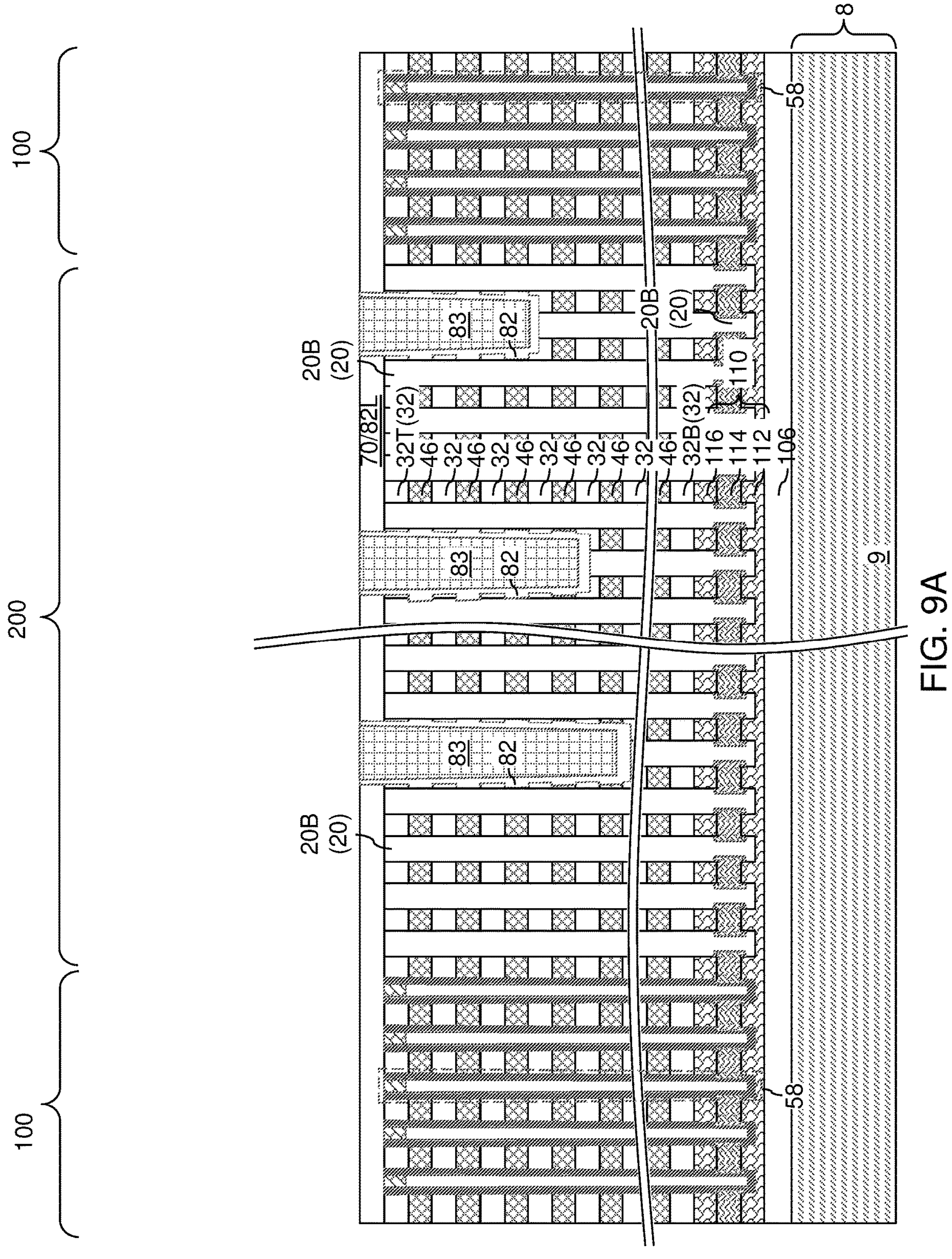
FIG. 9A is a vertical cross-sectional view of the first exemplary structure after formation of isolation trench fill structures according to the first embodiment of the present disclosure.
Figure 9B:
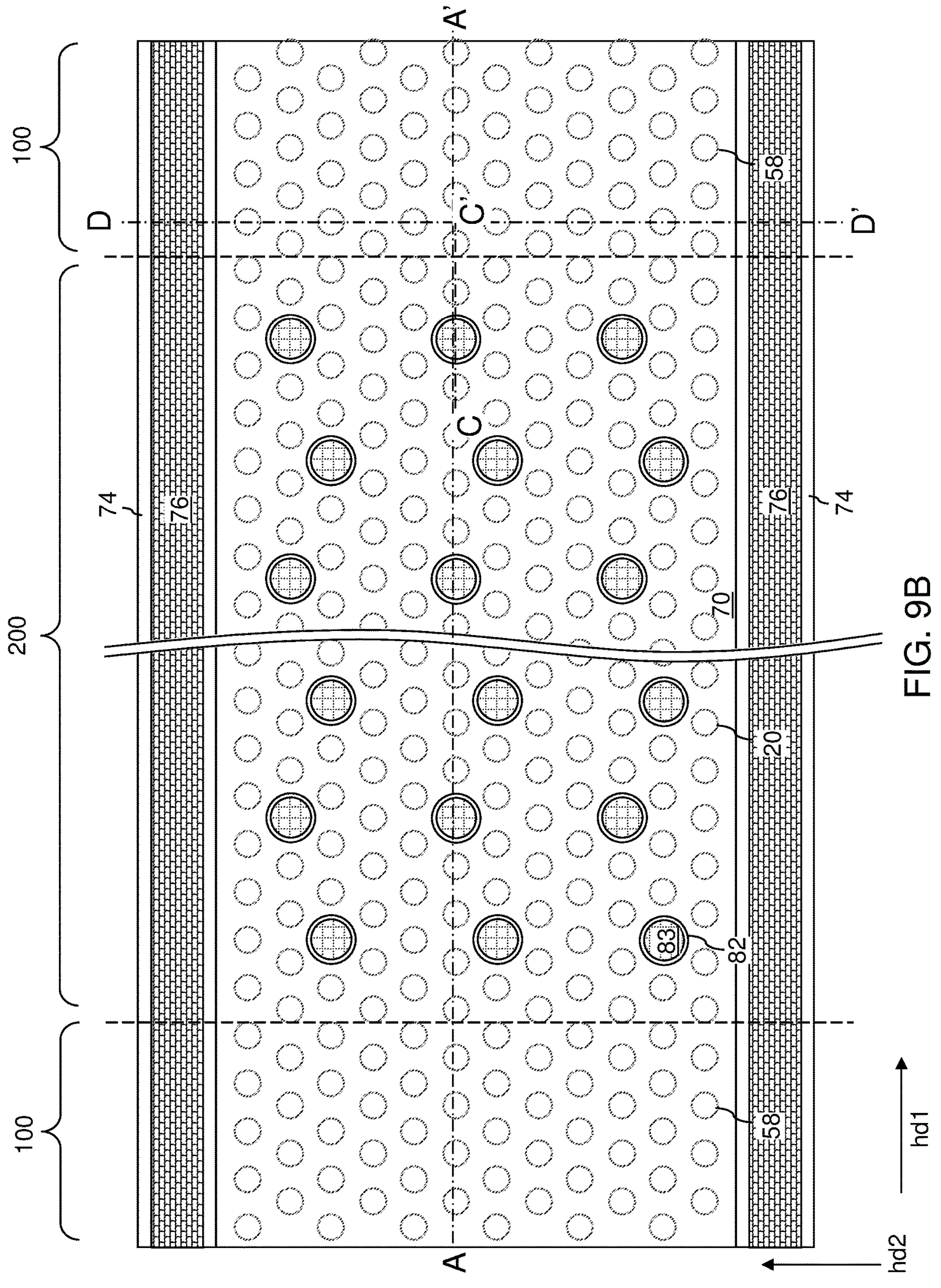
FIG. 9B is a top-down view of the first exemplary structure of FIG. 9A. The vertical plane A-A' is a plane of the vertical cross-sectional view of FIG. 9A.
Figure 9C:
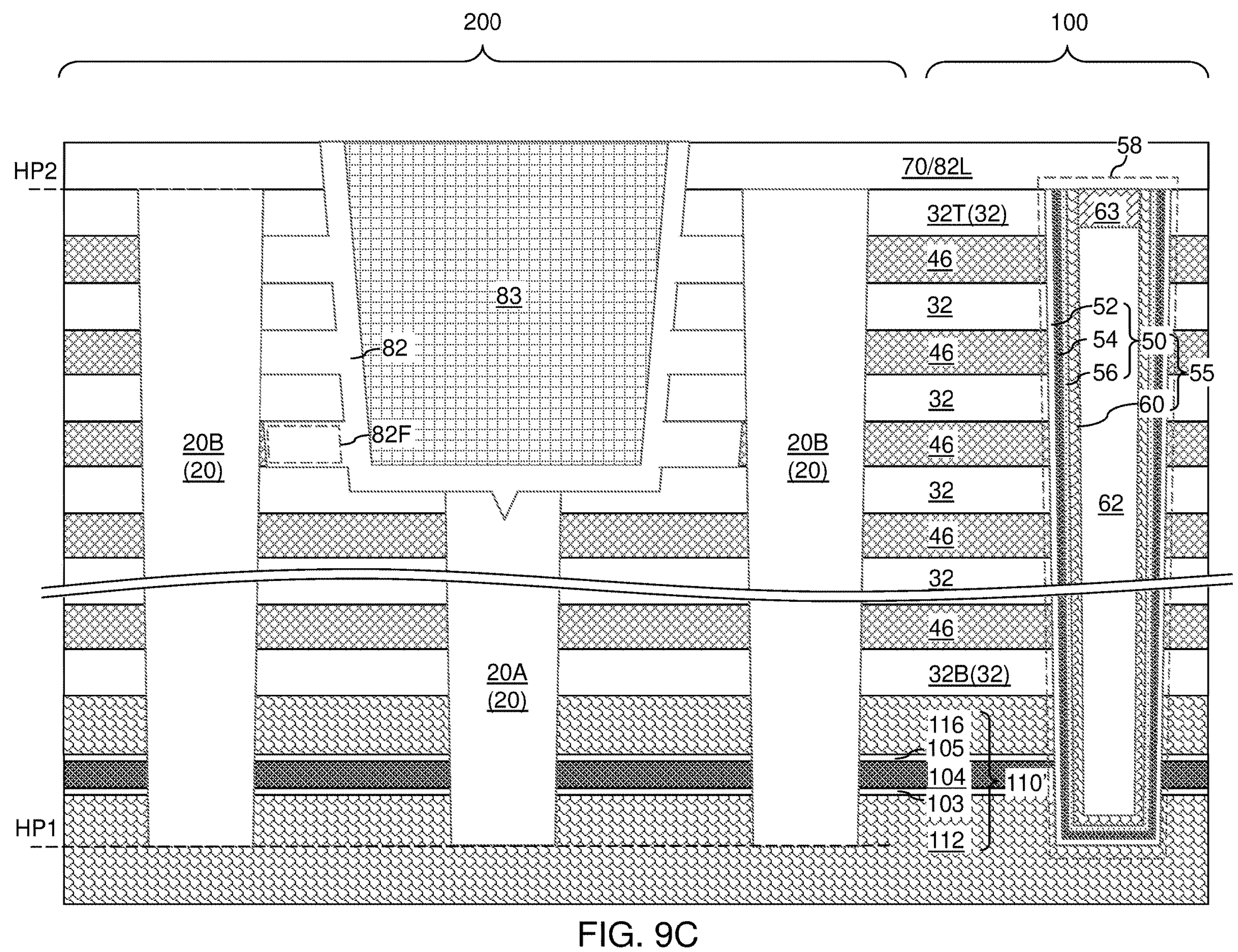
FIG. 9C is a magnified vertical cross-sectional view of the first exemplary structure along the vertical plane C-C' of FIG. 9B.
Figure 9D:
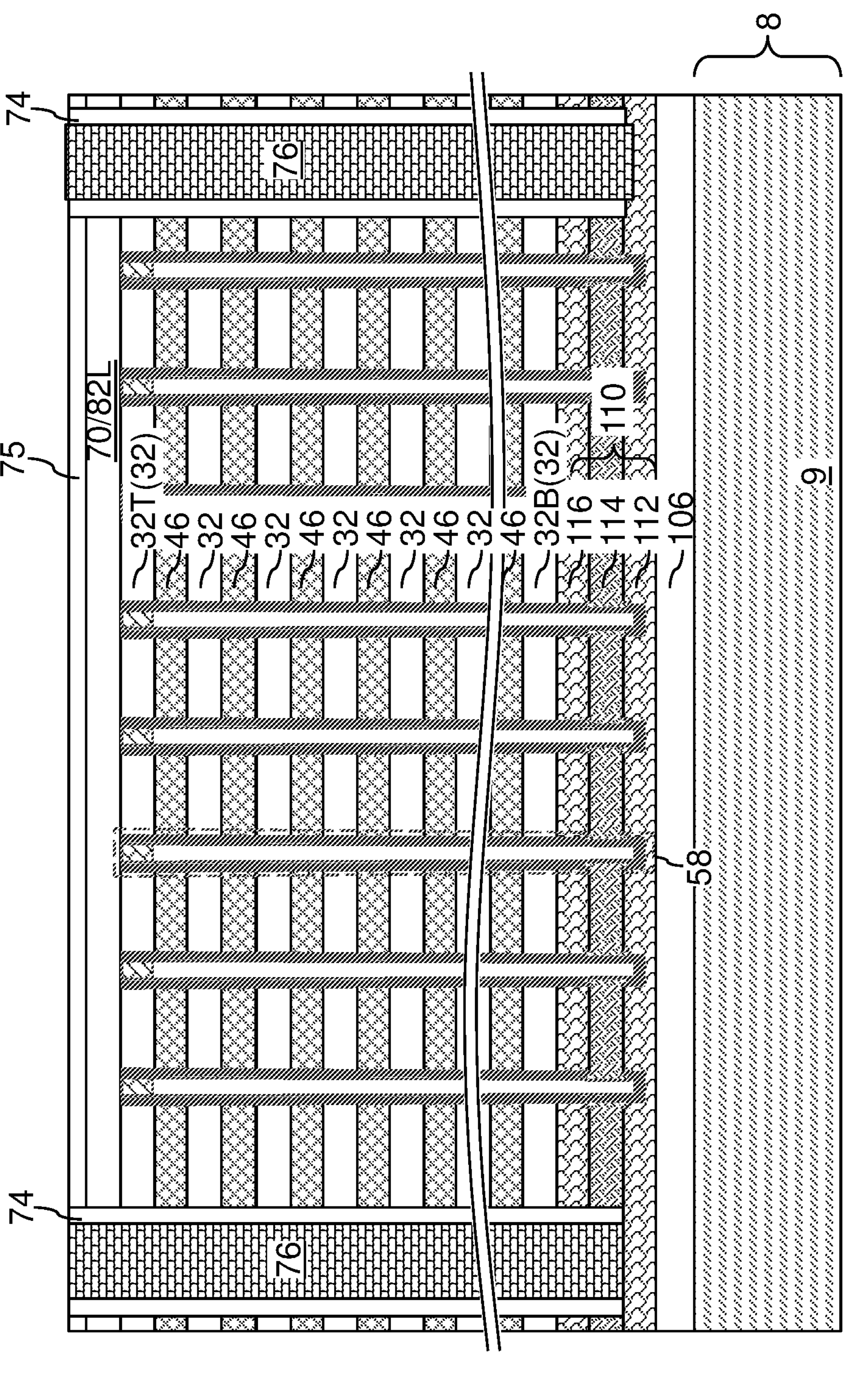
FIG. 9D is a vertical cross-sectional view of the first exemplary structure along the vertical plane D-D' of FIG. 9B.

Referring to FIG. 8D, a backside blocking dielectric layer (not shown) can be optionally formed in the laterally-extending cavities 43 by a conformal deposition process. At least one conductive material, such as at least one metallic material, can be conformally deposited in the laterally-extending cavities 43. The at least one conductive material may comprise, for example, a combination of a metallic barrier material and a metallic fill material. The metallic barrier material may comprise, for example, TiN, TaN, WN, MON, TiC, TaC, WC, or a combination thereof. The metallic fill material may comprise, for example, Ti, Ta, Mo, Co, Ru, W, Cu, other transition metals, and/or alloys or layer stacks thereof. Excess portions of the at least one conductive material that are deposited in the lateral isolation trenches 79 or above the sacrificial capping layer 75 can be removed by performing an etch-back process, which may comprise an isotropic etch process and/or an anisotropic etch process. Each remaining portion of the at least one conductive material filling a respective one of the laterally-extending cavities 43 constitutes an electrically conductive layer 46. An alternating stack of insulating layers 32 and electrically conductive layers 46 can be formed between each neighboring pair of lateral isolation trenches 79 over the substrate 8. A plurality of alternating stacks of insulating layers 32 and electrically conductive layers 46 can be laterally spaced apart among one another by the lateral isolation trenches 79.

Referring to FIGS. 9A-9D, an insulating liner material may be conformally deposited in the lateral isolation trenches 79, and an anisotropic etch process can be performed to remove horizontally-extending portions of the insulating liner material. The anisotropic etch process may be extended to remove the sacrificial capping layer 75 from above the insulating cap layer 70. Each remaining vertically-extending portion of the insulating liner material constitutes an insulating spacer 74, which can have straight inner sidewalls due to the anisotropic etch process.

At least one electrically conductive material, such as at least one metallic material, can be deposited in remaining volumes of the lateral isolation trenches 79. Excess portions of the at least one metallic material can be removed from above the horizontal plane including the top surface of the insulating cap layer 70 by a planarization process such as a chemical mechanical polishing process. Each remaining portion of the at least one electrically conductive material that is located within a respective lateral isolation trench 79 constitutes a conductive wall structure 76, which is a source contact via structure that contacts the lower source-level semiconductor layer 112.

Each contiguous combination of an insulating spacer 74 and a conductive wall structure 76 fills a respective lateral isolation trench, and constitutes an isolation trench fill structure (74, 76). Thus, each isolation trench fill structure (74, 76) comprises an insulating spacer 74 and a conductive wall structure 76, and vertically extends at least from a horizontal plane including a topmost surface of the alternating stack (32, 42) to a semiconductor material layer (which may be, for example, the lower source-level semiconductor layer 112).

Figure 10A:
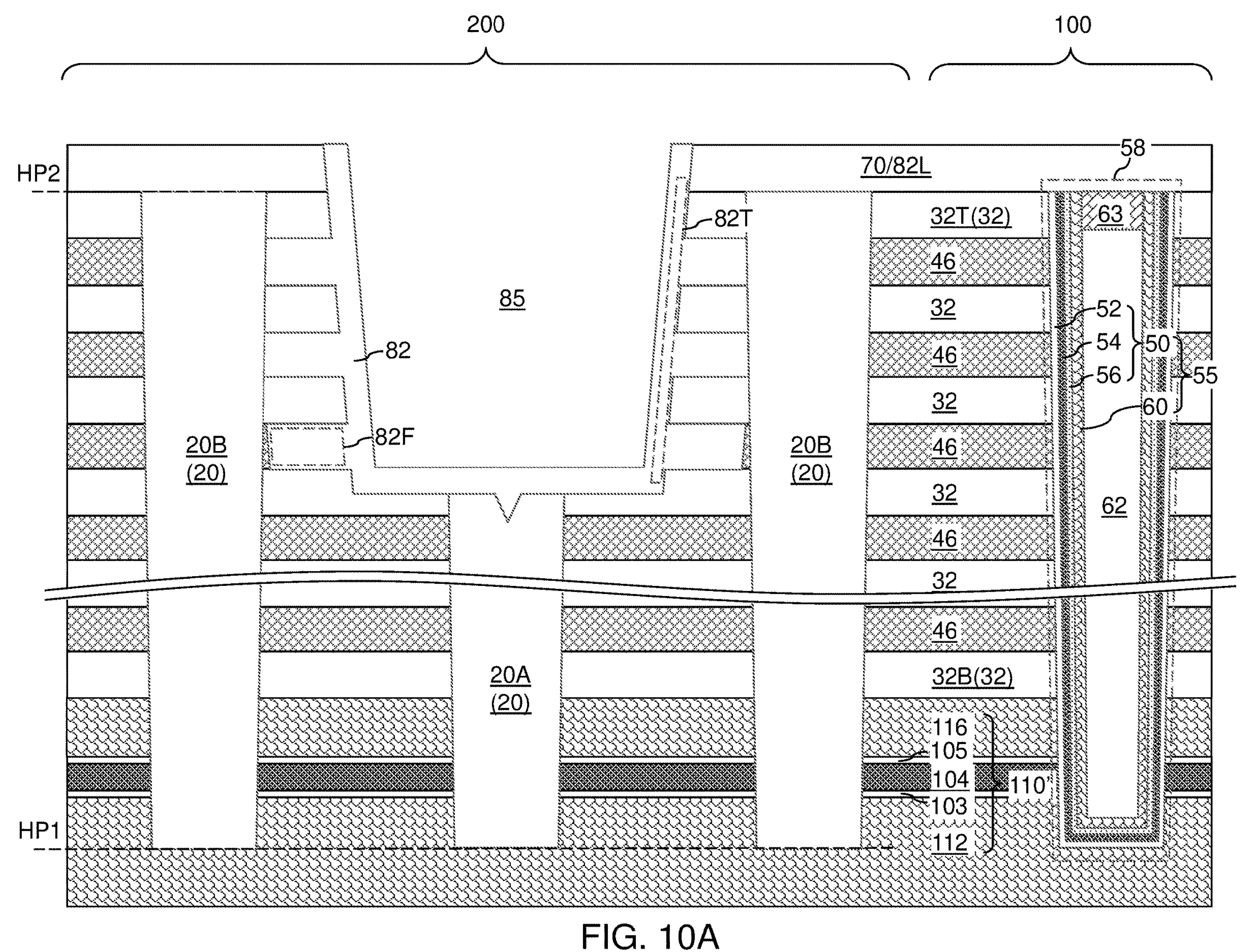
FIGS. 10A and 10B are sequential vertical cross-sectional views of a region of the first exemplary structure during removal of the sacrificial via fill material portions and anisotropic etching of the finned insulating spacers 82 according to the first embodiment of the present disclosure.
Figure 10B:
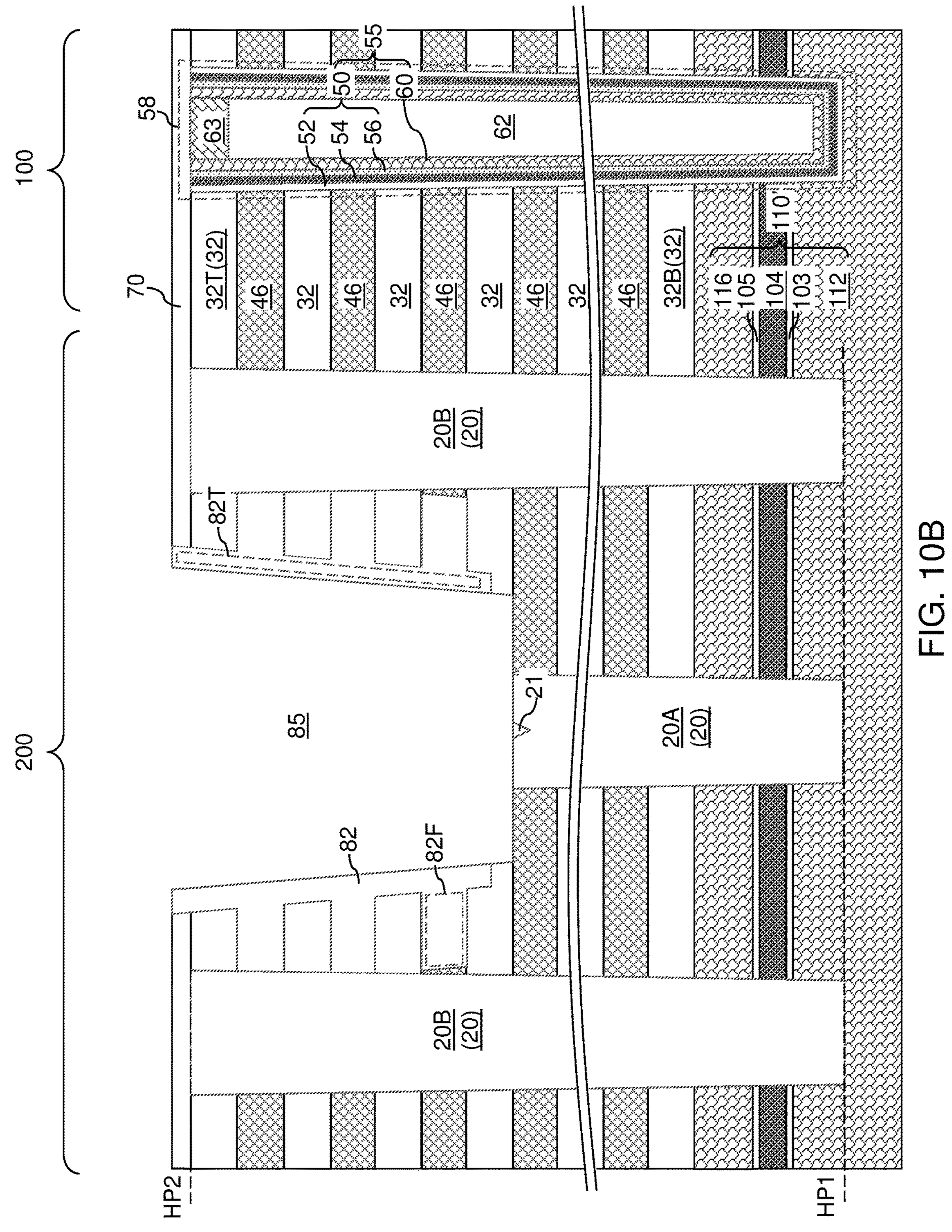
Figure 11A:
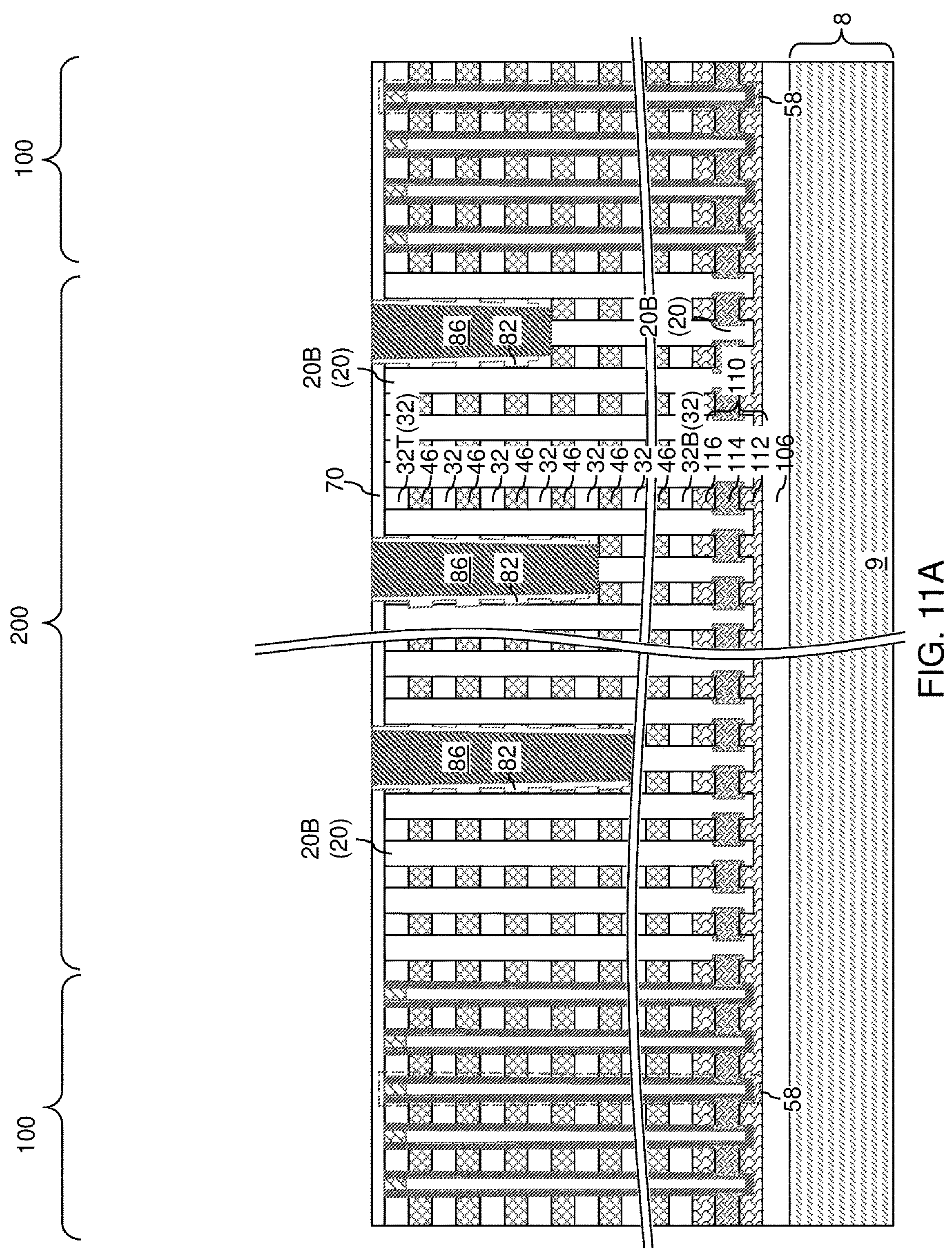
FIG. 11A is a vertical cross-sectional view of the first exemplary structure after formation of layer contact via structures according to the first embodiment of the present disclosure.
Figure 11B:
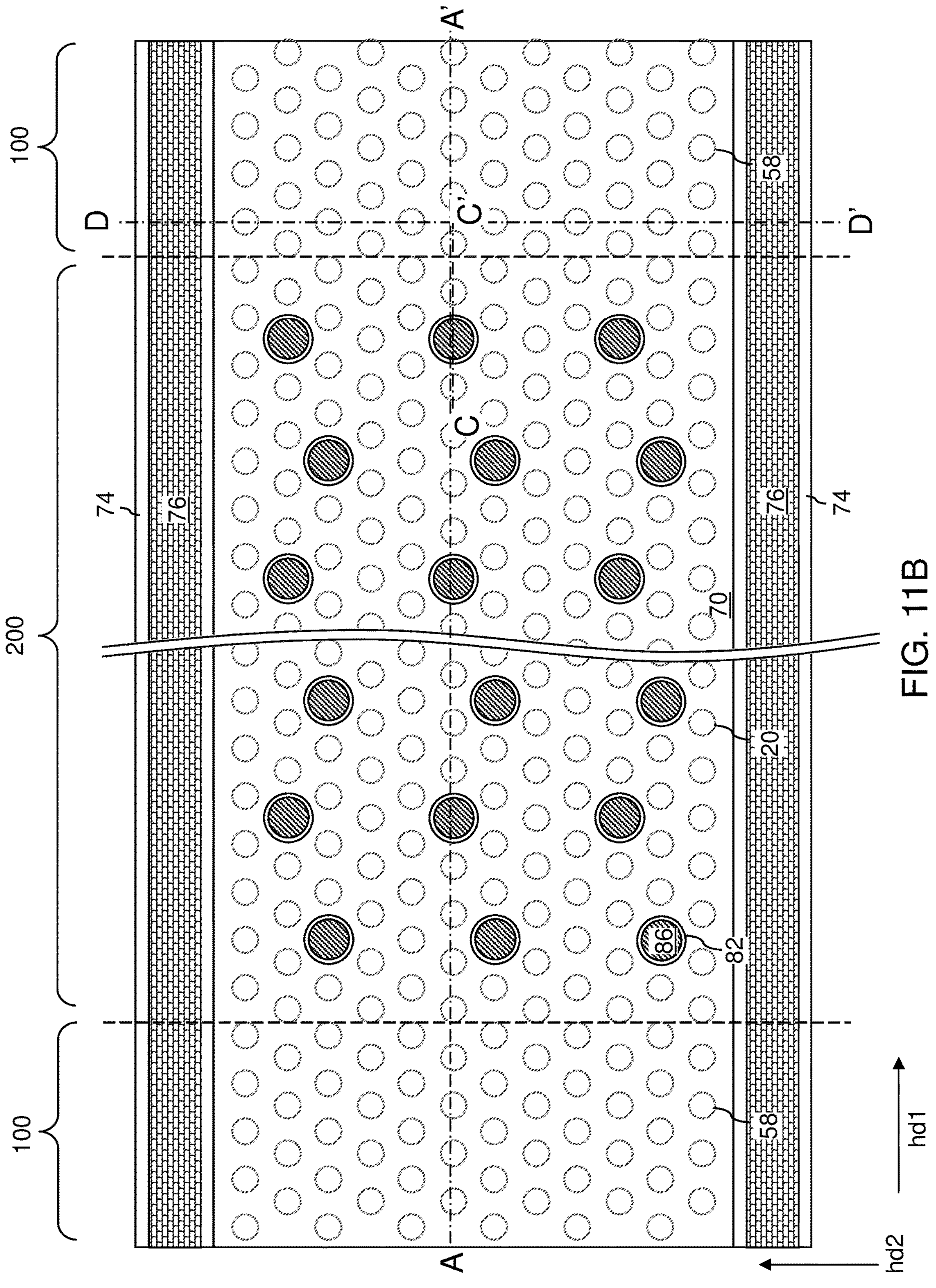
FIG. 11B is a top-down view of the first exemplary structure of FIG. 11A. The vertical plane A-A' is a plane of the vertical cross-sectional view of FIG. 11A.
Figure 11C:
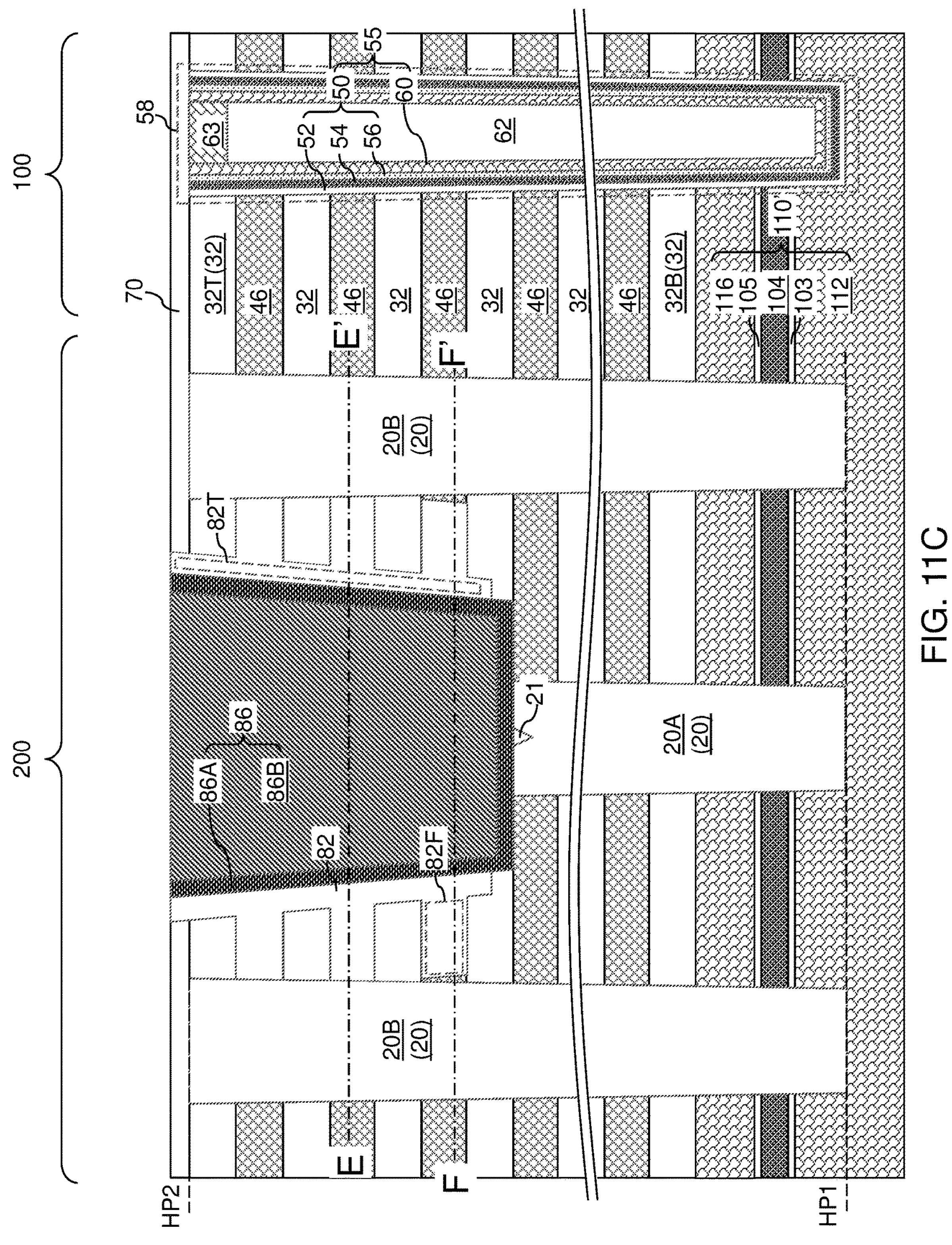
FIG. 11C is a magnified vertical cross-sectional view of the first exemplary structure along the vertical plane C-C' of FIG. 11B.
Figure 11D:
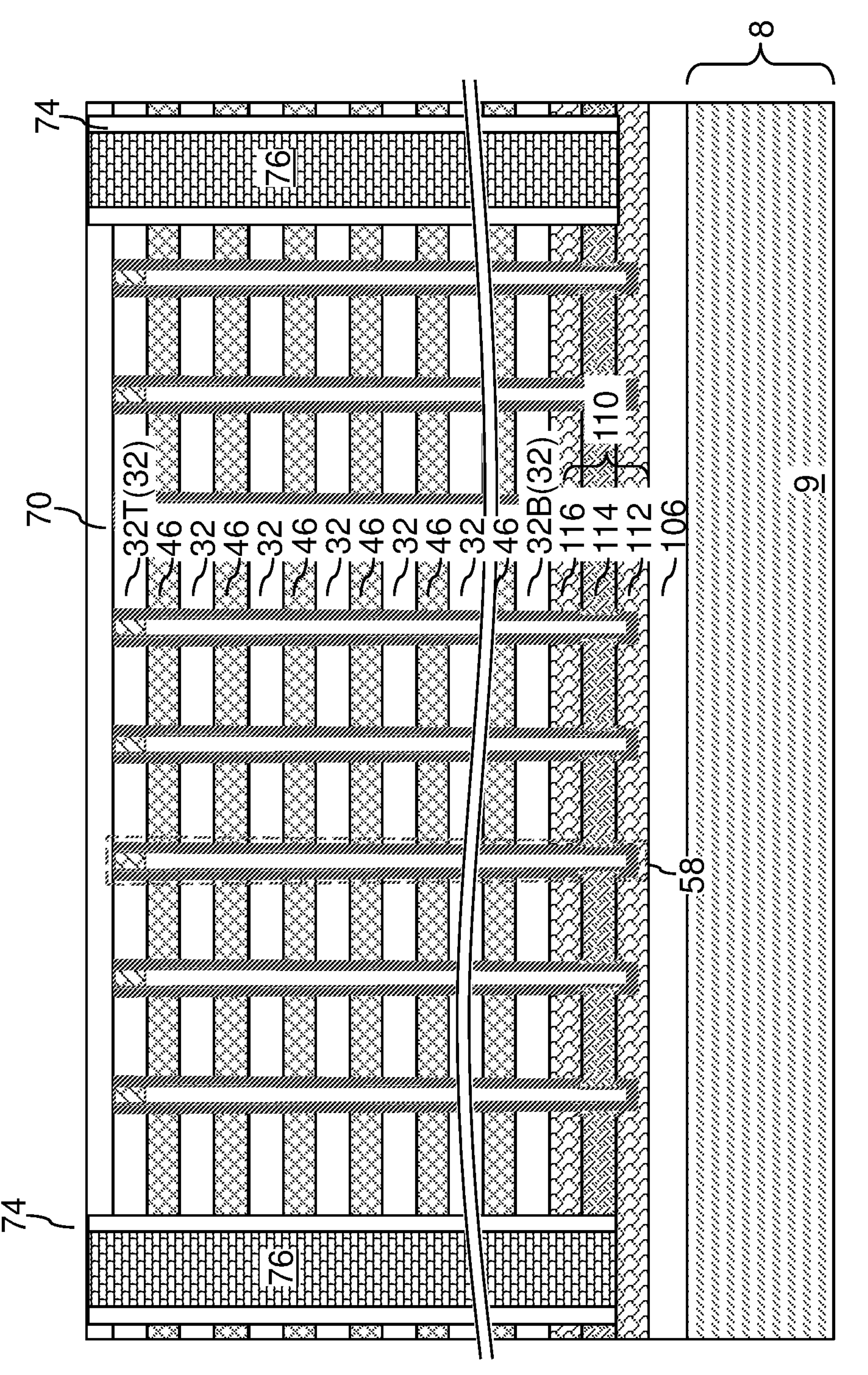
FIG. 11D is vertical cross-sectional view of the first exemplary structure along the vertical plane C-C' of FIG. 11B.
Figure 11E:
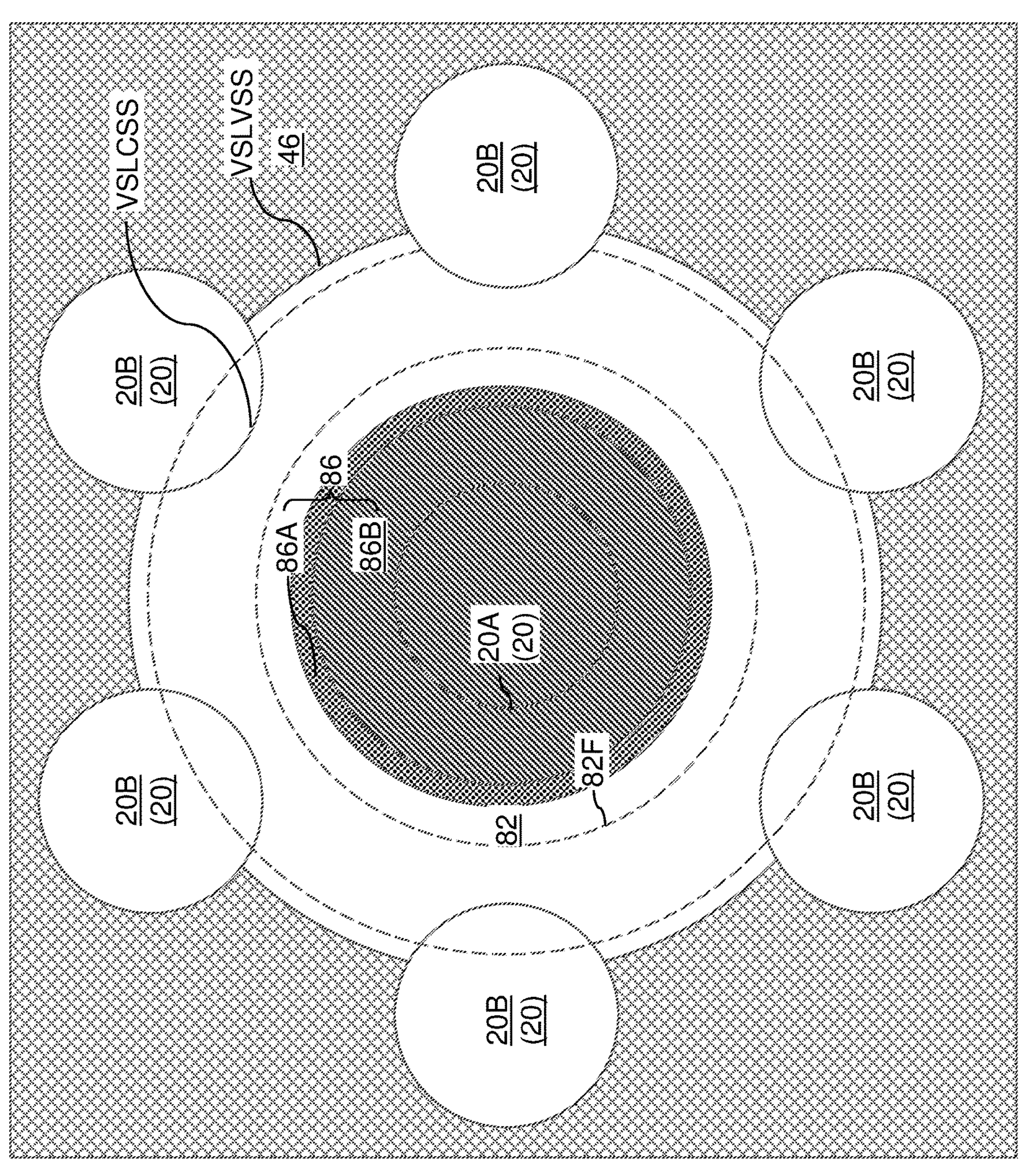
FIG. 11E is a horizontal cross-sectional view of a region of the first exemplary structure along the horizontal plane E-E' of FIG. 11C.
Figure 11F:
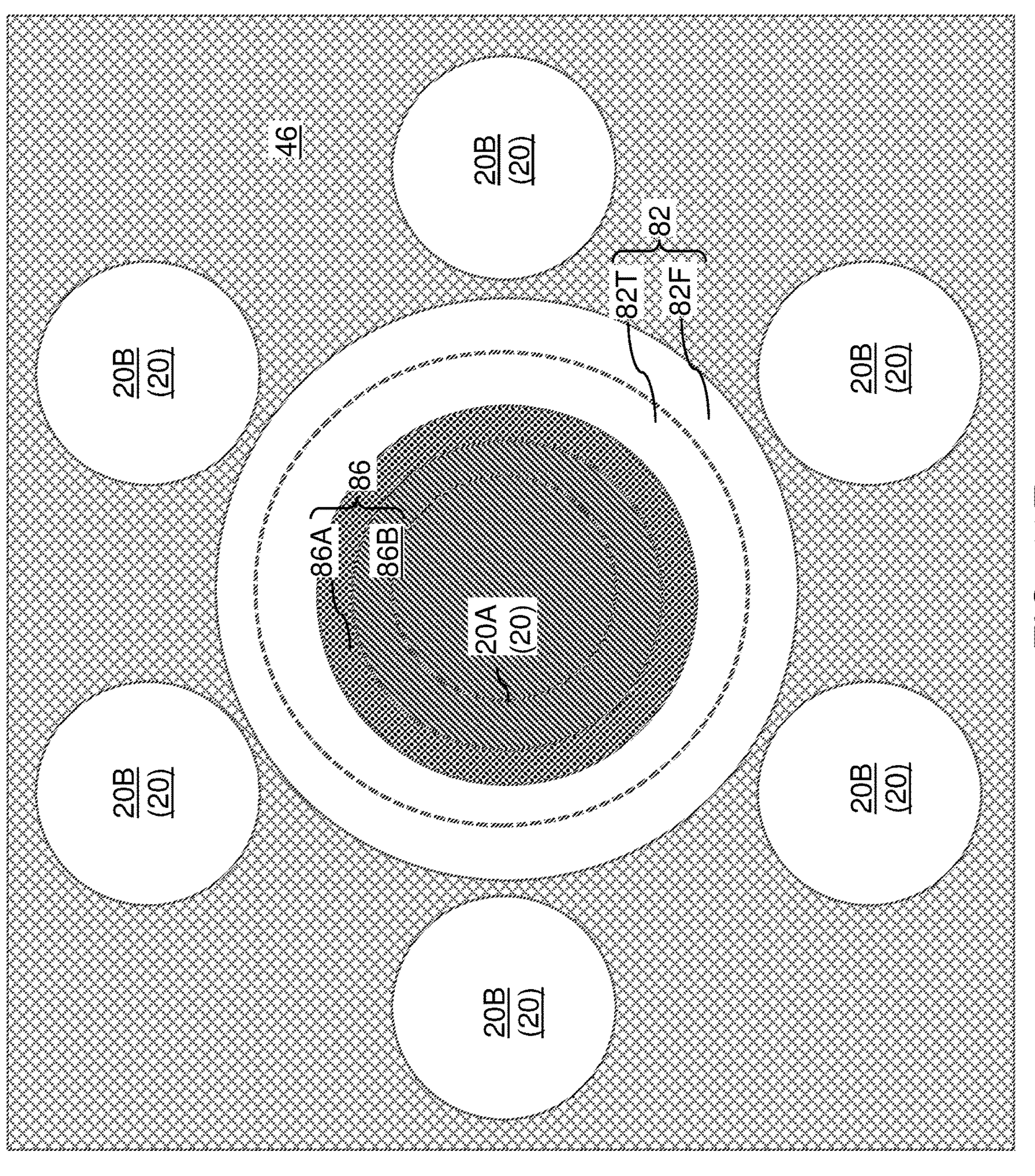
FIG. 11F is a horizontal cross-sectional view of a region of the first exemplary structure along the horizontal plane F-F' of FIG. 11C.

FIGS. 10A and 10B are sequential vertical cross-sectional views of a region of the first exemplary structure during removal of the sacrificial via fill material portions 83 and anisotropic etching of the finned insulating spacers according to an embodiment of the present disclosure.

Referring to FIG. 10A, the sacrificial via fill material portions 83 can be removed selective to the materials of the insulating cap layer 70 and the finned insulating spacers 82. For example, a selective etch process or an ashing process (if the sacrificial via fill material portions 83 comprise a carbon material) may be employed to remove the sacrificial via fill material portions 83. If a selective etch process is employed, the selective etch process may comprise an isotropic etch process or an anisotropic etch process. A via cavity 85 is formed in each volume from which a sacrificial via fill material portion 83 is removed.

Referring to FIG. 10B, an anisotropic etch process can be subsequently performed to remove horizontally-extending bottom portions of the finned insulating spacers 82 that underlie a respective via cavity 85. A bottom opening is formed through each finned insulating spacer 82. The anisotropic etch process can be continued to remove underlying portions of first-type dielectric pillar structures 20A and insulating layers 32 until an annular top surface segment of an electrically conductive layer 46 is physically exposed at the bottom of each via cavity 85. If the optional backside blocking dielectric layer (not shown) is formed in the laterally-extending cavity 43 over the exposed electrically conductive layer 46, then it is also removed at this step. Each remaining portion of the material of the finned insulating spacers 82 that fills a respective divot in a top surface of a respective first-type dielectric pillar structure 20A constitutes an insulating divot fill material portion 21. Recessed top surfaces of the first-type dielectric pillar structures 20A underlying a via cavity 85 may be substantially coplanar with an annular top surface segment of a respective electrically conductive layer 46 that is exposed to the via cavity 85. An upper portion of the insulating cap layer 70 may be collaterally removed during the anisotropic etch process, and thus, the insulating cap layer 70 may be thinned by the anisotropic etch process. In one embodiment, if potions of the insulating liner layer 82L remain above the horizontal plane including the top surface of the insulating cap layer 70 after the planarization step shown in FIGS. 6A-6C, then the excess potions of the insulating liner layer 82L are collaterally removed together with the upper portion of the insulating cap layer 70 to form the finned insulating spacers 82 described above.

In summary, at least one of the finned insulating spacers 82 may comprise a vertically-extending tubular portion 82T and a vertical stack of insulating fins 82F that laterally extend outward from the vertically-extending tubular portion 82T at a peripheral region of a volume of a respective finned contact via cavity 87 as formed at the processing steps described with reference to FIG. 5A. The vertically-extending tubular portion 82T may be laterally spaced from the second-type dielectric pillar structures 20B, and may comprise a plurality of cylindrical surface segments that contact a respective one of the insulating layers 32.

In one embodiment, at least one of the first-type dielectric pillar structures 20A may comprises a respective top surface containing a divot therein. The divot may be filled with an insulating divot fill material portion 21 having a same material composition as the finned insulating spacers 82.

Referring to FIGS. 11A-11F, at least one conductive material can be deposited in the via cavities 85. The at least one conductive material may comprise a metallic barrier material and a metallic fill material. The metallic barrier material may comprise a metallic nitride material such as TiN, TaN, and/or WN and/or a metallic carbide material such as TiC. TaC, and/or WC. The metallic fill material may comprise W, Ti, Ta, Ru, Co, Mo, Cu, etc. The at least one conductive material may be deposited by chemical vapor deposition, physical vapor deposition, electroplating, electroless plating, or combinations thereof. Excess portions of the at least one conductive material can be removed from above the horizontal plane including the top surface of the insulating cap layer 70 by performing a planarization process, which may employ a chemical mechanical polishing (CMP) process or a recess etch process. Each remaining portion of the at least one conductive material filling a respective via cavity 85 constitutes a layer contact via structure 86 that contacts top surface a respective electrically conductive layer 46. Each layer contact via structure 86 may be laterally surrounded by a respective finned insulating spacer 82. Each combination of a layer contact via structure 86 and a respective finned insulating spacer 82 comprises a layer contact assembly (82, 86). In one embodiment, top surfaces of the layer contact via structures 86 may be formed within the horizontal plane including the top surface of the insulating cap layer 70.

Thus, the sacrificial via fill material portions 83 can be replaced with the layer contact via structures 86 to form the layer contact assemblies (82, 86). Each of the layer contact assemblies (82, 86) comprises a respective layer contact via structure 86 contacting a respective one of the electrically conductive layers 46 and further comprises a respective finned insulating spacer 82 that laterally surrounds the respective layer contact via structure 86. An array of layer contact assemblies (82, 86) can be formed within contact region 200. The array of layer contact assemblies (82, 86) contains an array of layer contact via structures 86.

In summary, a layer contact via structure (e.g., word line contact via structure) 86 is formed within a volume that is laterally surrounded by the finned insulating spacer 82 on a first electrically conductive layer (e.g., first word line) 46 of the electrically conductive layers 46. The layer contact via structure 86 contacts an annular top surface segment of the first electrically conductive layer 46, which is the topmost layer within a first subset of the electrically conductive layers 46 that includes the first electrically conductive layer 46 and all electrically conductive layers 46 underlying the first electrically conductive layer 46. The layer contact via structure 86 vertically extends through a second subset of the electrically conductive layers 46 that overlies the first subset and includes all electrically conductive layers 46 overlying the first electrically conductive layer 46.

In one embodiment, a top surface of the layer contact via structure 86 and an annular top surface of the finned insulating spacer 82 are located above a horizontal plane including top surfaces of the second-type dielectric pillar structures 20B, and may be located above the horizontal plane including the topmost surface of the alternating stack (32, 46). In one embodiment, a bottommost surface of the finned insulating spacer 82 may be vertically spaced from the top surface of the first electrically conductive layer 46 by a portion of one of the insulating layers 32. In one embodiment, a bottom surface of the layer contact via structure 86 contacts an annular horizontal surface segment of the first electrically conductive layer 46, a top surface of a first-type dielectric pillar structure 20A, and optionally an insulating divot fill material portion 21. In one embodiment, the first-type dielectric pillar structure 20A comprises a top surface containing a divot therein; and the divot is filled with an insulating divot fill material portion 21 that contacts a center potion of a bottom surface of the layer contact via structure 86.

Figure 12A:
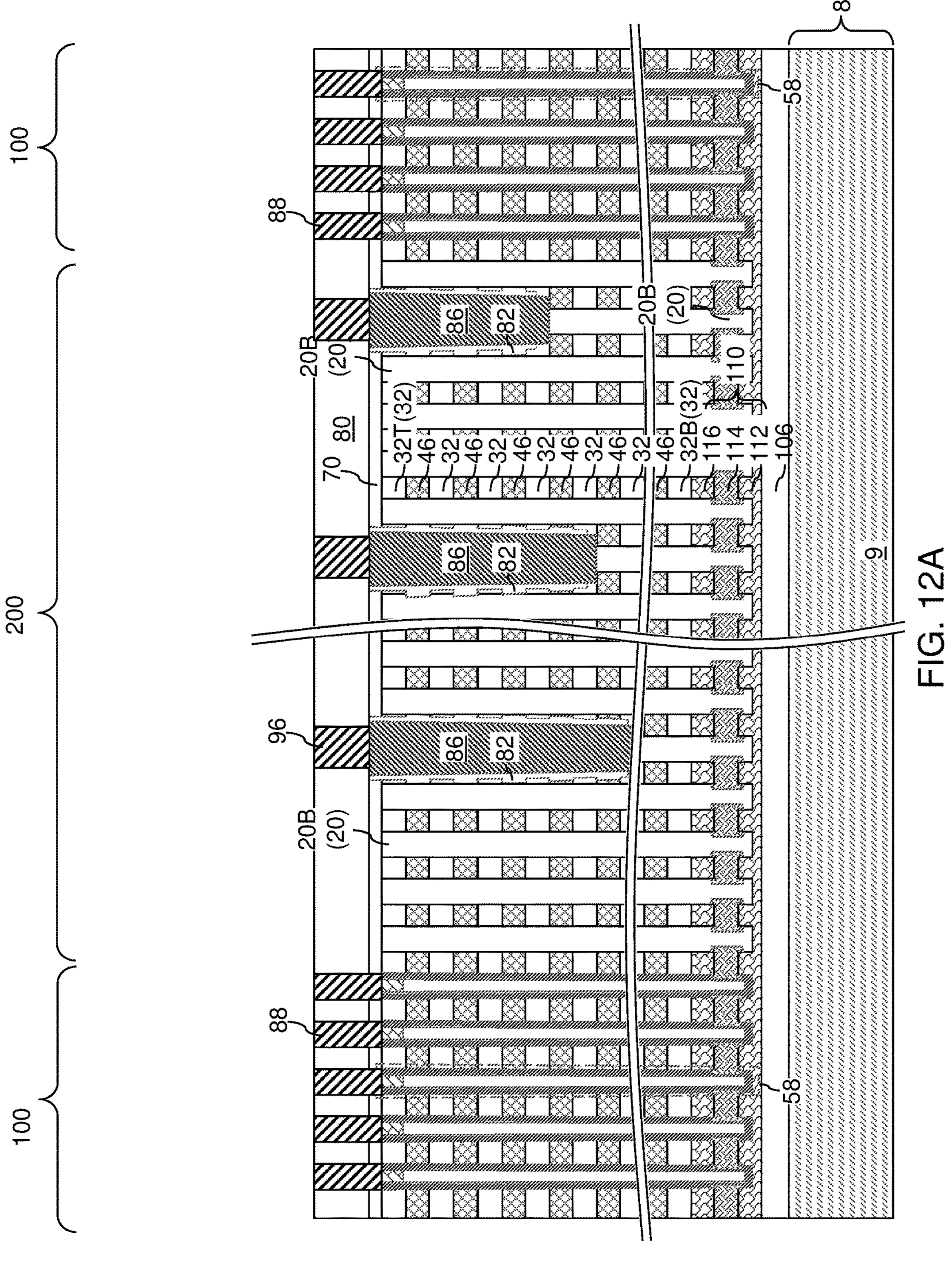
FIG. 12A is a vertical cross-sectional view of the first exemplary structure after formation of additional contact via structures according to the first embodiment of the present disclosure.
Figure 12B:
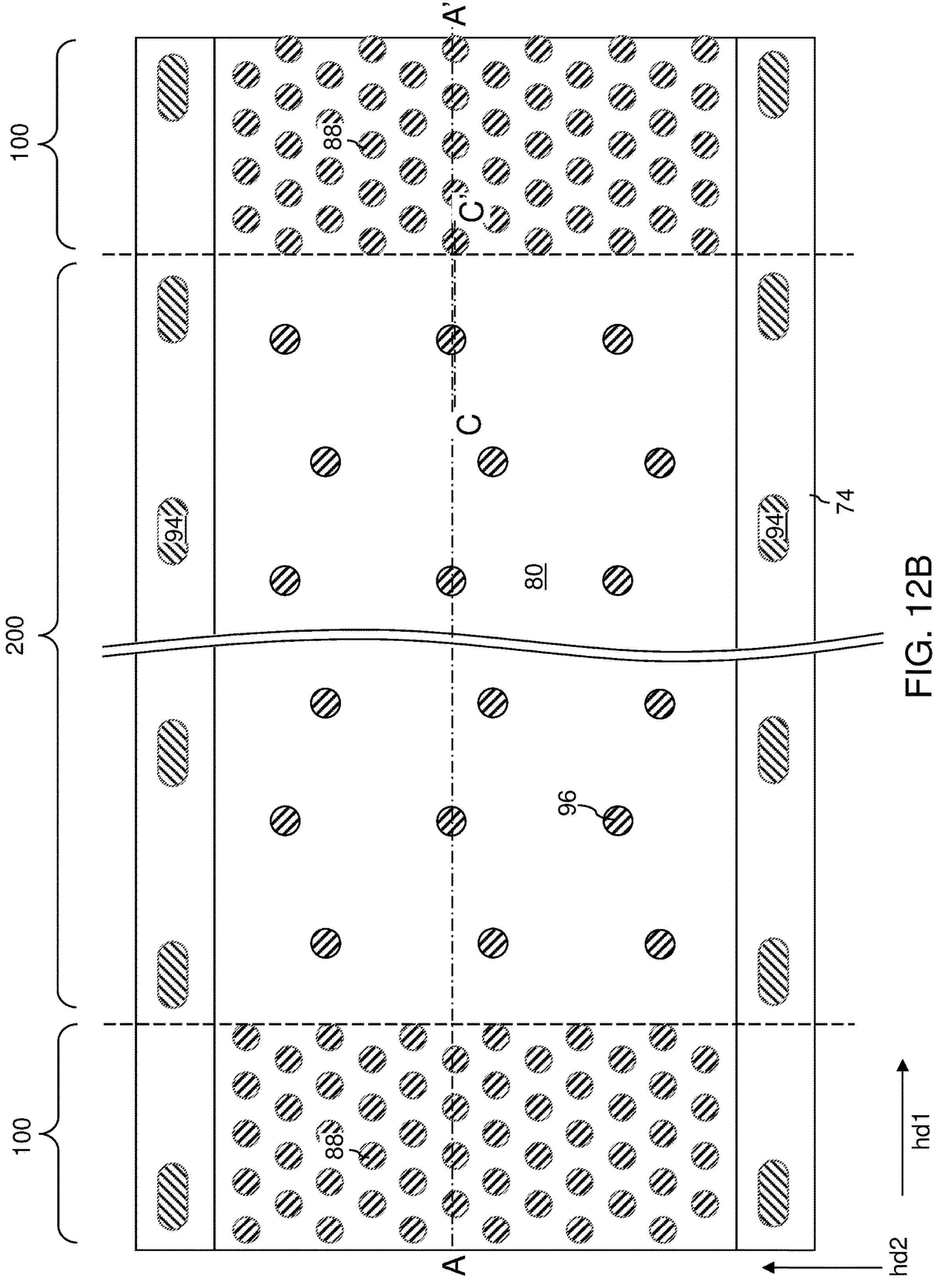
FIG. 12B is a top-down view of the first exemplary structure of FIG. 12A. The vertical plane A-A' is a plane of the vertical cross-sectional view of FIG. 12A.
Figure 12C:
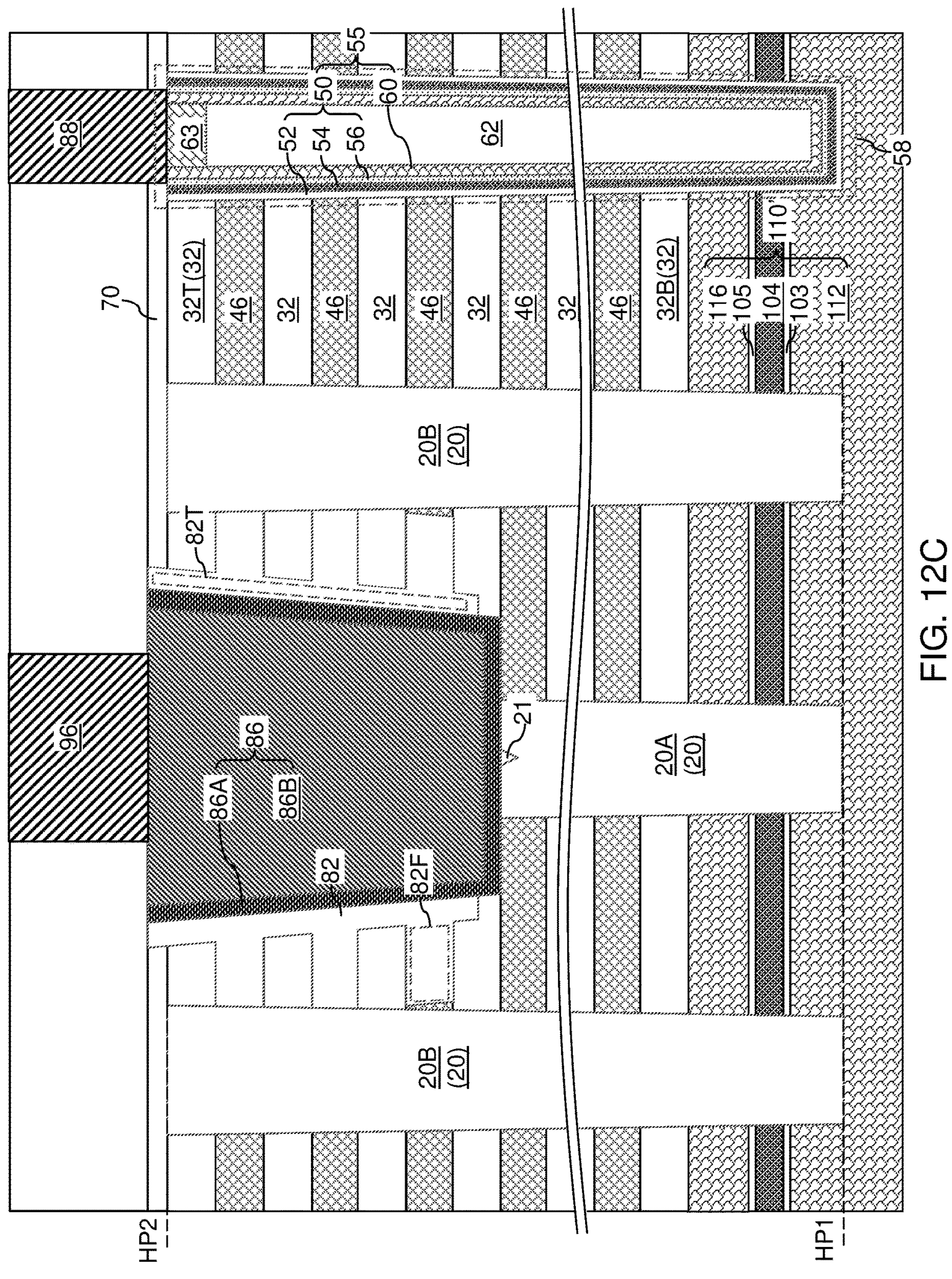
FIG. 12C is a magnified vertical cross-sectional view of the first exemplary structure along the vertical plane C-C' of FIG. 12B.

Referring to FIGS. 12A-12C, a contact-level dielectric layer 80 can be formed above the insulating cap layer 70. The contact-level dielectric layer 80 comprises a dielectric material such as undoped silicate glass or a doped silicate glass, and may have a thickness in a range from 100 nm to 800 nm, such as from 200 nm to 500 nm, although lesser and greater thicknesses may also be employed.

A photoresist layer (not shown) can be applied over the contact-level dielectric layer 80, and can be lithographically patterned to form openings over each of the memory opening fill structures 58 and over the layer contact via structures

86. An anisotropic etch process can be performed to transfer the pattern of the openings in the photoresist layer through the contact-level dielectric layer 80. Drain contact via cavities can be formed through the contact-level dielectric layer 80 over the memory opening fill structures 58. Connection via cavities can be formed through the contact-level dielectric layer 80 over the layer contact via structures 86. The photoresist layer can be subsequently removed, for example, by ashing.

At least one conductive material, such as a combination of a metallic barrier material and a metallic fill material, can be deposited in the drain contact via cavities and the layer contact via cavities. Excess portions of the at least one conductive material can be removed from above the horizontal plane including the top surface of the contact-level dielectric layer 80 by a planarization process, which may employ a recess etch process and/or a chemical mechanical polishing process. Remaining portions of the at least one conductive material that fill the drain contact via cavities constitute drain contact via structures 88 contacting a top surface of a respective one of the drain regions 63. Remaining portions of the at least one conductive material that fill the connection via cavities constitute connection via structures 96 contacting a top surface of a respective one of the layer contact via structures 86.

FIGS. 13A-13H are sequential vertical cross-sectional views of a region of a second exemplary structure during various processing steps according to a second embodiment of the present disclosure.

Figure 13A:
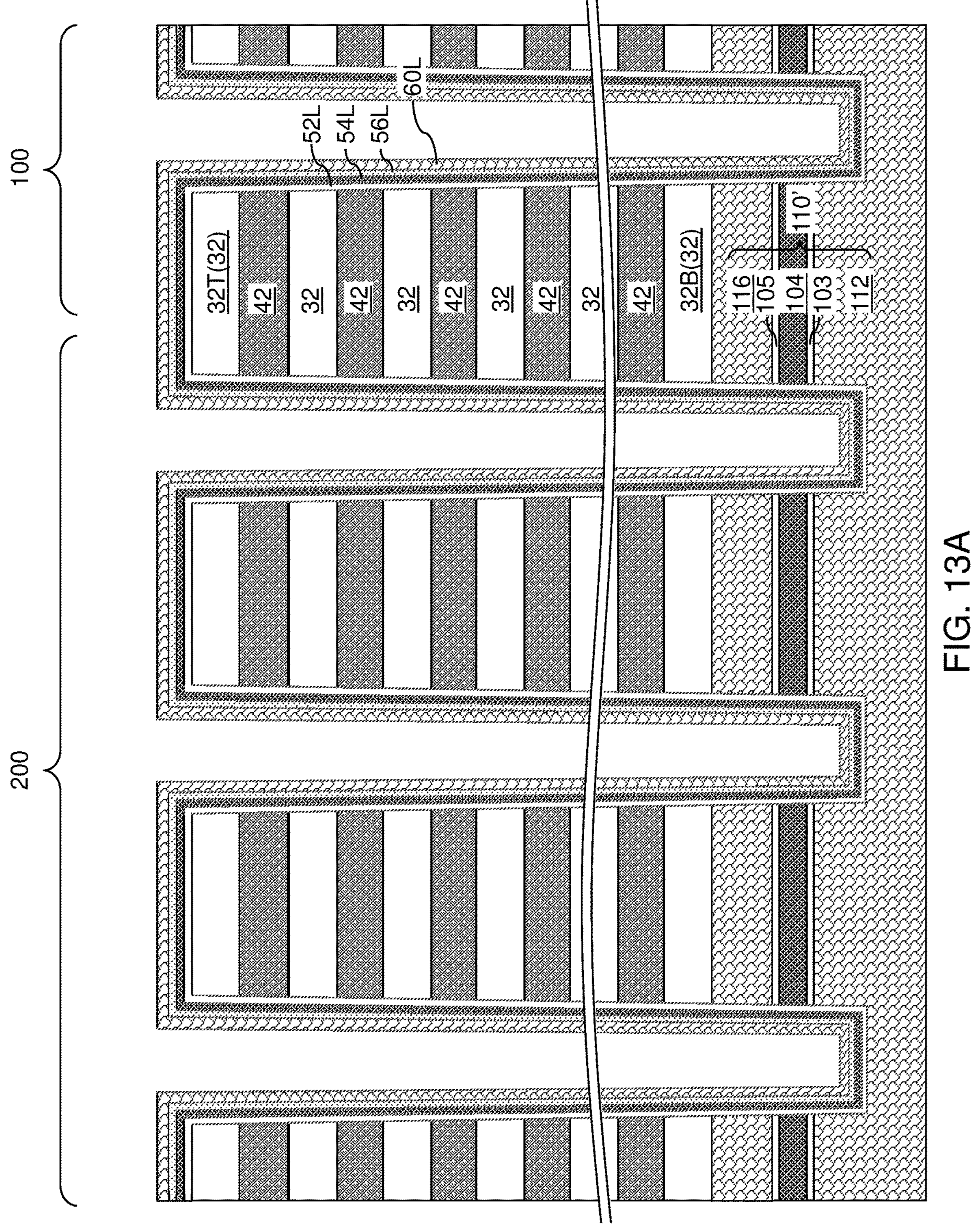
FIGS. 13A-13H are sequential vertical cross-sectional views of a region of a second exemplary structure during various processing steps according to a second embodiment of the present disclosure.

Referring to FIG. 13A, the second exemplary structure can be derived from the first exemplary structure illustrated in FIGS. 2A-2C by depositing a layer stack (52L, 54L, 56L, 60L) including a continuous blocking dielectric layer 52L, a continuous memory material layer 54L, a continuous tunneling dielectric layer 56L, and a continuous semiconductor channel material layer 60L in the memory openings 49 and in the support openings 19. The layer stack (52L, 54L, 56L, 60L) of the second exemplary structure may be the same as the layer stack of continuous blocking dielectric layer, a continuous memory material layer, a continuous memory material layer, and a continuous semiconductor channel material layer described with reference to FIG. 3E.

Figure 13B:
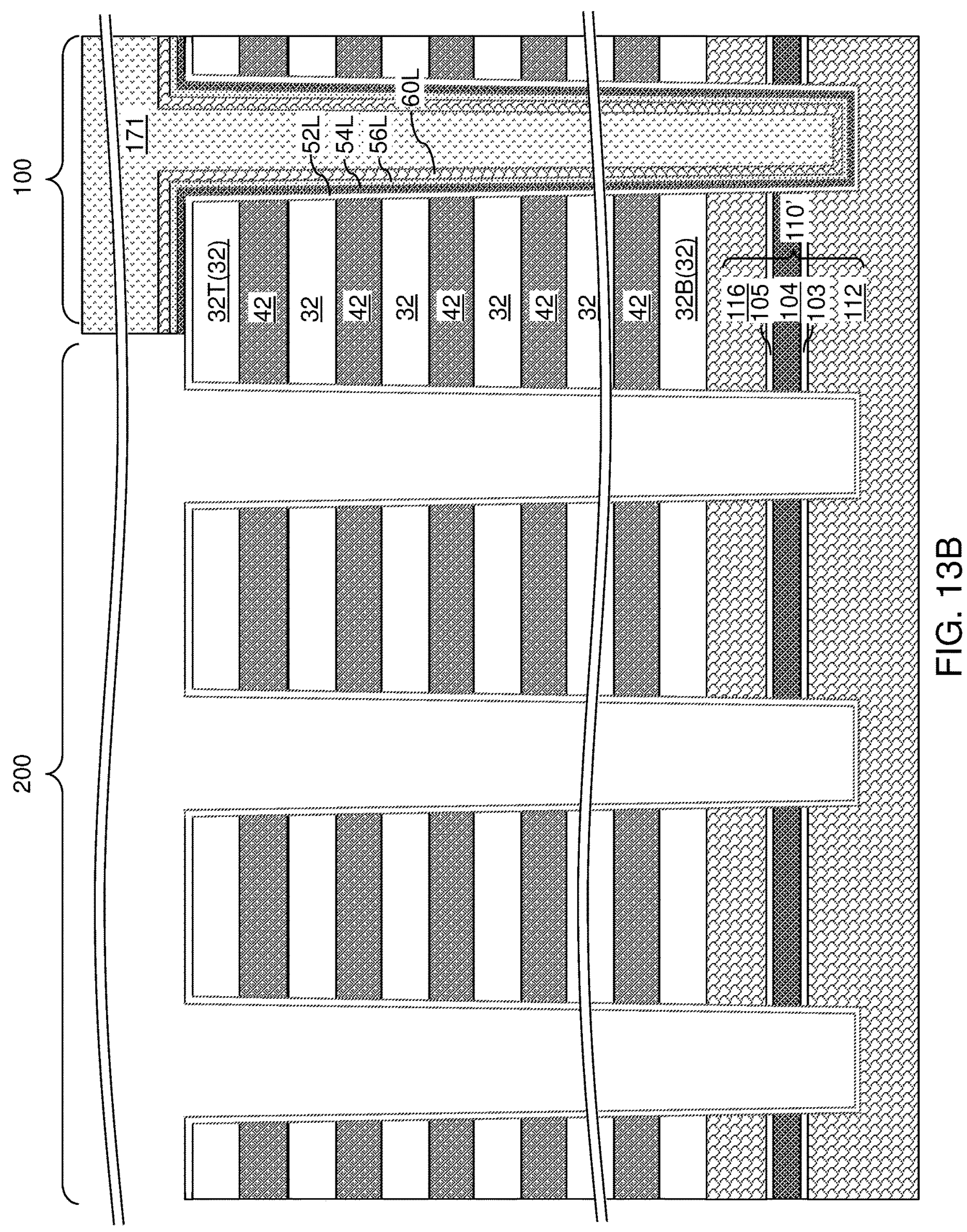

Referring to FIG. 13B, a first photoresist layer 171 can be applied and lithographically patterned to cover the memory array regions 100 without covering the contact region 200. A sequence of etch processes can be performed to remove unmasked portions of the continuous semiconductor channel material layer 60L, the continuous tunneling dielectric layer 56L, and the continuous memory material layer 54L without etching the continuous blocking dielectric layer 52L. The sequence of etch processes may comprise a sequence of wet etch processes. Removal of the unmasked portions of the continuous memory material layer 54L may be performed selective to the material of the continuous blocking dielectric layer 52L. In an illustrative example, if the continuous memory material layer 54L comprises silicon nitride and if the continuous blocking dielectric layer 52L comprises silicon oxide, a wet etch process employing hot phosphoric acid may be performed to remove the continuous memory material layer 54L selective to the continuous blocking dielectric layer 52L.

Thus, portions of the continuous semiconductor channel material layer 60L can be removed from inside the support openings 19 without removing the continuous semiconductor channel material layer 60L from inside the memory opening 49. Further, portions of the continuous tunneling dielectric layer 56L and the continuous memory material layer 54L can be removed from inside the support openings 19 without removing the continuous tunneling dielectric layer 56L or the continuous memory material layer 54L from inside the memory openings 49. The first photoresist layer 171 can be subsequently removed, for example, by ashing.

Figure 13C:
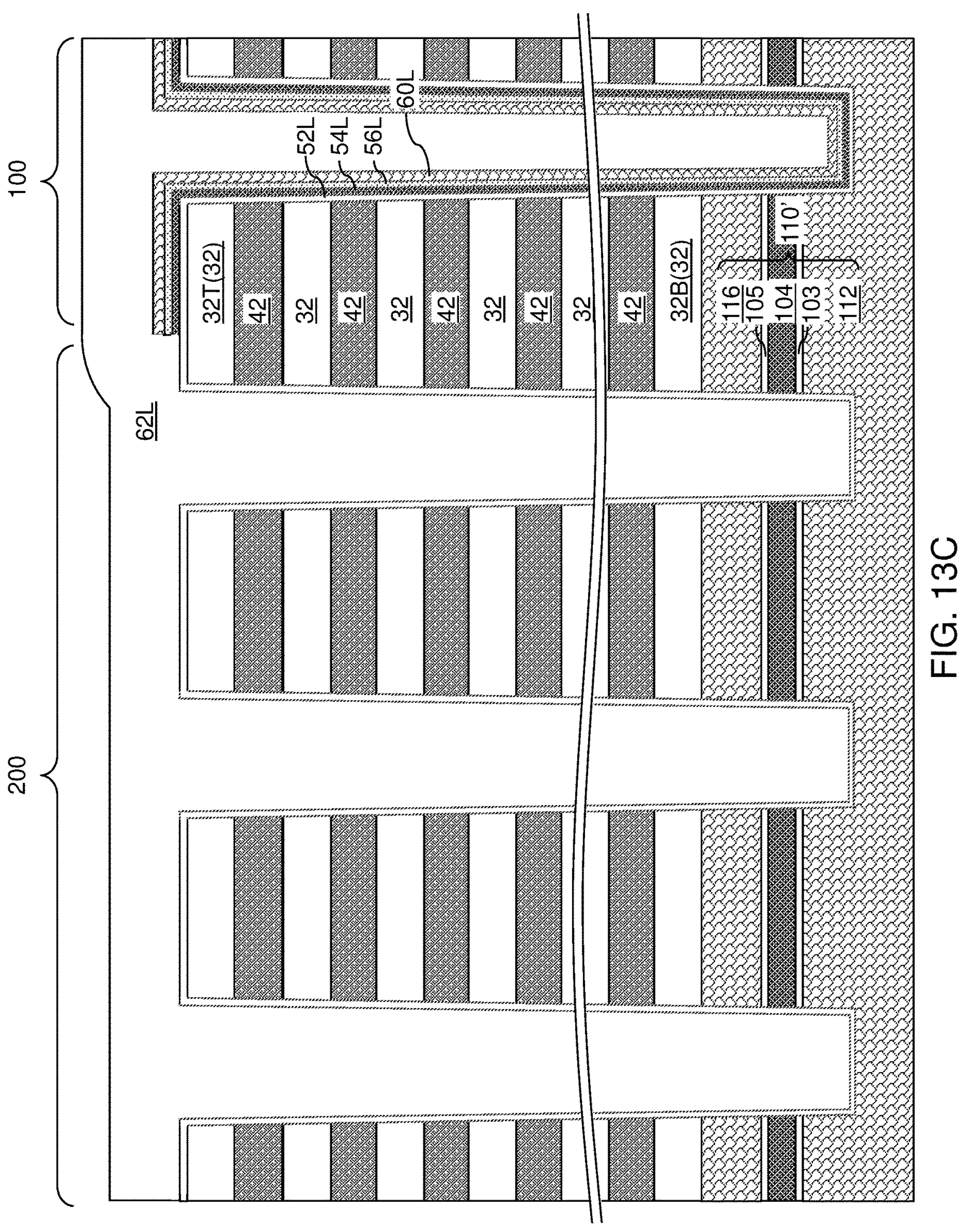

Referring to FIG. 13C, a dielectric core material layer 62L comprising a dielectric fill material, such as silicon oxide, is conformally deposited to fill voids within the memory openings 49 and the support openings 19.

Figure 13D:
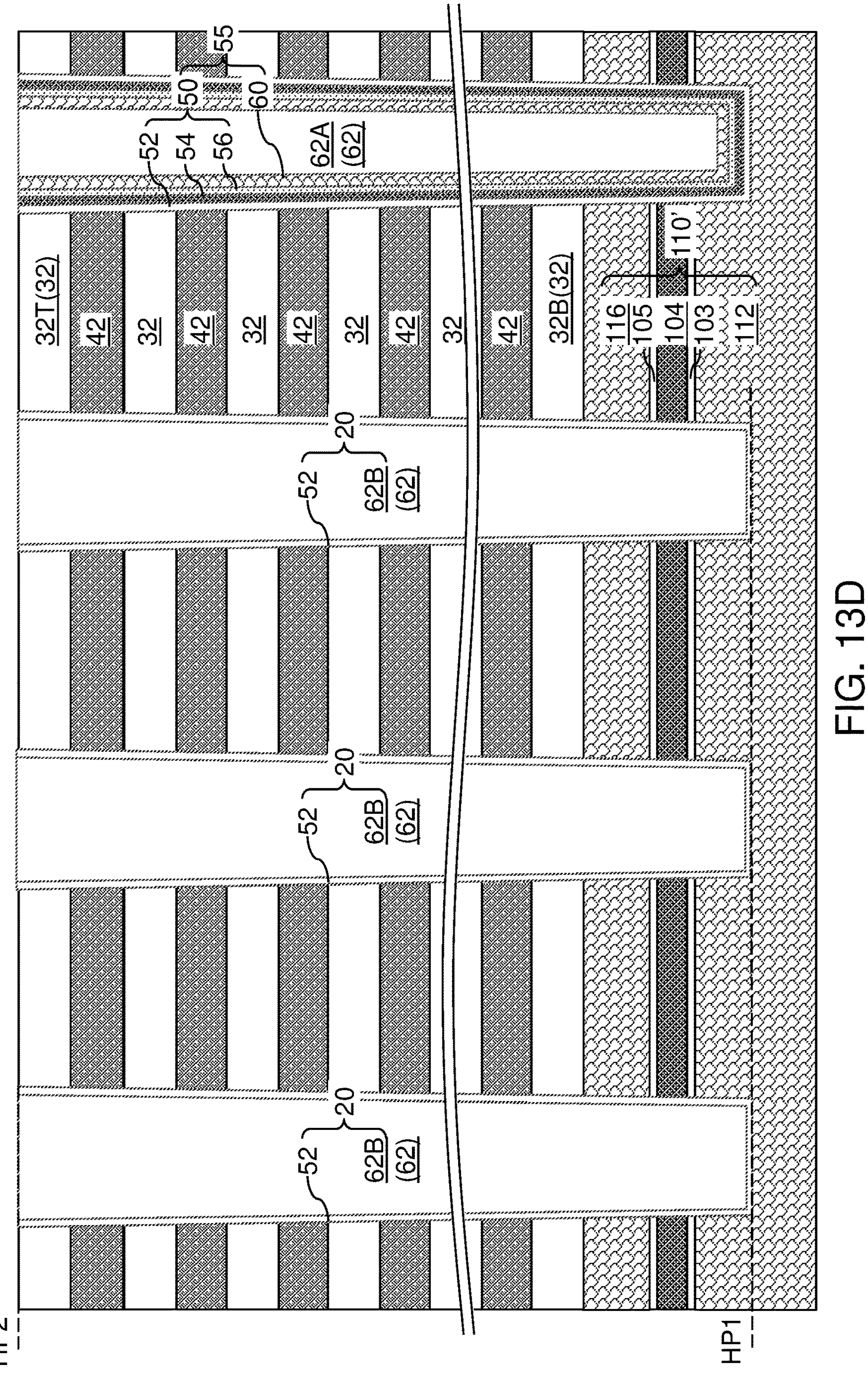

Referring to FIG. 13D, a chemical mechanical polishing (CMP) process and/or a recess etch process can be performed to remove portions of the dielectric core material layer 62L and other remaining layers that overlie the second horizontal plane HP2 including the top surface of the topmost insulating layer 32T. Each remaining portion of the dielectric core material layer 62L that remains in a support opening 19 constitutes a second dielectric core 62B, which is a dielectric core 62 of a second type. Each remaining portion of the dielectric core material layer 62L located in a respective memory opening 49 constitutes a dielectric core 62, which is also referred to as a first dielectric core 62A. Each remaining portion of the continuous semiconductor channel material layer (which has a doping of the first conductivity type) constitutes a vertical semiconductor channel 60. Each remaining portion of the continuous tunneling dielectric layer 56L constitutes a tunneling dielectric layer 56. Each remaining portion of the continuous memory material layer 54L constitutes a memory material layer 54. Each remaining portion of the continuous blocking dielectric layer 52L in a memory opening 49 constitutes a first blocking dielectric layer 52. Each remaining portion of the continuous blocking dielectric layer 52L in a support opening 19 constitutes a second blocking dielectric layer 52.

Figure 13E:
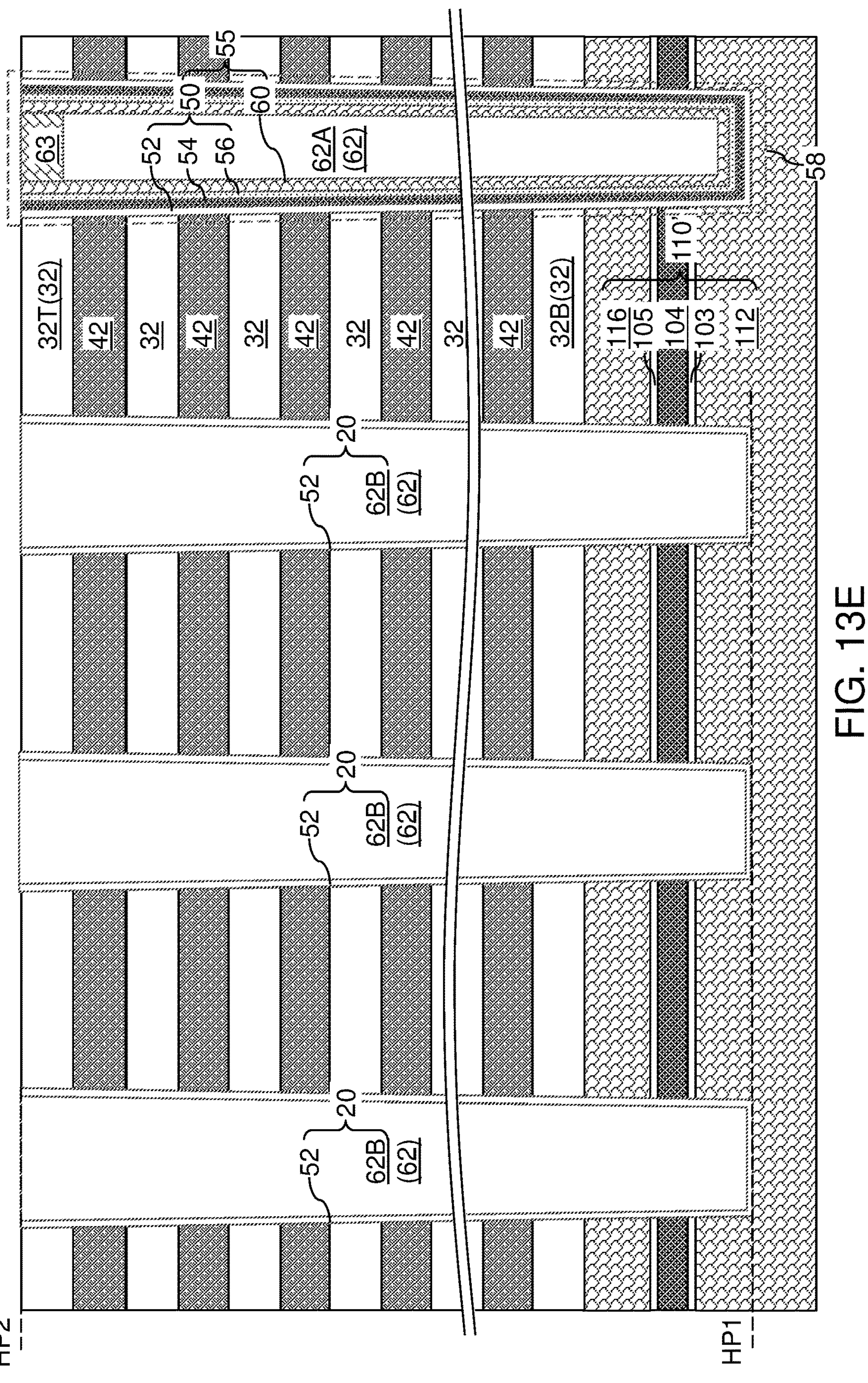

Referring to FIG. 13E, the first dielectric cores 62A are recessed while the second dielectric cores 62B are masked with a masking layer, such as a photoresist layer (not shown). After removing the photoresist layer, a doped semiconductor material having a doping of a second conductivity type can be deposited within each recessed region above the first dielectric cores 62A. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Portions of the deposited semiconductor material having the doping of the second conductivity type that overlie the second horizontal plane HP2 including the top surface of the topmost insulating layer 32T can be removed by a planarization process. The planarization process may comprise a CMP process and/or a recess etch process. Each remaining portion of the doped semiconductor material having a doping of the second conductivity type constitutes a drain region 63.

Each continuous set of a first blocking dielectric layer 52, a memory material layer 54, and a tunneling dielectric layer 56 in a memory opening 49 collectively constitute a memory film 50. Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the memory material layer 54, and an optional first blocking dielectric layer 52. An entire set of material portions that fills a memory opening 49 is herein referred to as a memory opening fill structure 58.

Each combination of a second blocking dielectric layer 52 and a second dielectric core 62B in a support opening 19 constitutes a dielectric pillar structure 20. Generally, the dielectric pillar structures 20 in the second exemplary structure may be arranged in the same pattern as the pattern of the dielectric pillar structures 20 in the first exemplary structure. The bottom surfaces of the dielectric pillar structure 20 may be formed within a first horizontal plane HP1 that underlies a top surface of the lower source-level semiconductor layer 112 and overlies a bottom surface of the lower source-level semiconductor layer 112. The top surfaces of the dielectric pillar structure 20 may be formed within a second horizontal plane HP2 including the top surface of the topmost insulating layer 32T and the top surfaces of the memory opening fill structures 58.

In one embodiment, each memory opening fill structure 58 comprises a layer stack (such as a memory film 50) including a first blocking dielectric layer 52 and a first memory material layer 54, and each dielectric pillar structure 20 comprises a second blocking dielectric layer 52 having a same material composition and a same thickness as the first blocking dielectric layer 52. In one embodiment, each memory opening fill structure 58 comprises a vertical semiconductor channel 60 that is laterally surrounded by the layer stack (such as the memory film 50) and further comprises a first dielectric core 62A comprising a first portion of a dielectric fill material and laterally surrounded by the vertical semiconductor channel 60. Each dielectric pillar structure 20 comprises a second dielectric core 62B comprising a second portion of the dielectric fill material and laterally surrounded by the second blocking dielectric layer 52. The dielectric pillar structures 20 may consist of dielectric materials, and may be free of any semiconductor material.

Figure 13F:
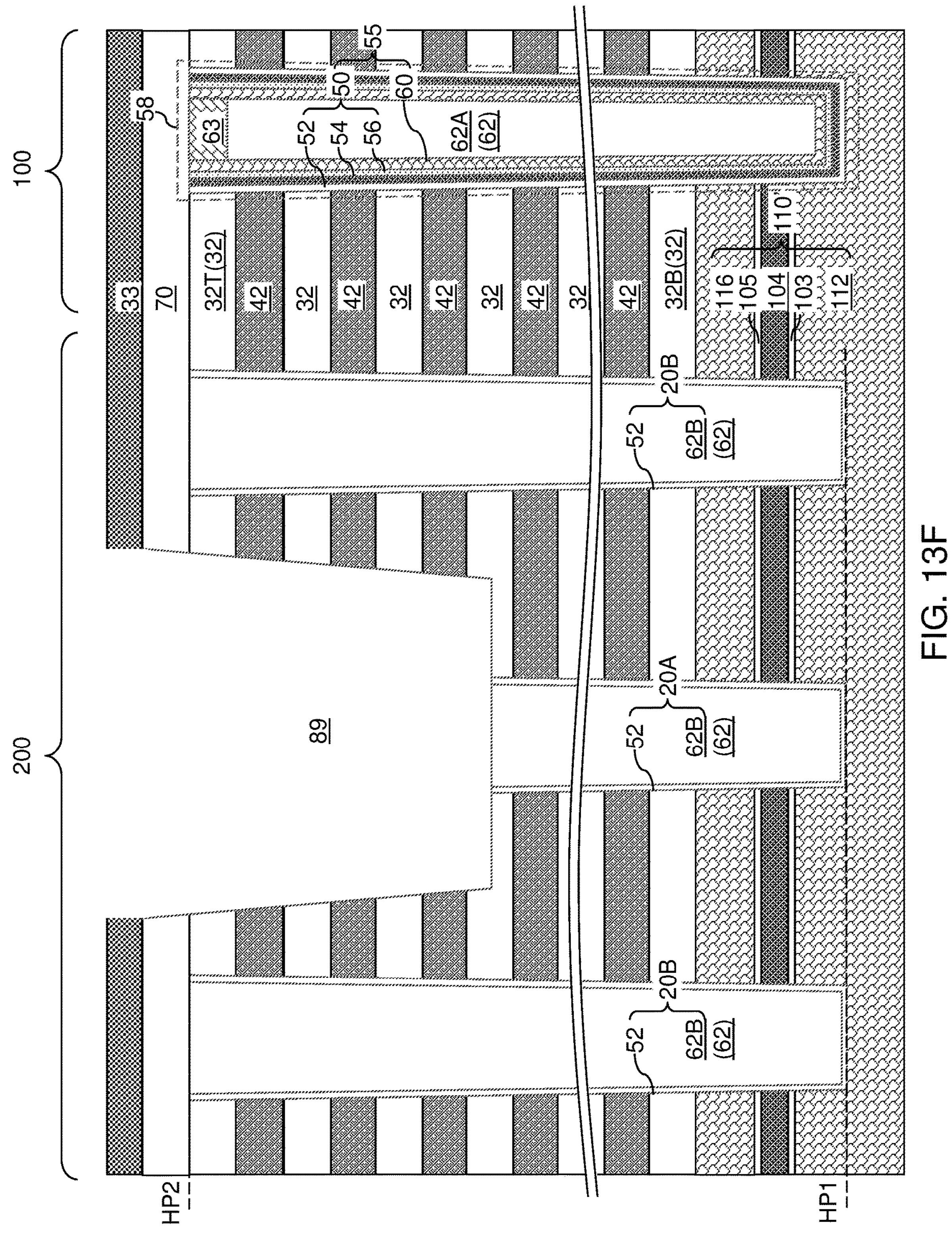

Referring to FIG. 13F, processing steps described with reference to FIGS. 4A-4C can be performed to form an insulating cap layer 70, a patterned hard mask layer 33, and contact via cavities 89 having different depths. The patterned hard mask layer 33 can be subsequently removed.

Figure 13G:
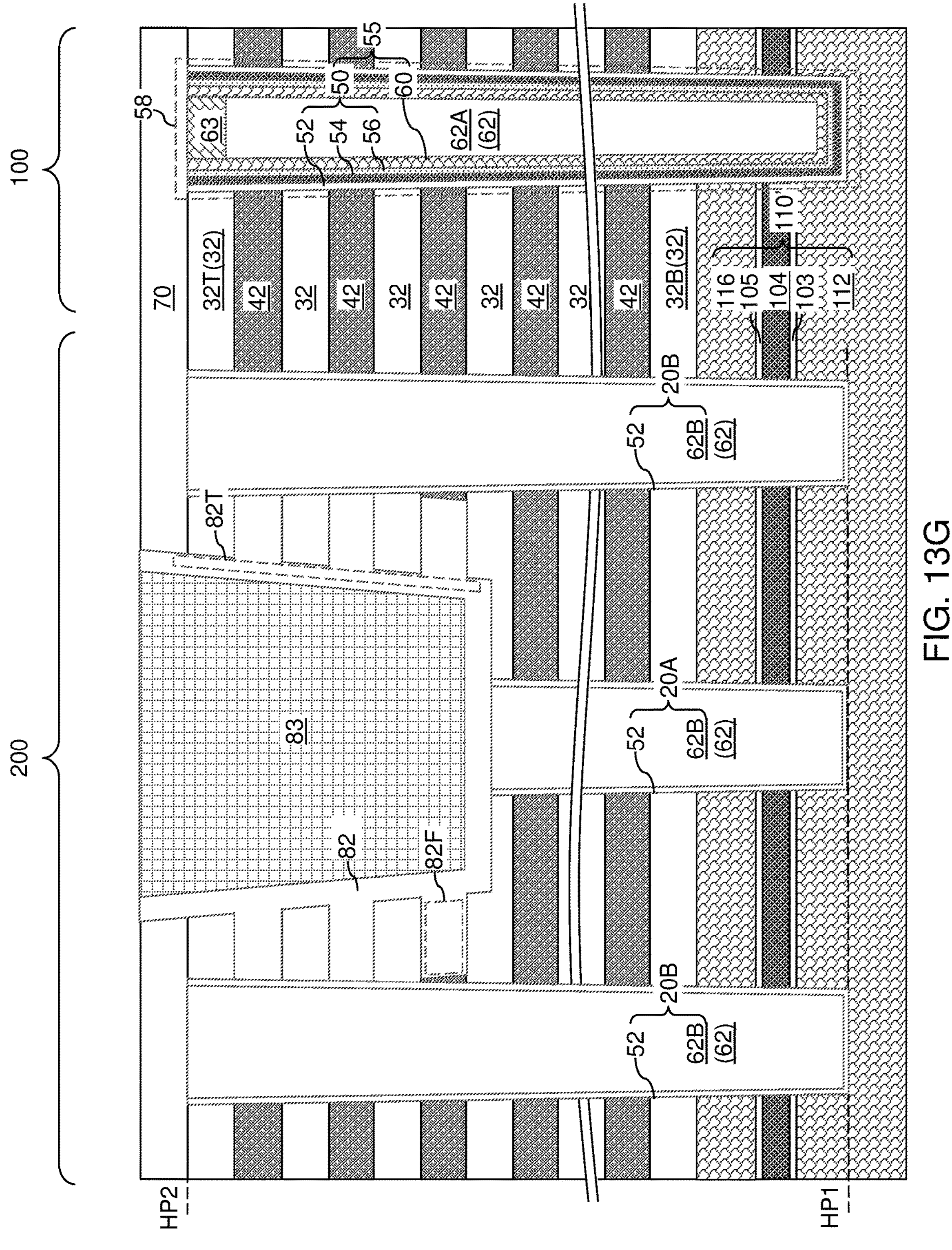

Referring to FIG. 13G, the processing steps described with reference to FIGS. 5A-5C and 6A-6C can be performed to form finned insulating spacers 82 and sacrificial via fill material portions 83.

Figure 13H:
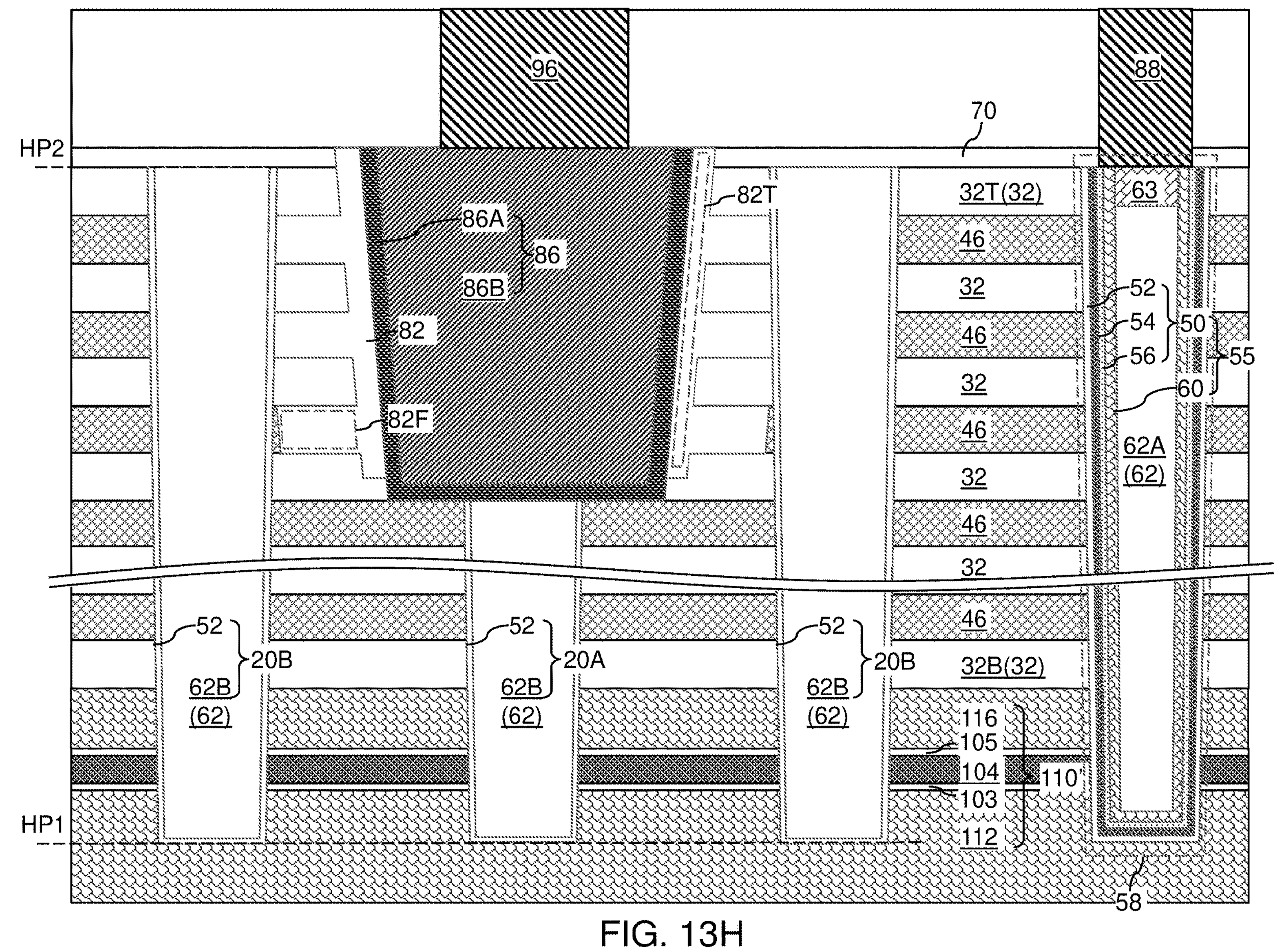

Referring to FIG. 13H, the processing steps described with reference to FIGS. 7A-12C can be performed to form a bottom opening within each of the finned insulating spacers 82, and to form layer contact assemblies (82, 86) including a respective combination of a finned insulating spacer 82 and a layer contact via structure 86. The above described drain contact via structures 88 and connection via structures 96 are then formed as described above.

Figure 14A:
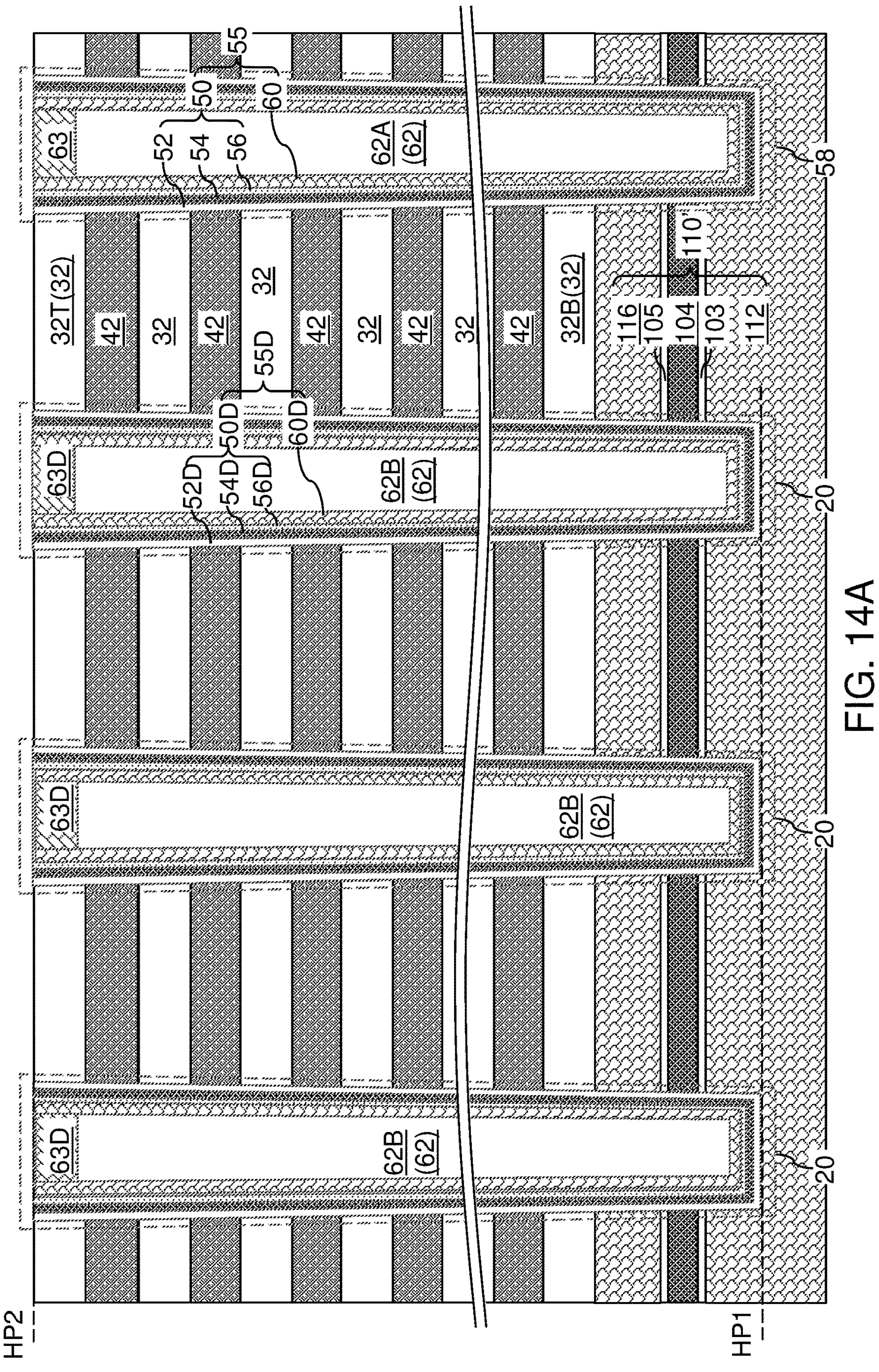
FIGS. 14A-14C are sequential vertical cross-sectional views of a region of a third exemplary structure during various processing steps according to a third embodiment of the present disclosure.
Figure 14B:
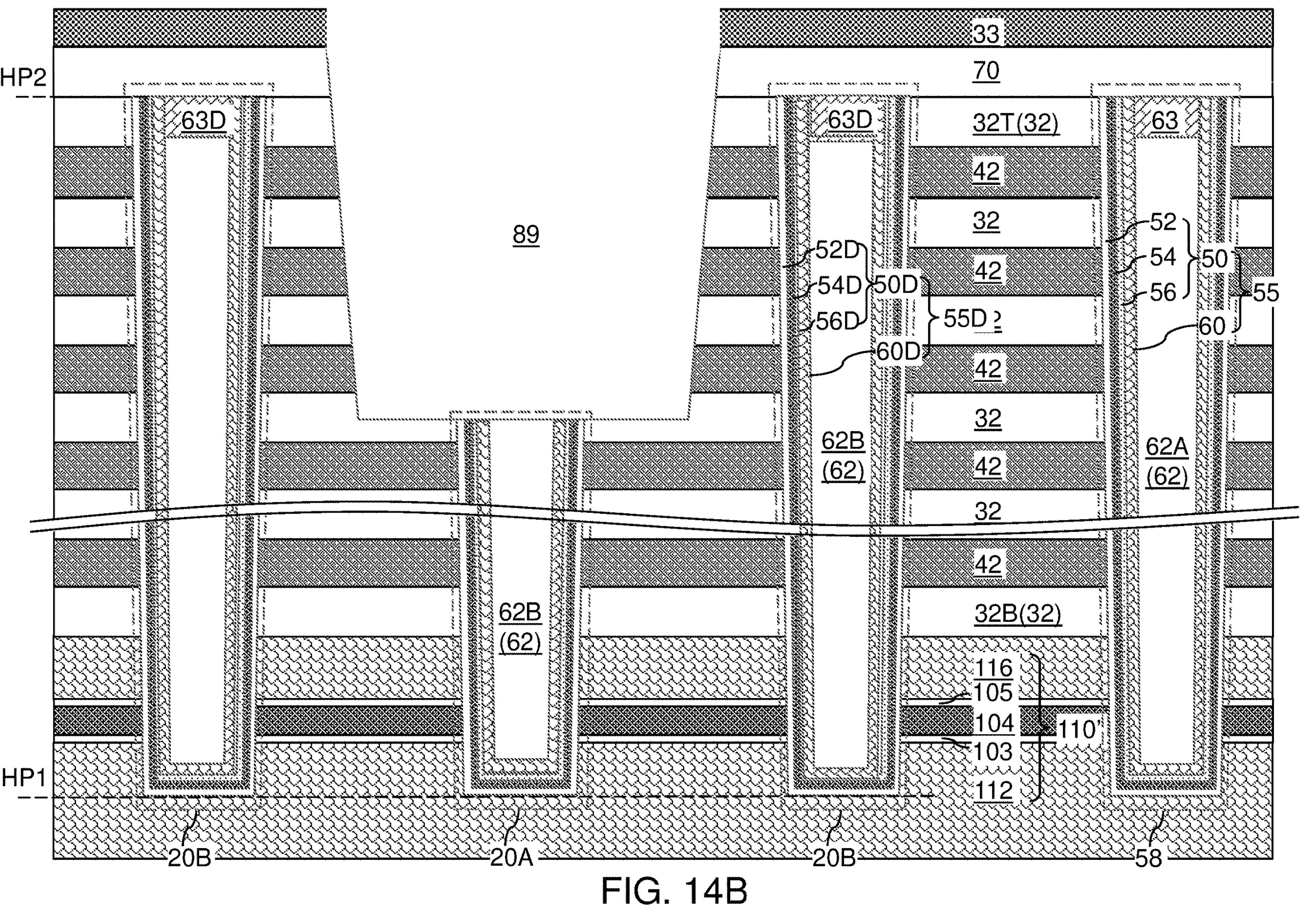
Figure 14C:
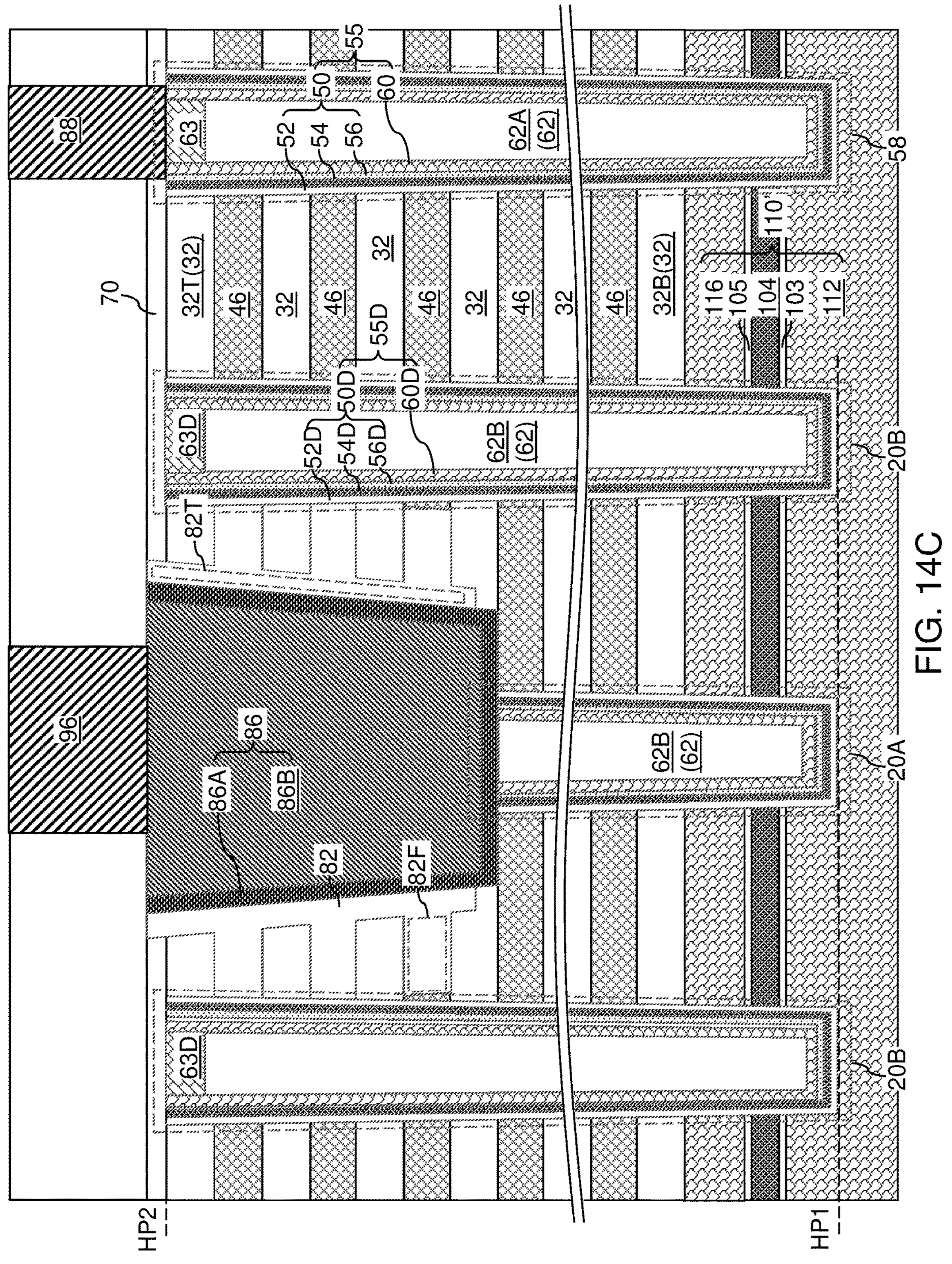

FIGS. 14A-14C are sequential vertical cross-sectional views of a region of a third exemplary structure during various processing steps according to the third embodiment of the present disclosure.

Referring to FIG. 14A, a third exemplary structure according to the third embodiment of the present disclosure can be derived from the first exemplary structure illustrated in FIG. 3E by forming the memory opening fill structures in both the memory openings 49 and the support openings 19 at the same time using the same deposition and planarization steps. The memory opening fill structures 58 located in the memory openings 49 comprise active memory opening fill structures (e.g., active vertical NAND strings) that are used to store data during operation of the memory device and that include drain regions 63 which are electrically connected to respective bit lines. In contrast, the memory opening fill structures located in the support openings 19 comprise support pillar structures 20. The support pillar structures 20 function as dummy memory opening fill structures (e.g., dummy vertical NAND strings) that are not used to store data during operation of the memory device and that include dummy drain regions 63D which are not electrically connected to respective bit lines.

Thus, each dummy memory film 50D in a support opening 19 comprises includes a dummy blocking dielectric layer 52D, a dummy charge storage layer 54D, and a dummy tunneling dielectric layer 56D. The dummy memory film 50D is not used to store data in the memory device. The dummy blocking dielectric layer 52D, the dummy charge storage layer 54D, and the dummy tunneling dielectric layer 56D have the same compositions as the respective blocking dielectric layer 52, charge storage layer 54, and tunneling dielectric layer 56 of the memory opening fill structure 58 located in the memory opening 49. The dummy semiconductor channel 60D in the support opening 19 has the same composition as the vertical semiconductor channel 60 of the memory opening fill structure 58 located in the memory opening 49. However, the dummy semiconductor channel 60D is not used to transmit charge carriers (e.g., electrons or holes) during operation of the memory device. In one embodiment, each memory opening fill structure 58 comprises a first dielectric core 62A comprising a first portion of a dielectric fill material and laterally surrounded by the vertical semiconductor channel 60. Each support pillar structure 20 comprises a second dielectric core 62B comprising a second portion of the dielectric fill material and laterally surrounded by the dummy semiconductor channel 60D.

The support pillar structures 20 (e.g., 20A and 20B) in the third exemplary structure may be arranged in the same pattern as the pattern of the support pillar structures 20 (e.g., 20A and 20B) in the first exemplary structure. The bottom surfaces of the support pillar structure 20 may be formed within a first horizontal plane HP1 that underlies a top surface of the lower source-level semiconductor layer 112 and overlies a bottom surface of the lower source-level semiconductor layer 112. The top surfaces of the support pillar structure 20 may be formed within a second horizontal plane including the top surface of the topmost insulating layer 32T and the top surfaces of the memory opening fill structures 58.

Referring to FIG. 14B, processing steps described with reference to FIGS. 4A-4C can be performed to form an insulating cap layer 70, a patterned hard mask layer 33, and contact via cavities 89 having different depths. The patterned hard mask layer 33 can be subsequently removed.

Referring to FIG. 14C, the processing steps described with reference to FIGS. 5A-12 can be performed to form the electrically conductive layers 46 and the layer contact assemblies (82, 86) including a respective combination of a finned insulating spacer 82 and a layer contact via structure 86.

FIGS. 15A-15E are sequential vertical cross-sectional views of a region of a fourth exemplary structure during various processing steps according to the fourth embodiment of the present disclosure.

Figure 15A:
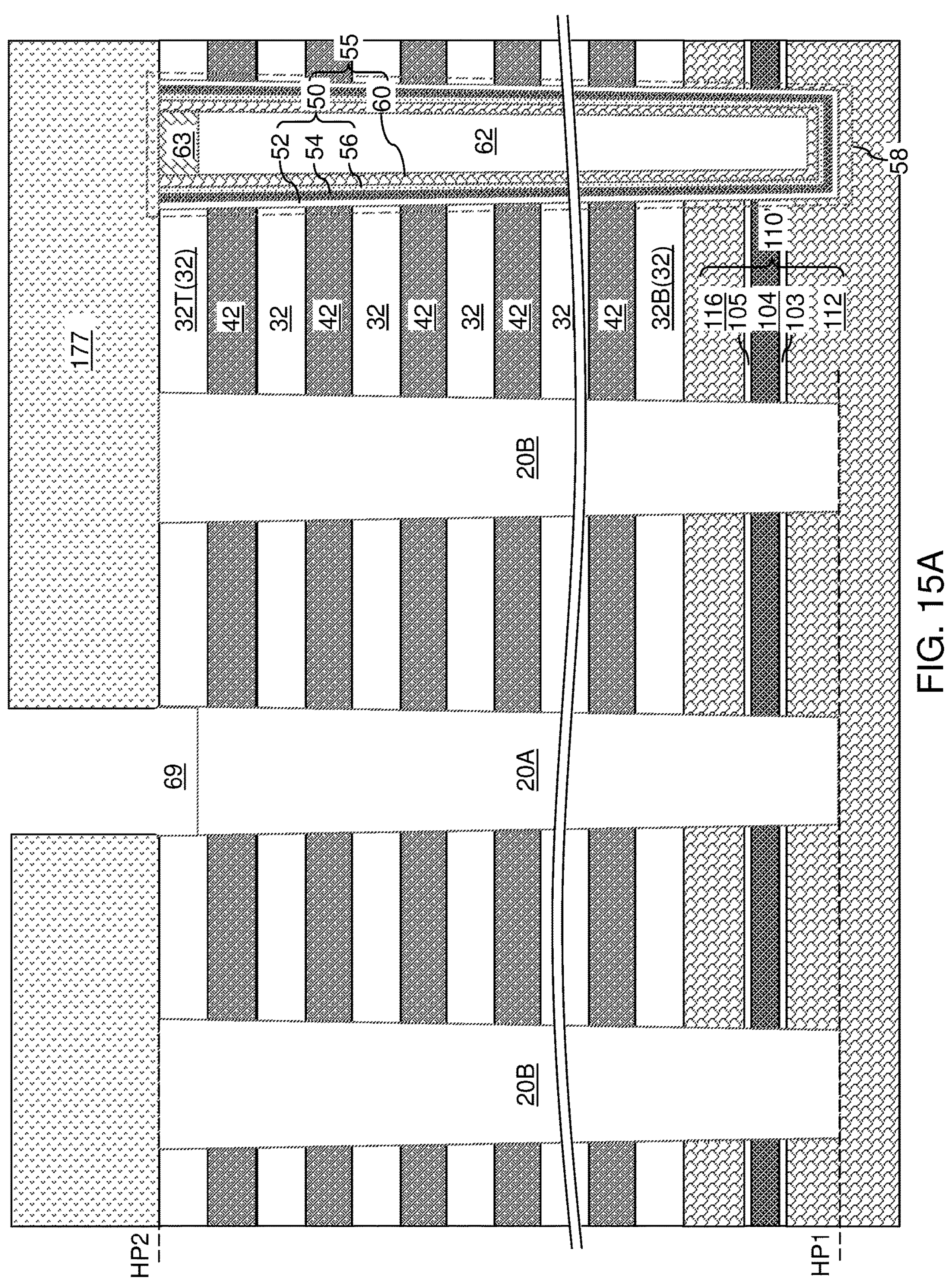
FIGS. 15A-15E are sequential vertical cross-sectional views of a region of a fourth exemplary structure during various processing steps according to a fourth embodiment of the present disclosure.

Referring to FIG. 15A, a fourth exemplary structure according to the fourth embodiment of the present disclosure can be derived from the first exemplary structure illustrated in FIG. 3E by applying and patterning a first photoresist layer 177 such that the first photoresist layer 177 includes openings in areas in which the first-type dielectric pillar structures 20A of the first exemplary structure are present. The second-type dielectric pillar structures 20B and the memory opening fill structures 58 are covered by the first photoresist layer 177. A recess etch process can be performed to vertically recess top surfaces of the first-type dielectric pillar structures 20A by a same vertical recess distance, which may be less than the thickness of the topmost insulating layer 32T. Recess regions 69 can be formed above the first-type dielectric pillar structures 20A. The first photoresist layer can be subsequently removed, for example, by ashing.

Figure 15B:
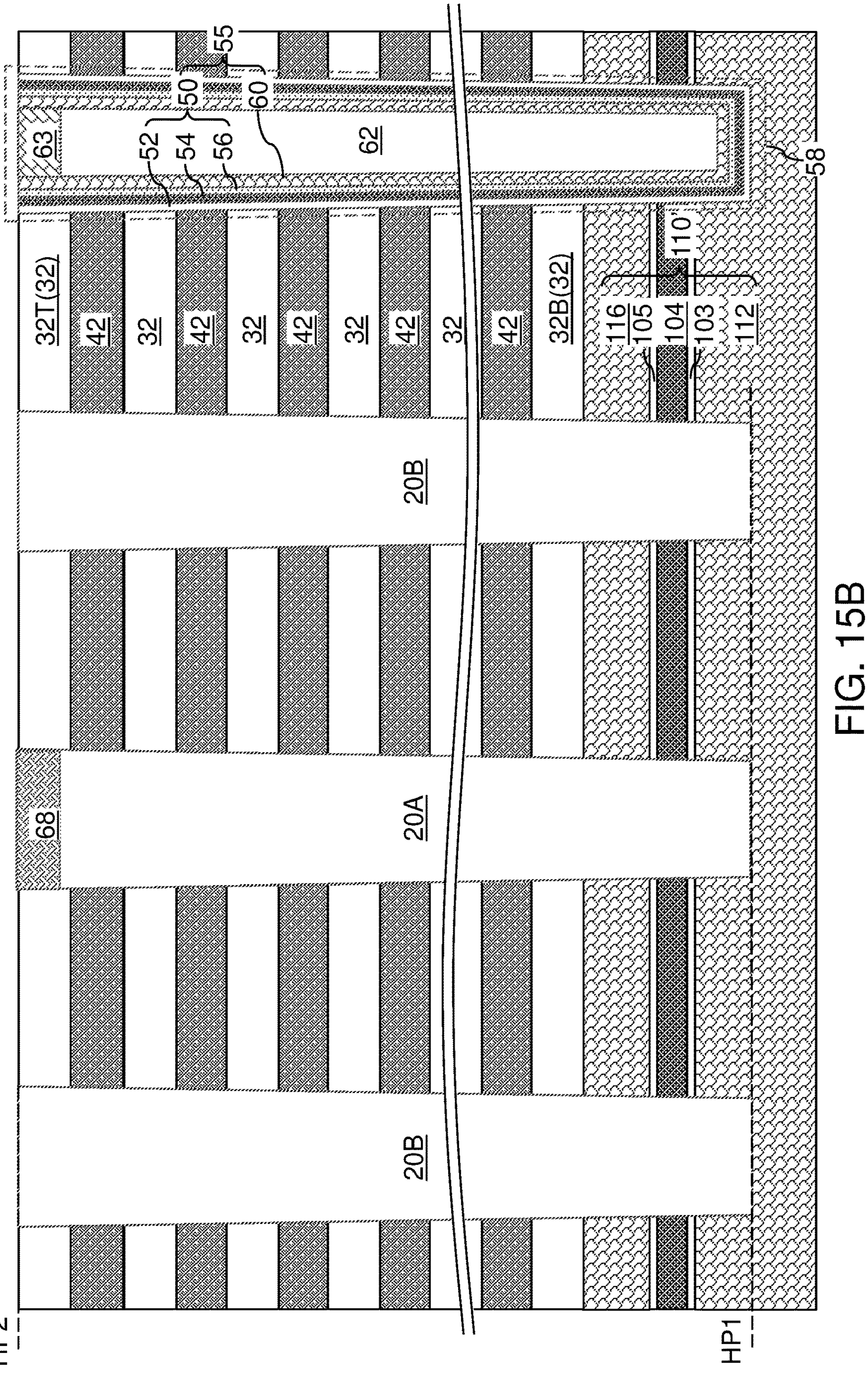

Referring to FIG. 15B, an etch-resistant material can be deposited in the recess regions 69 overlying the first-type dielectric pillar structures 20A. The etch-resistant material includes a material that can provide a higher etch resistance than the materials of the insulating layers 32 and the sacrificial material layers 42 during anisotropic etch processes to be subsequently employed to form the contact via cavities 89. For example, the etch resistant material may comprise a semiconductor material (such as polysilicon) or a carbon-based material (such as amorphous carbon or diamond-like carbon). Excess portions of the etch-resistant material can be removed from above the second horizontal plane HP2 including the top surfaces of the second-type dielectric pillar structures 20B and the top surface of the topmost insulating layer 32T. Etch-resistant cap plates 68 including the etch-resistant material can be formed above each first-type dielectric pillar structure 20A.

Figure 15C:
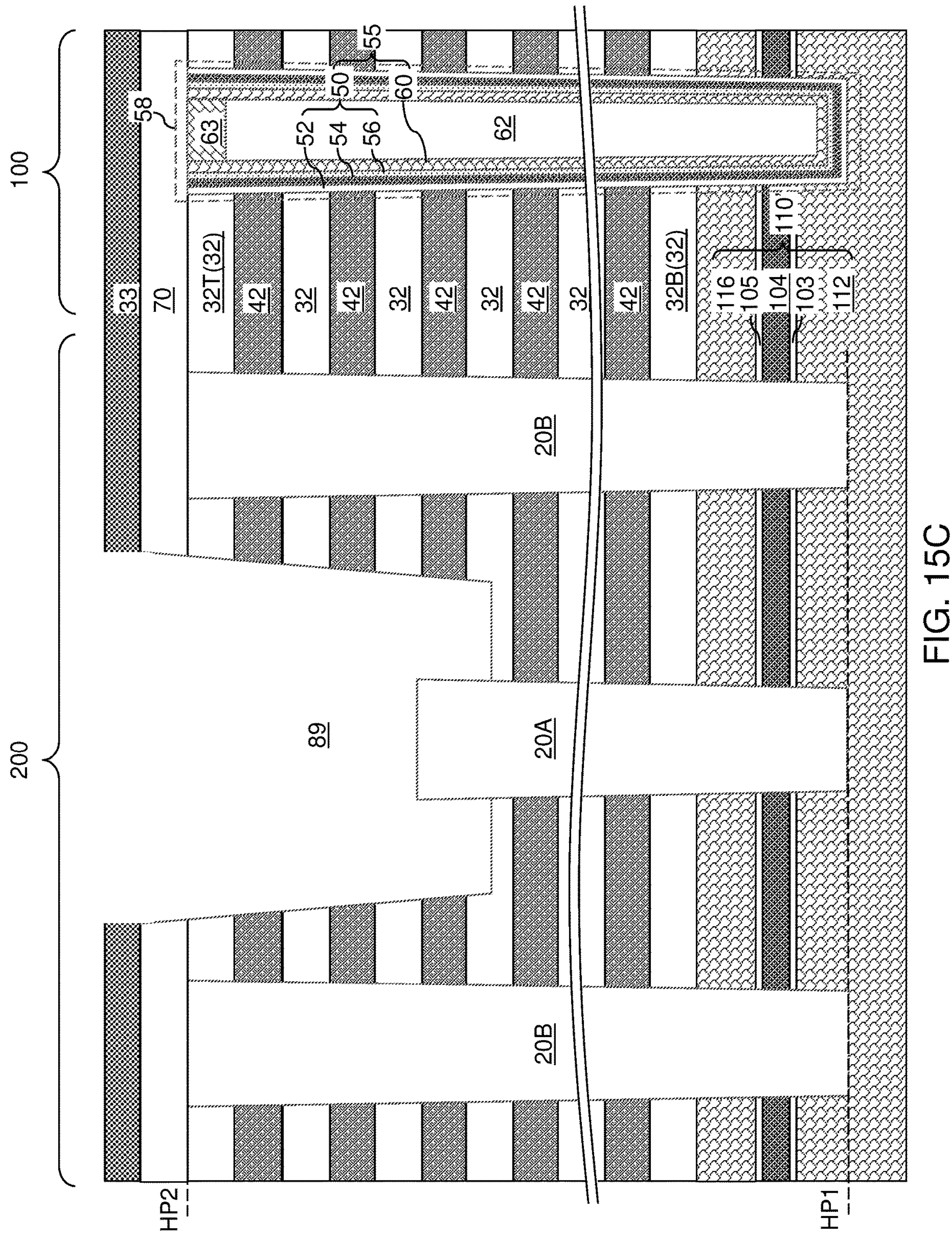

Referring to FIG. 15C, the processing steps described with reference to FIGS. 4A-4C can be performed to form an insulating cap layer 70, a patterned hard mask layer 33, and contact via cavities 89 having different depths. The etch-resistant cap plates 68 reduce vertical recessing of the first-type dielectric pillar structures 20A relative to the materials of the alternating stacks (32, 42). Thus, the top surface of each of the first-type dielectric pillar structures 20A may protrude above an annular bottom surface of a respective contact via cavity 89 that overlies the first-type dielectric pillar structure 20A. The height difference between the top surface of a first-type dielectric pillar structure 20A that underlies a contact via cavity 89 and the annular bottom surface of the contact via cavity 89 (which may comprise an annular recessed surface of an insulating layer 32) may be in a range from 10 nm to 200 nm, such as from 20 nm to 100 nm, although lesser and greater height differences may also be employed. The patterned hard mask layer 33 can be subsequently removed. The etch-resistant cap plates 68 may be removed together with hard mask layer 33 or in a separate etching step depending on the composition of the hard mask layer 33 and the hard mask layer 33.

Figure 15D:
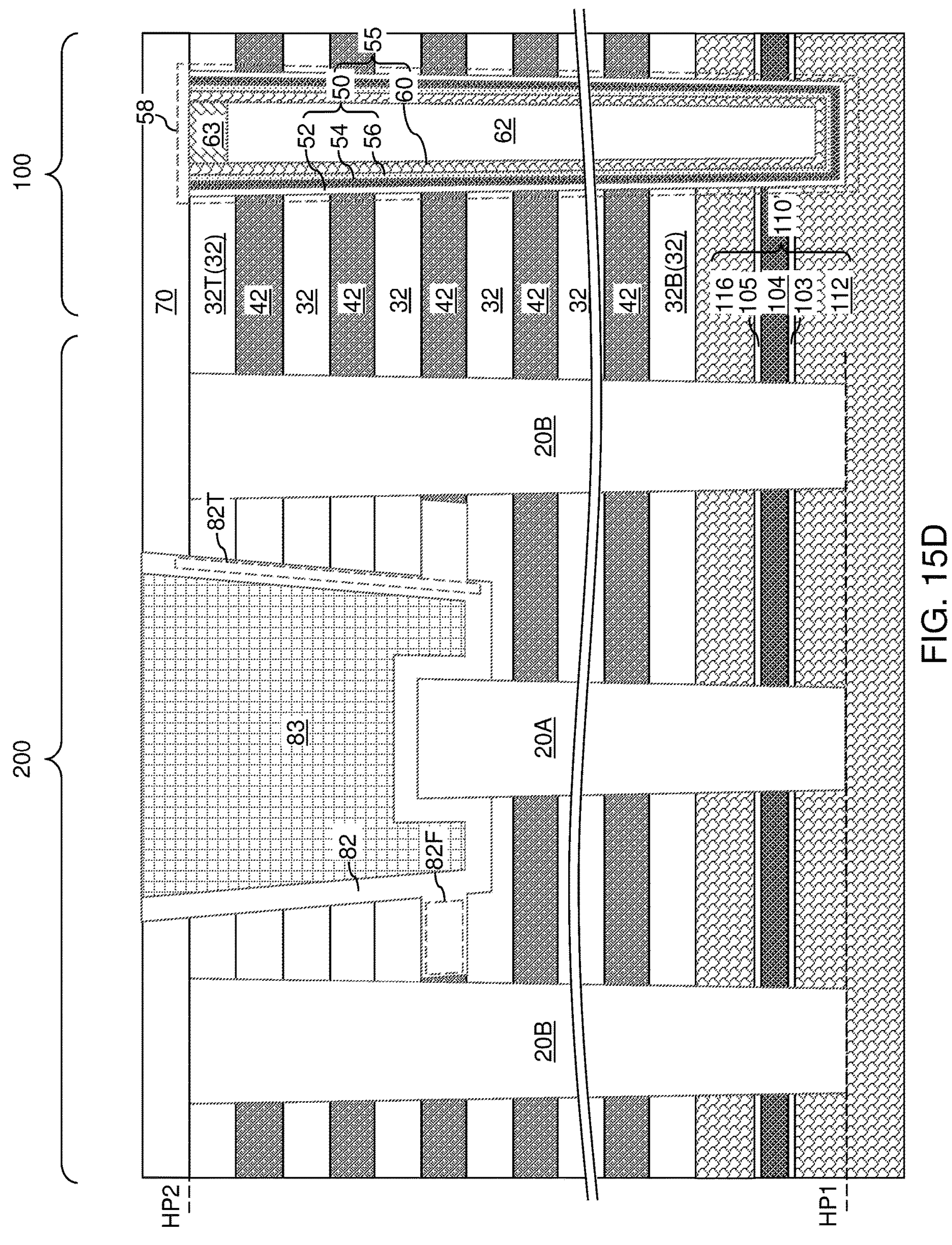

Referring to FIG. 15D, the processing steps described with reference to FIGS. 5A-5C and 6A-6C can be performed to form the finned insulating spacers 82 and sacrificial via fill material portions 83.

Figure 15E:
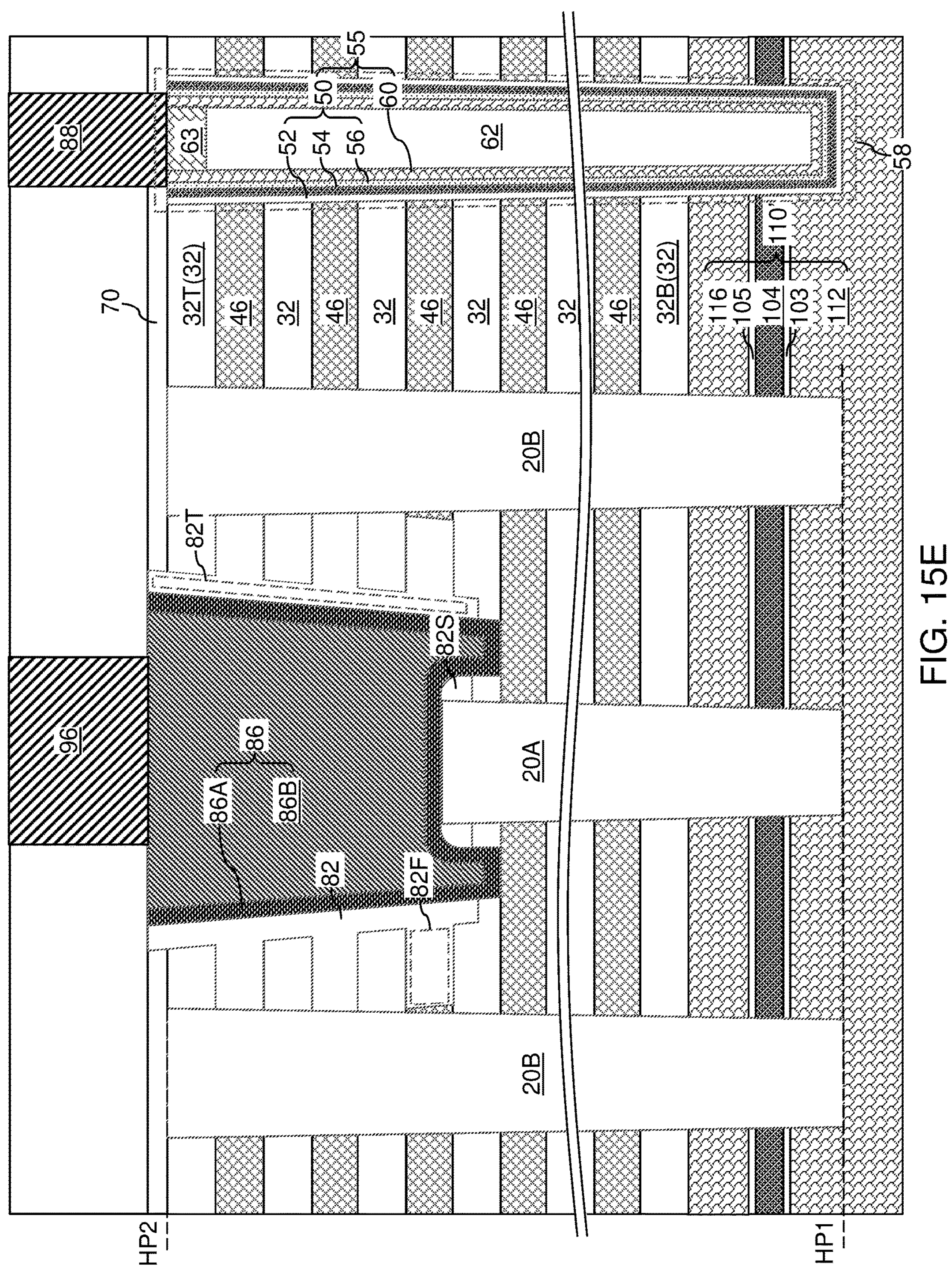

Referring to FIG. 15E, the processing steps described with reference to FIGS. 7A-12C can be performed to form the electrically conductive layers 46, to form the bottom opening within each of the finned insulating spacers 82, and to form layer contact assemblies (82, 86) including a respective combination of a finned insulating spacer 82 and a layer contact via structure 86. In some embodiments, an inner tubular insulating spacer 82S may be formed around a top portion of at least one of the first-type dielectric pillar structures 20A. The inner tubular insulating spacers 82S may comprise remaining portions of the insulating liner layer 82L. A remaining portion of an insulating layer 32 may underlie each inner tubular insulating spacer 82S.

FIGS. 16A-16E are sequential vertical cross-sectional views of a region of a fifth exemplary structure during various processing steps according to the fifth embodiment of the present disclosure.

Figure 16A:
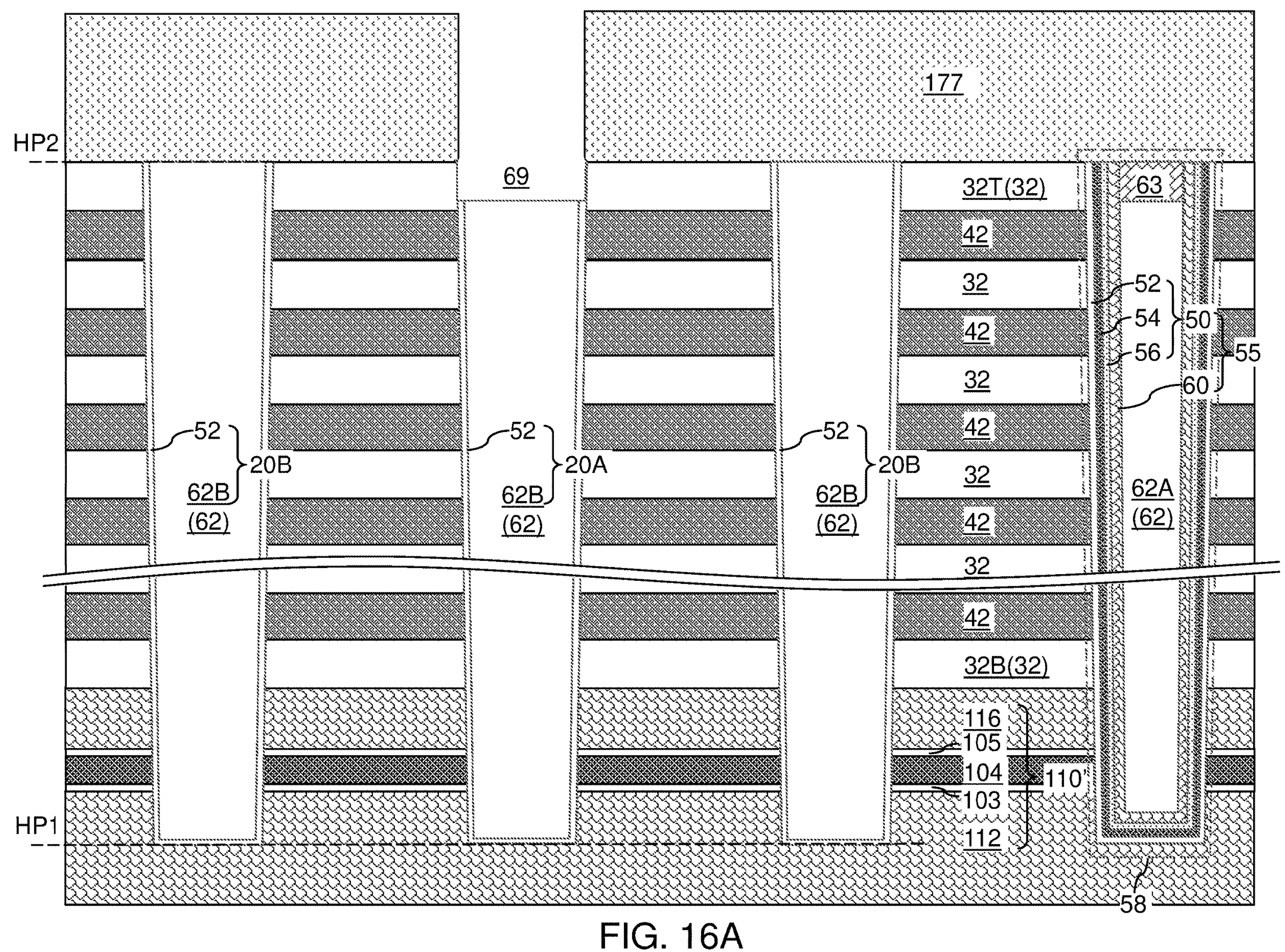
FIGS. 16A-16E are sequential vertical cross-sectional views of a region of a fifth exemplary structure during various processing steps according to a fifth embodiment of the present disclosure.

Referring to FIG. 16A, a fifth exemplary structure according to an embodiment of the present disclosure can be derived from the second exemplary structure illustrated in FIG. 13E by performing the processing steps described with reference to FIG. 15A. Recess regions 69 are formed above the first-type dielectric pillar structures 20A.

Figure 16B:
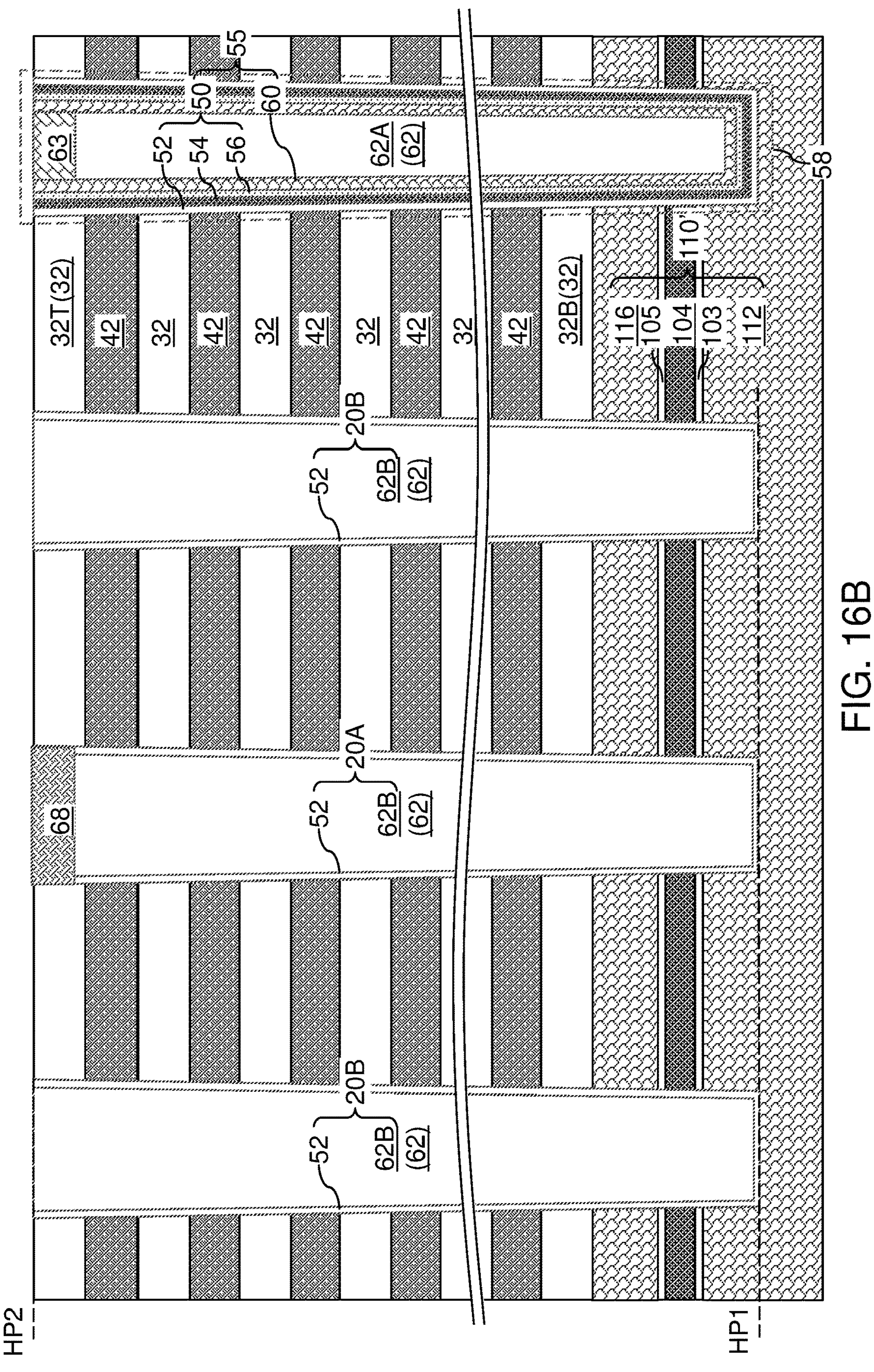

Referring to FIG. 16B, the processing steps described with reference to FIG. 15B can be performed to form etch-resistant cap plates 68 including an etch-resistant material in the recess regions 69.

Figure 16C:
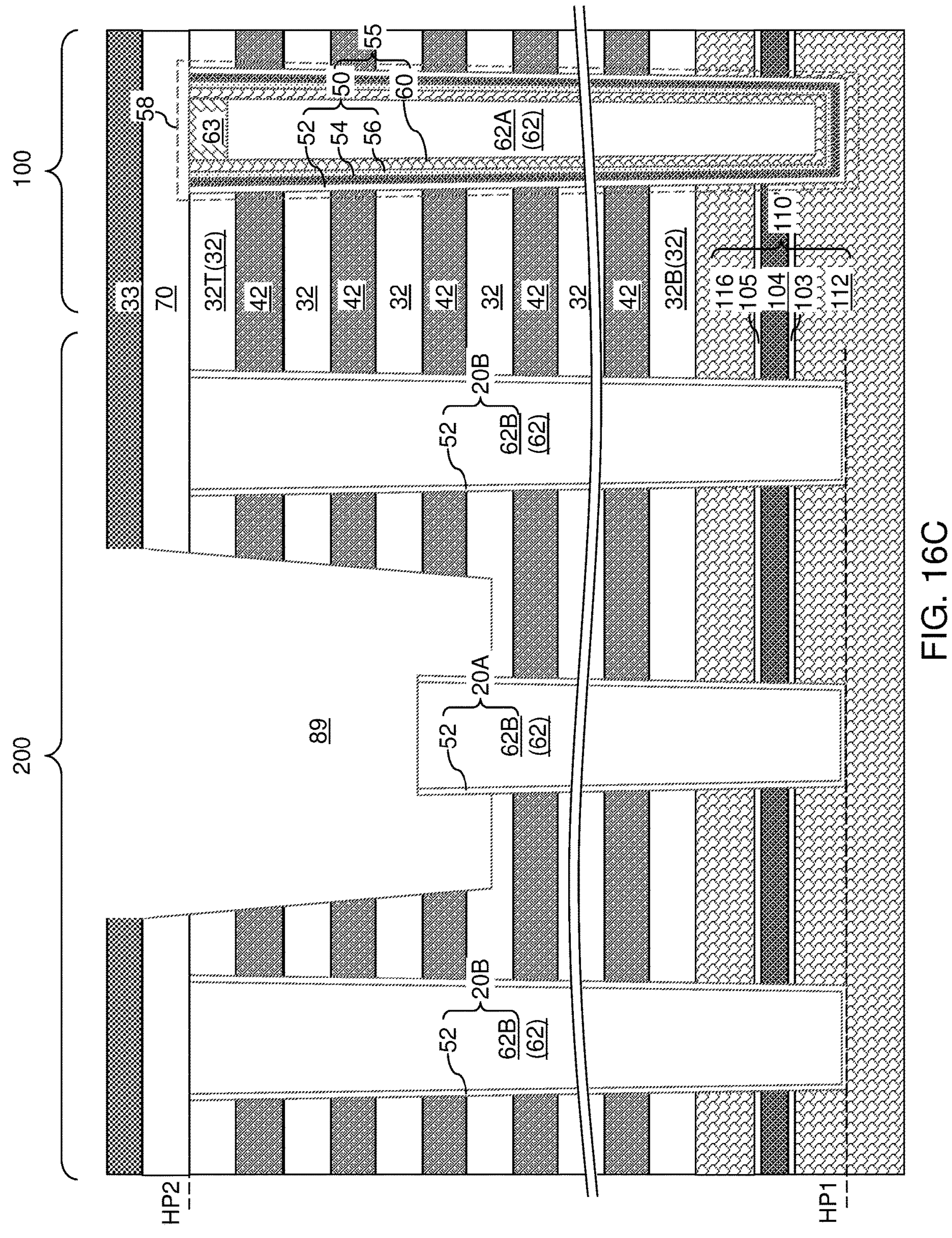

Referring to FIG. 16C, the processing steps described with reference to FIG. 15C can be performed to form contact via cavities 89 and to vertically recess top surfaces of the first-type dielectric pillar structures 20A to different depths. As discussed above, the top surfaces of each of the first-type dielectric pillar structures 20A may protrude above an annular bottom surface of a respective contact via cavity 89 that overlies the first-type dielectric pillar structure 20A.

Figure 16D:
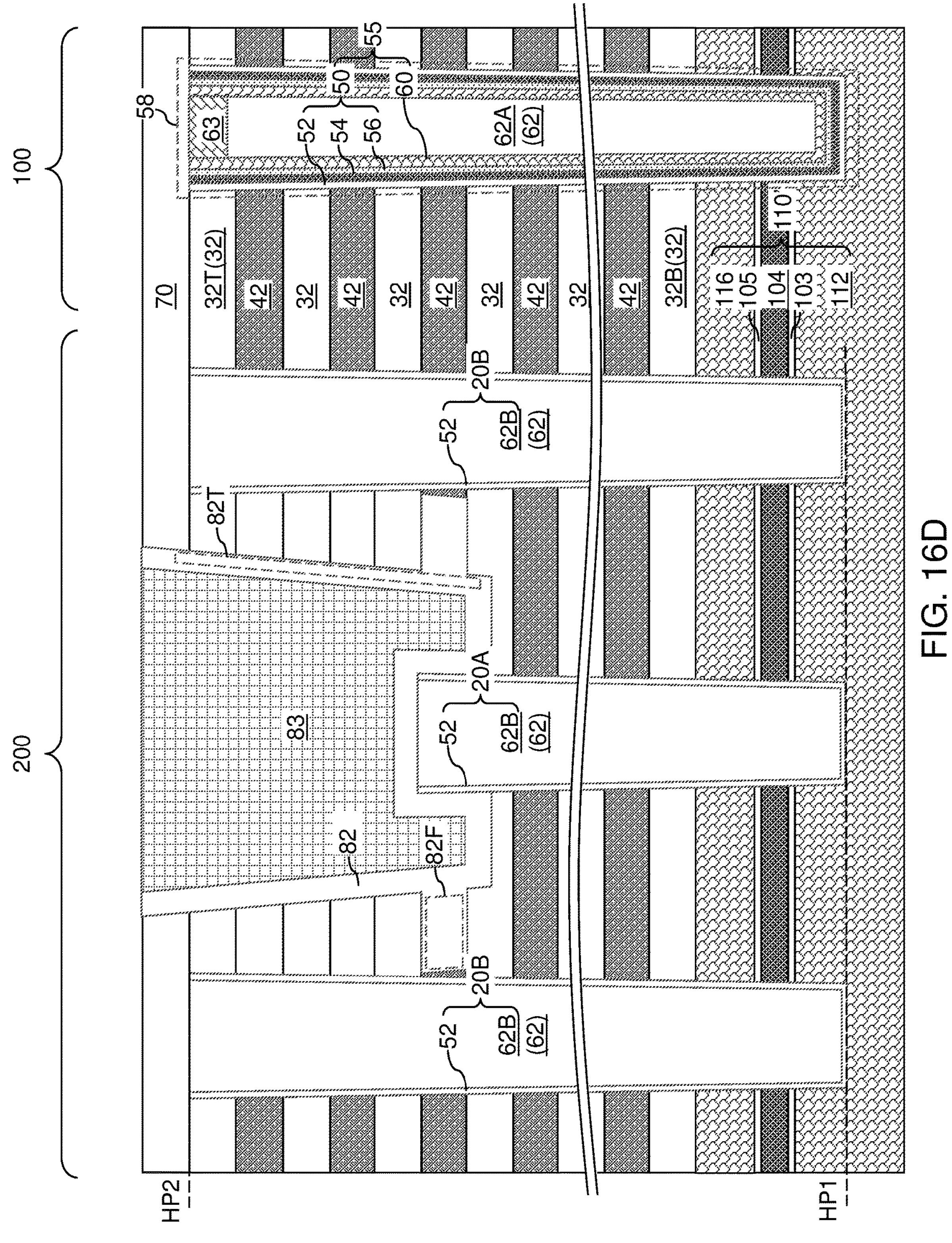

Referring to FIG. 16D, the processing steps described with reference to FIGS. 5A-5C and 6A-6C can be performed to form the finned insulating spacers 82 and sacrificial via fill material portions 83.

Figure 16E:
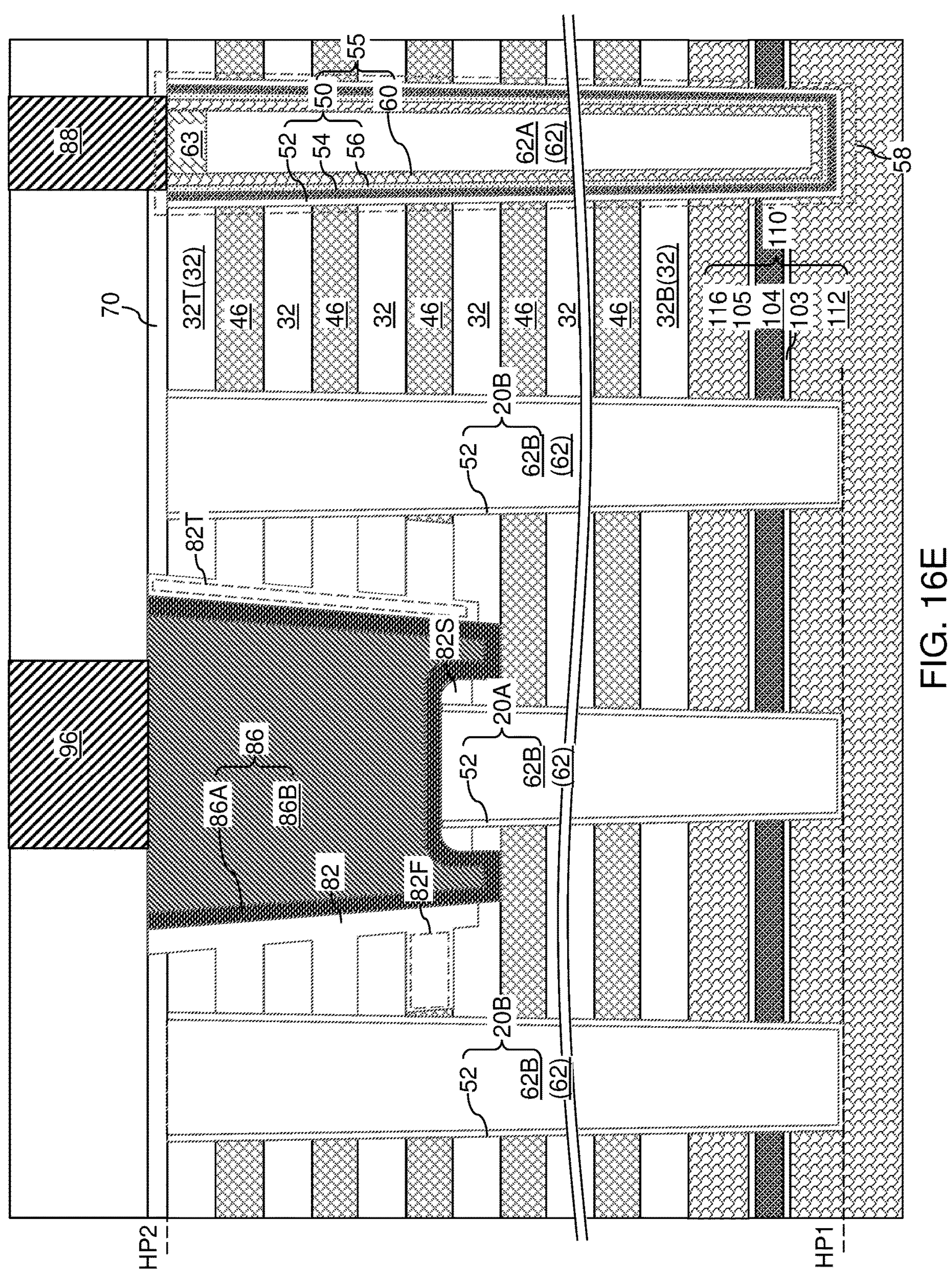

Referring to FIG. 16E, the processing steps described with reference to FIGS. 7A-12C can be performed to form the electrically conductive layers 46, to form the bottom opening within each of the finned insulating spacers 82, and to form the layer contact assemblies (82, 86) including a respective combination of a finned insulating spacer 82 and a layer contact via structure 86. In some embodiments, the inner tubular insulating spacer 82S may be formed around a top portion of the at least one of the first-type dielectric pillar structures 20A. The inner tubular insulating spacers 82S may comprise remaining portions of the insulating liner layer 82L. A remaining portion of an insulating layer 32 may underlie each inner tubular insulating spacer 82S.

Figure 17:
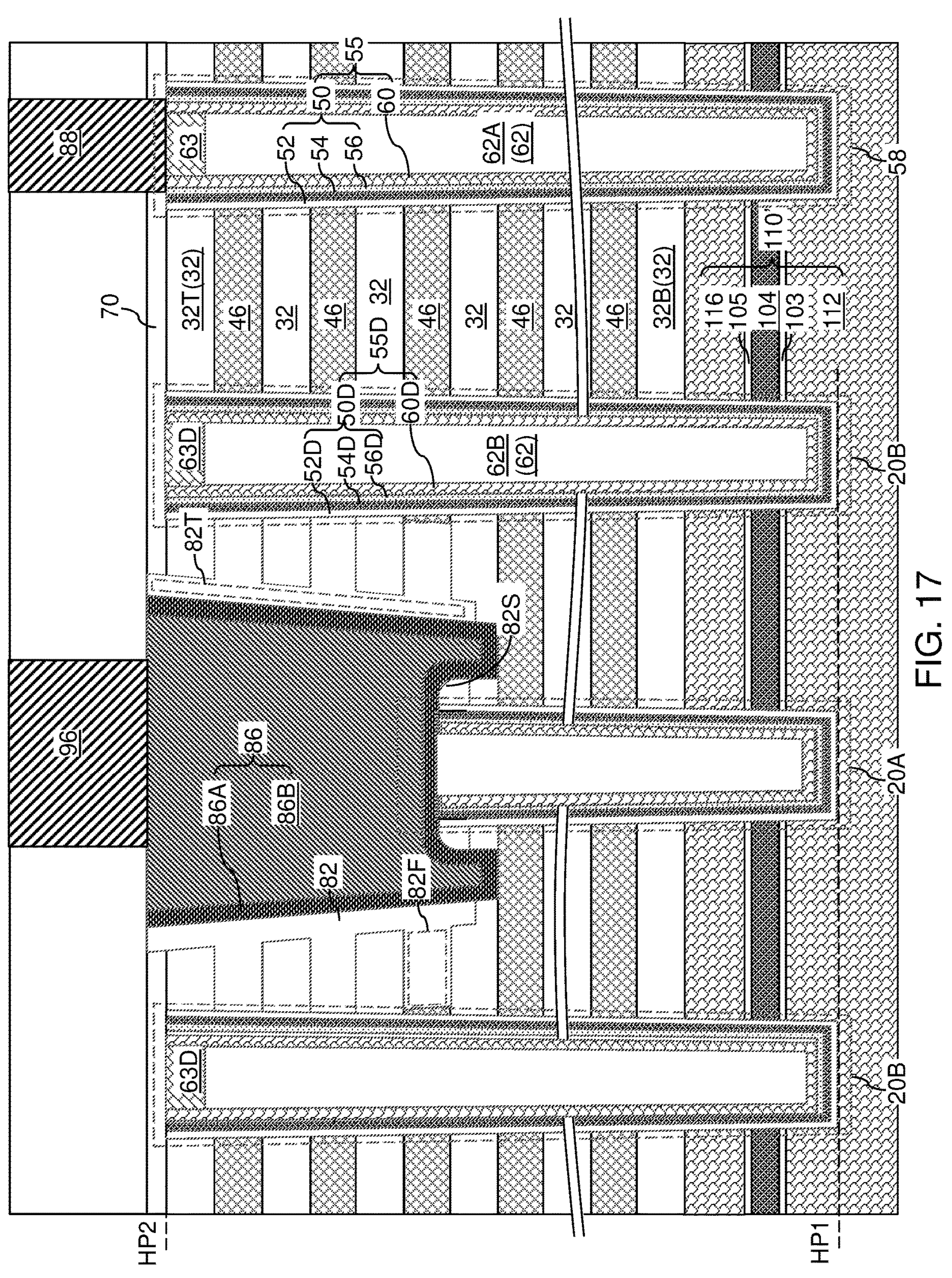
FIG. 17 is a cross-sectional view of a region of a sixth exemplary structure after various processing steps according to a sixth embodiment of the present disclosure.

Referring to FIG. 17, a sixth exemplary structure according to the sixth embodiment of the present disclosure can be derived from the third exemplary structure illustrated in FIG. 14C, where the dummy drain regions 63D reduce the vertical recessing of the first-type dielectric pillar structures 20A relative to the materials of the alternating stacks (32, 42). Thus, the top surface of each of the first-type dielectric pillar structures 20A protrude above an annular bottom surface of a respective contact via cavity 89 that overlies the first-type dielectric pillar structure 20A.

Referring to all drawings and according to various embodiments of the present disclosure, a three-dimensional memory device comprises: an alternating stack (32, 46) of insulating layers 32 and electrically conductive layers 46; a memory opening 49 vertically extending through the alternating stack (32, 46); a memory opening fill structure 58 located in memory opening 49 and comprising a vertical stack of memory elements (such as portions of the memory material layer 54) located at levels of the electrically conductive layers 46 and a vertical semiconductor channel 60; a layer contact via structure 86 contacting a first electrically conductive layer 46 within a first subset of the electrically conductive layers 46 and vertically extending through a second subset of the electrically conductive layers 46 that overlies the first subset; and a first-type support pillar structure 20A located under a bottom surface of the layer contact via structure 86.

In one embodiment, the first-type support pillar structure 20A contacts a center portion of the bottom surface of the layer contact via structure 86. In one embodiment, a bottom surface of the layer contact via structure 86 contacts an annular horizontal surface segment of the first electrically conductive layer 46.

In one embodiment, the three-dimensional memory also comprises second-type support pillar structures 20B laterally surrounding the layer contact via structure 86 and having a greater vertical extent than the first-type support pillar structure 20A.

In one embodiment, the three-dimensional memory also comprises a finned insulating spacer 82 comprising a vertically-extending tubular portion 82T that laterally surrounding the layer contact via structure 86 and a vertical stack of insulating fins 82F that laterally extend outward from the vertically-extending tubular portion 82T at each level of the second subset of the electrically conductive layers 46.

In one embodiment, bottom surfaces of the first-type support pillar structure 20A and the second-type support pillar structures 20B are located within a first horizontal plane that underlies the alternating stack (32, 46). In one embodiment, top surfaces of the second-type support pillar structures 20B are located within a horizontal plane including a topmost surface of the alternating stack (32, 46).

In one embodiment, at least one of the insulating fin 82F within the vertical stack of insulating fins 82F comprises a plurality of vertically-straight and laterally-concave surface segments VSLCSS that contact the second-type support pillar structures 20B. In one embodiment, each insulating fin 82F within the vertical stack of insulating fins 82F further comprises a plurality of vertically-straight and laterally-convex surface segments VSLVSS; and each vertically-straight and laterally-concave surface segment of the plurality of vertically-straight and laterally-concave surface segments VSLCSS is adjoined to a respective pair of vertically-straight and laterally-convex surface segments VSLVSS of the plurality of vertically-straight and laterally-convex surface segments VSLVSS.

In one embodiment, the vertically-extending tubular portion 82T of the finned insulating spacer 82 comprising is laterally spaced from the second-type support pillar structures 20B and comprises a plurality of cylindrical surface segments that contact a respective one of the insulating layers 32. In one embodiment, a top surface of the layer contact via structure 86 and an annular top surface of the finned insulating spacer 82 are located above a horizontal plane including top surfaces of the second-type support pillar structures 20B.

In one embodiment, the first-type support pillar structure 20A comprises a top surface containing a divot therein; and the divot is filled with an insulating divot fill material portion 21 that contacts a center potion of a bottom surface of the layer contact via structure 86.

In the first and fourth embodiments, the first-type support pillar structure 20A consists essentially of an insulating material and comprises a first-type dielectric pillar structure.

In the second and fifth embodiments, the memory opening fill structure 58 further comprises a first blocking dielectric layer 52 and a first dielectric core 62A laterally surrounded by the vertical semiconductor channel 60. The first-type support pillar structure 20A comprises a second blocking dielectric layer 52 having a same material composition as the first blocking dielectric layer 52 and second dielectric core 62B laterally surrounded by and contacting the second blocking dielectric layer 52.

In the third and sixth embodiments, the memory opening fill structure 58 further comprises a first dielectric core 62A laterally surrounded by the vertical semiconductor channel 60, a drain region 63, and a memory film 50 comprising a blocking dielectric layer 52, a memory material layer 54 comprising the vertical stack of memory elements, and a tunneling dielectric layer 56. The first-type support pillar structure 20A comprises a dummy semiconductor channel, a second dielectric core laterally surrounded by and contacting the dummy semiconductor channel 60D, a dummy drain region 63D, and a dummy memory film 50D comprising a dummy blocking dielectric layer 52D, a dummy memory material layer 54D, and a dummy tunneling dielectric layer 56D.

In the fourth, fifth and sixth embodiments, the bottom surface of the layer contact via structure 86 comprises a center portion and a peripheral portion located below the center portion; the first-type support pillar structure 20A contacts the center portion of the bottom surface of the layer contact via structure 86; a top surface of the first-type support pillar structure 20A is located above the peripheral portion of the bottom surface of the layer contact via structure 86; and a tubular insulating spacer 82S surrounds a top portion of the first-type support pillar structure 20A.

The various embodiments of the present disclosure can be employed to form layer contact assemblies (82, 86) that provide electrical contact to electrically conductive layers 46 of an alternating stack (32, 46) without formation of stepped surfaces (i.e., staircases). By forming the layer contact assemblies (82, 86) over the respective first-type support pillar structures 20A, the distance between adjacent first-type and second-type support pillar structures (20A, 20B) may be reduced. This reduces the likelihood that the insulating layers 32 will deflect down into the laterally-extending cavities 43 after removing the sacrificial material layers 42.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A three-dimensional memory device, comprising:

an alternating stack of insulating layers and electrically conductive layers;

a memory opening vertically extending through the alternating stack;

a memory opening fill structure located in memory opening and comprising a vertical stack of memory elements located at levels of the electrically conductive layers and a vertical semiconductor channel;

a layer contact via structure contacting a first electrically conductive layer within a first subset of the electrically conductive layers and vertically extending through a second subset of the electrically conductive layers that overlies the first subset; and a first-type support pillar structure located under a bottom surface of the layer contact via structure;

wherein:

the first-type support pillar structure contacts a center portion of the bottom surface of the layer contact via structure; and a bottom surface of the layer contact via structure contacts an annular horizontal surface segment of the first electrically conductive layer.

2. A three-dimensional memory device, comprising:

an alternating stack of insulating layers and electrically conductive layers;

a memory opening vertically extending through the alternating stack;

a memory opening fill structure located in memory opening and comprising a vertical stack of memory elements located at levels of the electrically conductive layers and a vertical semiconductor channel;

a layer contact via structure contacting a first electrically conductive layer within a first subset of the electrically conductive layers and vertically extending through a second subset of the electrically conductive layers that overlies the first subset;

a first-type support pillar structure located under a bottom surface of the layer contact via structure; and second-type support pillar structures laterally surrounding the layer contact via structure and having a greater vertical extent than the first-type support pillar structure.

3. The three-dimensional memory device of claim 2, further comprising a finned insulating spacer comprising a vertically-extending tubular portion that laterally surrounds the layer contact via structure and a vertical stack of insulating fins that laterally extend outward from the vertically-extending tubular portion at each level of the second subset of the electrically conductive layers.

4. The three-dimensional memory device of claim 3, wherein bottom surfaces of the first-type support pillar structure and the second-type support pillar structures are located within a first horizontal plane that underlies the alternating stack.

5. The three-dimensional memory device of claim 3, wherein top surfaces of the second-type support pillar structures are located within a horizontal plane including a topmost surface of the alternating stack.

6. The three-dimensional memory device of claim 3, wherein a first insulating fin within the vertical stack of insulating fins comprises a plurality of vertically-straight and laterally-concave surface segments that contact the second-type support pillar structures.

7. The three-dimensional memory device of claim 6, wherein:

the first insulating fin further comprises a plurality of vertically-straight and laterally-convex surface segments; and each vertically-straight and laterally-concave surface segment of the plurality of vertically-straight and laterally-concave surface segments is adjoined to a respective pair of vertically-straight and laterally-convex surface segments of the plurality of vertically-straight and laterally-convex surface segments.

8. The three-dimensional memory device of claim 3, wherein the vertically-extending tubular portion of the finned insulating spacer is laterally spaced from the second-type support pillar structures and comprises a plurality of cylindrical surface segments that contact a respective one of the insulating layers.

9. The three-dimensional memory device of claim 3, wherein a top surface of the layer contact via structure and an annular top surface of the finned insulating spacer are located above a horizontal plane including top surfaces of the second-type support pillar structures.

10. A three-dimensional memory device, comprising:

an alternating stack of insulating layers and electrically conductive layers;

a memory opening vertically extending through the alternating stack;

a memory opening fill structure located in memory opening and comprising a vertical stack of memory elements located at levels of the electrically conductive layers and a vertical semiconductor channel;

a layer contact via structure contacting a first electrically conductive layer within a first subset of the electrically conductive layers and vertically extending through a second subset of the electrically conductive layers that overlies the first subset; and a first-type support pillar structure located under a bottom surface of the layer contact via structure;

wherein:

the first-type support pillar structure comprises a top surface containing a divot therein; and the divot is filled with an insulating divot fill material portion that contacts a center potion of a bottom surface of the layer contact via structure.

11. A three-dimensional memory device, comprising:

an alternating stack of insulating layers and electrically conductive layers;

a memory opening vertically extending through the alternating stack;

a memory opening fill structure located in memory opening and comprising a vertical stack of memory elements located at levels of the electrically conductive layers and a vertical semiconductor channel;

a layer contact via structure contacting a first electrically conductive layer within a first subset of the electrically conductive layers and vertically extending through a second subset of the electrically conductive layers that overlies the first subset; and a first-type support pillar structure located under a bottom surface of the layer contact via structure;

wherein the first-type support pillar structure consists essentially of an insulating material and comprises a first-type dielectric pillar structure.

12. A three-dimensional memory device, comprising:
an alternating stack of insulating layers and electrically conductive layers;
a memory opening vertically extending through the alternating stack;
a memory opening fill structure located in memory opening and comprising a vertical stack of memory elements located at levels of the electrically conductive layers and a vertical semiconductor channel;
a layer contact via structure contacting a first electrically conductive layer within a first subset of the electrically conductive layers and vertically extending through a second subset of the electrically conductive layers that overlies the first subset; and
a first-type support pillar structure located under a bottom surface of the layer contact via structure;
wherein:
the memory opening fill structure further comprises a first blocking dielectric layer and a first dielectric core laterally surrounded by the vertical semiconductor channel; and
the first-type support pillar structure comprises a second blocking dielectric layer having a same material composition as the first blocking dielectric layer and second dielectric core laterally surrounded by and contacting the second blocking dielectric layer.

13. A three-dimensional memory device, comprising:
an alternating stack of insulating layers and electrically conductive layers;
a memory opening vertically extending through the alternating stack;
a memory opening fill structure located in memory opening and comprising a vertical stack of memory elements located at levels of the electrically conductive layers and a vertical semiconductor channel;
a layer contact via structure contacting a first electrically conductive layer within a first subset of the electrically conductive layers and vertically extending through a second subset of the electrically conductive layers that overlies the first subset; and
a first-type support pillar structure located under a bottom surface of the layer contact via structure;
wherein:
the memory opening fill structure further comprises a first dielectric core laterally surrounded by the vertical semiconductor channel, a drain region, and a memory film comprising a blocking dielectric layer, a memory material layer comprising the vertical stack of memory elements, and a tunneling dielectric layer; and
the first-type support pillar structure comprises a dummy semiconductor channel, a second dielectric core laterally surrounded by and contacting the dummy semiconductor channel, a dummy drain region, and a dummy memory film comprising a dummy blocking dielectric layer, a dummy memory material layer, and a dummy tunneling dielectric layer.

14. A three-dimensional memory device, comprising:
an alternating stack of insulating layers and electrically conductive layers;
a memory opening vertically extending through the alternating stack;
a memory opening fill structure located in memory opening and comprising a vertical stack of memory elements located at levels of the electrically conductive layers and a vertical semiconductor channel;
a layer contact via structure contacting a first electrically conductive layer within a first subset of the electrically conductive layers and vertically extending through a second subset of the electrically conductive layers that overlies the first subset; and
a first-type support pillar structure located under a bottom surface of the layer contact via structure;
wherein:
the bottom surface of the layer contact via structure comprises a center portion and a peripheral portion located below the center portion;
the first-type support pillar structure contacts the center portion of the bottom surface of the layer contact via structure;
a top surface of the first-type support pillar structure is located above the peripheral portion of the bottom surface of the layer contact via structure; and
a tubular insulating spacer surrounds a top portion of the first-type support pillar structure.

15. A method of forming a memory device, comprising:
forming an alternating stack of insulating layers and sacrificial material layers over a substrate;
forming support pillar structures through the alternating stack, wherein the support pillar structures comprise a first-type support pillar structure and second-type support pillar structures that laterally surround the first-type support pillar structure;
forming a memory opening through the alternating stack;
forming a memory opening fill structure in the memory opening, wherein the memory opening fill structure comprises a vertical stack of memory elements located at levels of the sacrificial material layers and a vertical semiconductor channel;
forming a contact via cavity by vertically recessing the first-type support pillar structure and a neighboring portion of the alternating stack, wherein a remaining portion of the first-type support pillar structure is located below the contact via cavity;
replacing the sacrificial material layers with electrically conductive layers; and
forming a layer contact via in the contact via cavity on a first electrically conductive layer of the electrically conductive layers.

16. The method of claim 15, further comprising:
isotropically recessing physically exposed sidewalls of the sacrificial material layers around the contact via cavity to form a finned contact via cavity; and
forming a finned insulating spacer comprising a vertically-extending tubular portion and a vertical stack of insulating fins that laterally extend outward from the vertically-extending tubular portion at a peripheral region of a volume of the finned contact via cavity, wherein the layer contact via structure is formed within a volume that is laterally surrounded by the finned insulating spacer.

17. The method of claim 15, wherein the support pillar structures are formed prior to or after formation of the memory opening fill structure, and consist essentially of a dielectric fill material.

18. The method of claim 15, further comprising:
forming support openings through the alternating stack concurrently with formation of the memory opening;
forming a continuous blocking dielectric layer, a continuous memory material layer, a continuous tunneling dielectric layer, and a continuous semiconductor channel material layer in each of the memory opening and the support openings and over the alternating stack; and removing portions of the continuous blocking dielectric layer, the continuous memory material layer, the continuous tunneling dielectric layer, and the continuous semiconductor channel material layer located over the alternating stack to form the vertical semiconductor channel and a memory film comprising a blocking dielectric layer, a memory material layer comprising the vertical stack of memory elements, and a tunneling dielectric layer in the memory opening, and to form the support pillar structures each comprising a dummy semiconductor channel and dummy memory film comprising a dummy blocking dielectric layer, a dummy memory material layer, and a dummy tunneling dielectric layer in the support openings.

19. The method of claim 15, further comprising forming etch-resistant cap plates above each of the first-type support pillar structures, wherein a top portion of each of the first-type support pillar structures is located above a bottom surface of the contact via cavity.

* * * * *